(12) United States Patent
Fenney et al.

(10) Patent No.: US 11,309,907 B2
(45) Date of Patent: *Apr. 19, 2022

(54) GUARANTEED DATA COMPRESSION

(71) Applicant: Imagination Technologies Limited, Kings Langley (GB)

(72) Inventors: Simon Fenney, St Albans (GB); Linling Zhang, Watford (GB)

(73) Assignee: Imagination Technologies Limited, Kings Langley (GB)

(*) Notice: Subject to any disclaimer, the term of this patent is extended or adjusted under 35 U.S.C. 154(b) by 0 days.

This patent is subject to a terminal disclaimer.

(21) Appl. No.: 17/076,182

(22) Filed: Oct. 21, 2020

(65) Prior Publication Data

US 2021/0036713 A1 Feb. 4, 2021

Related U.S. Application Data

(63) Continuation of application No. 16/457,958, filed on Jun. 29, 2019, now Pat. No. 10,819,367.

(30) Foreign Application Priority Data

Jun. 29, 2018 (GB) .................................... 1810794

(51) Int. Cl.
| | |
|---|---|
| *H03M 7/30* | (2006.01) |
| *H04N 19/103* | (2014.01) |
| *H04N 19/119* | (2014.01) |
| *H04N 19/176* | (2014.01) |
| *H04N 19/186* | (2014.01) |
| *H04N 19/42* | (2014.01) |

(52) U.S. Cl.
CPC ....... *H03M 7/3059* (2013.01); *H03M 7/6005* (2013.01); *H03M 7/6011* (2013.01); *H04N 19/103* (2014.11); *H04N 19/119* (2014.11); *H04N 19/176* (2014.11); *H04N 19/186* (2014.11); *H04N 19/42* (2014.11)

(58) Field of Classification Search
CPC ...... H04N 1/41; H04N 19/103; H04N 19/119; H04N 19/176; H04N 19/186; H04N 19/42; H03M 7/3059; H03M 7/6011; H03M 7/6005
USPC ...................... 341/50–90; 382/232, 233, 239
See application file for complete search history.

(56) References Cited

U.S. PATENT DOCUMENTS

| | | | |
|---|---|---|---|
| 6,580,755 B1 | 6/2003 | Morimoto et al. | |
| 6,771,827 B1 | 8/2004 | Curry | |

(Continued)

FOREIGN PATENT DOCUMENTS

EP        2670139 A1    12/2013

*Primary Examiner* — Lam T Mai
(74) *Attorney, Agent, or Firm* — Potomac Law Group, PLLC; Vincent M DeLuca

(57) ABSTRACT

Lossy methods and hardware for compressing data and the corresponding decompression methods and hardware are described. The lossy compression method comprises dividing a block of pixels into a number of sub-blocks and then analysing, for each sub-block, and selecting one of a candidate set of lossy compression modes. The analysis may, for example, be based on the alpha values for the pixels in the sub-block. In various examples, the candidate set of lossy compression modes comprises at least one mode that uses a fixed alpha channel value for all pixels in the sub-block and one or more modes that encode a variable alpha channel value.

18 Claims, 26 Drawing Sheets

(56) References Cited

U.S. PATENT DOCUMENTS

| | | |
|---|---|---|
| 10,819,367 B2 * | 10/2020 | Fenney ............... H04N 19/103 |
| 2005/0200631 A1 | 9/2005 | Pan et al. |
| 2006/0164268 A1 | 7/2006 | Lee et al. |
| 2006/0256380 A1 | 11/2006 | Klassen et al. |
| 2012/0271802 A1 | 10/2012 | Oh |
| 2015/0138237 A1 | 5/2015 | Ghosh et al. |
| 2015/0172670 A1 | 6/2015 | Li et al. |
| 2017/0025098 A1 | 1/2017 | Keramidas et al. |
| 2018/0054630 A1 | 2/2018 | Chang et al. |
| 2020/0007149 A1 | 1/2020 | Fenney |
| 2020/0007150 A1 | 1/2020 | Lacey et al. |
| 2020/0007151 A1 | 1/2020 | Fenney et al. |
| 2020/0007156 A1 | 1/2020 | Fenney |
| 2020/0007866 A1 | 1/2020 | Martinelli et al. |

\* cited by examiner

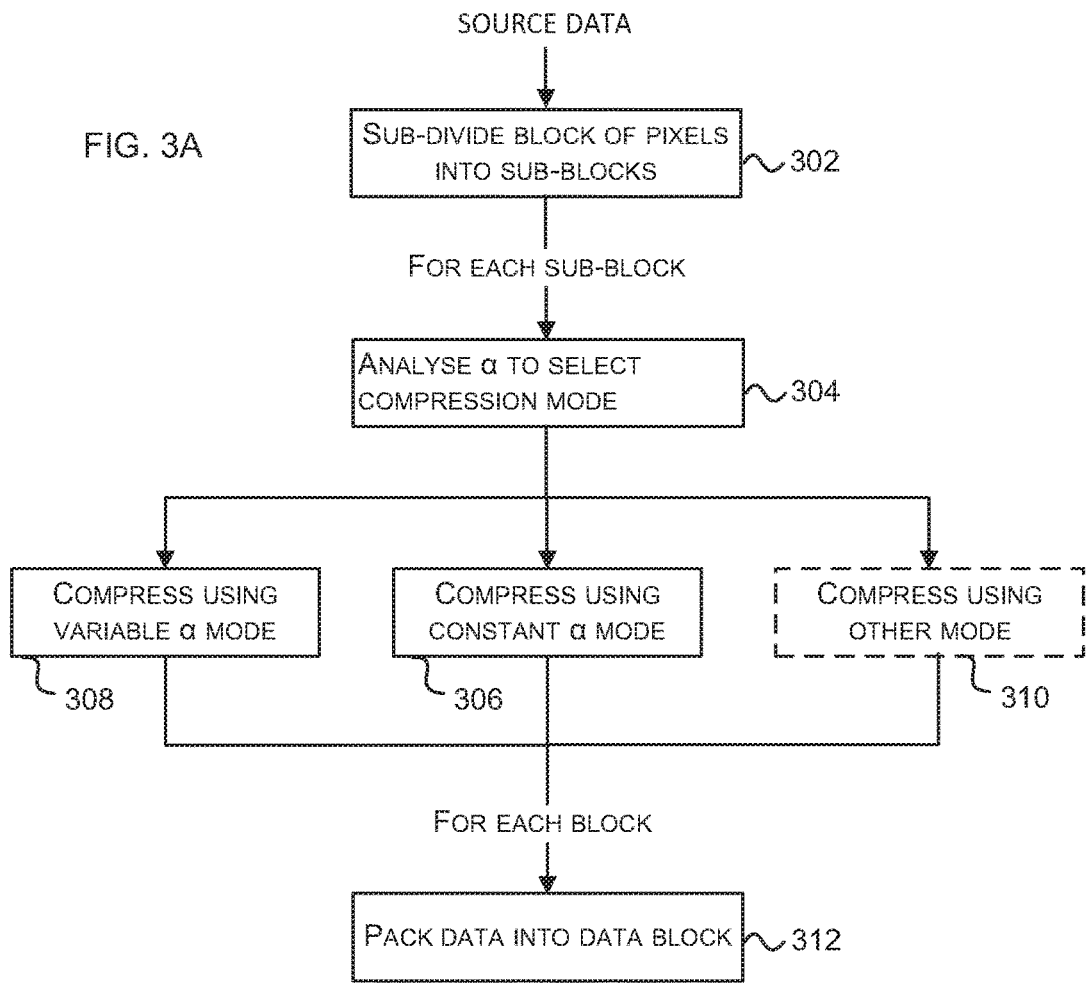
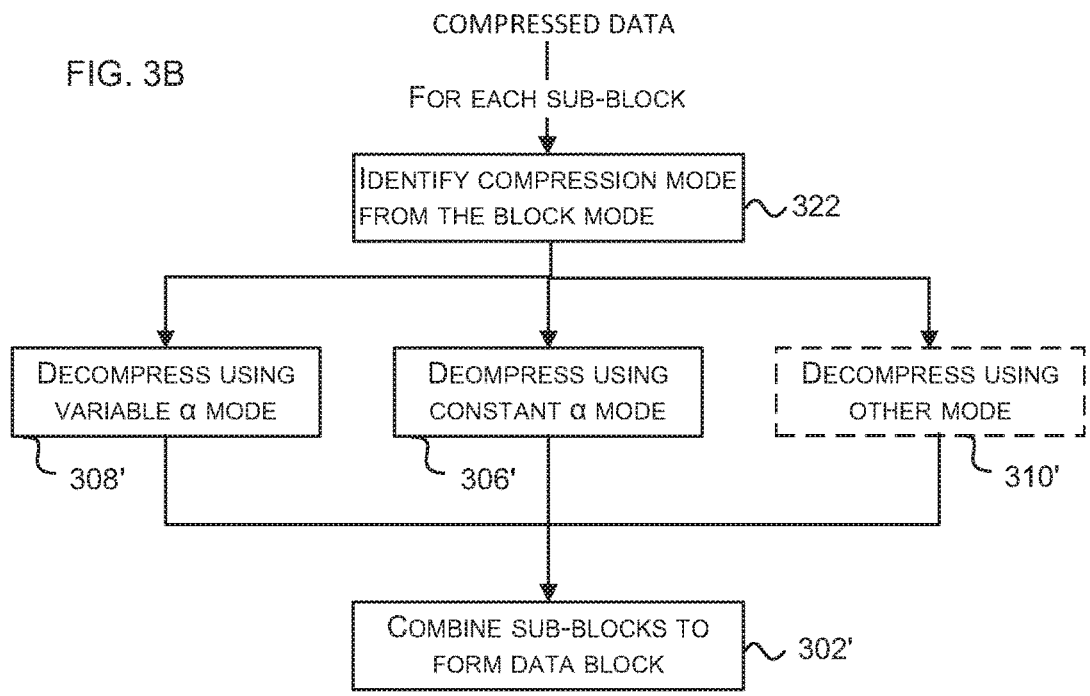

8X8 TILE
SUB-BLOCK ORDERING

16X4 TILE
SUB-BLOCK ORDERING

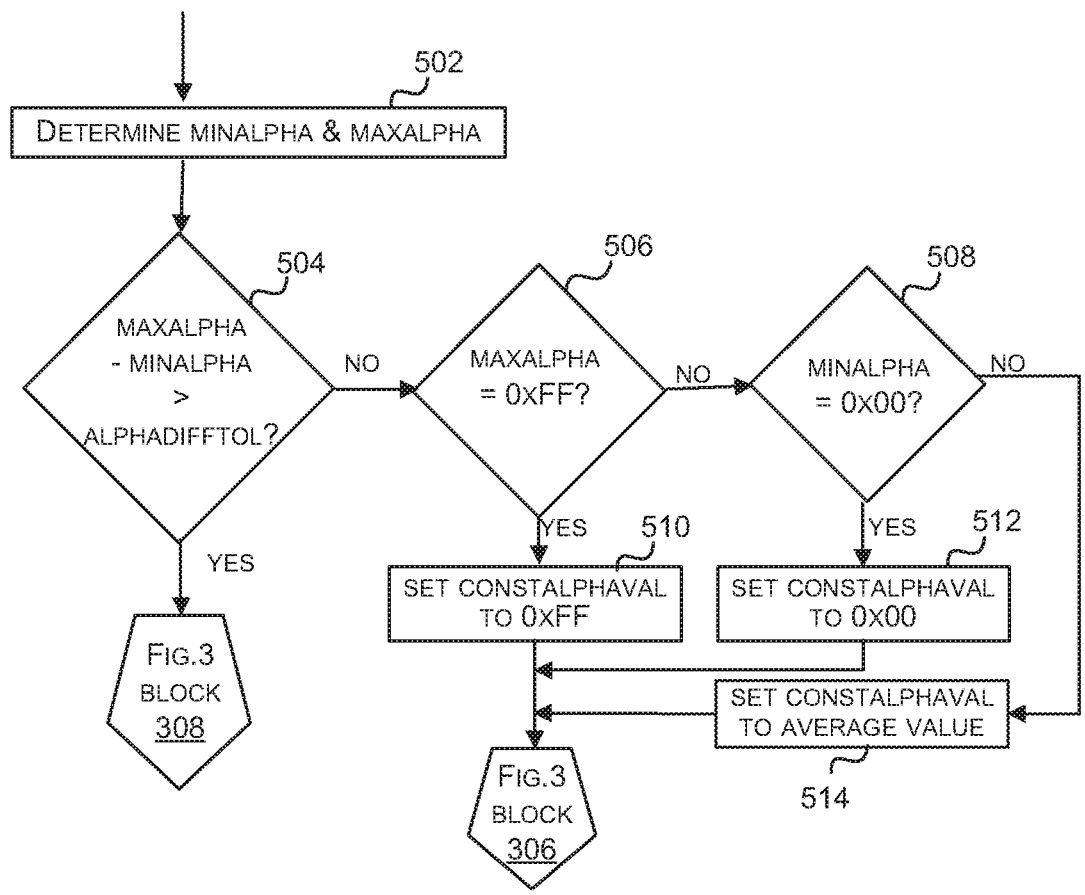

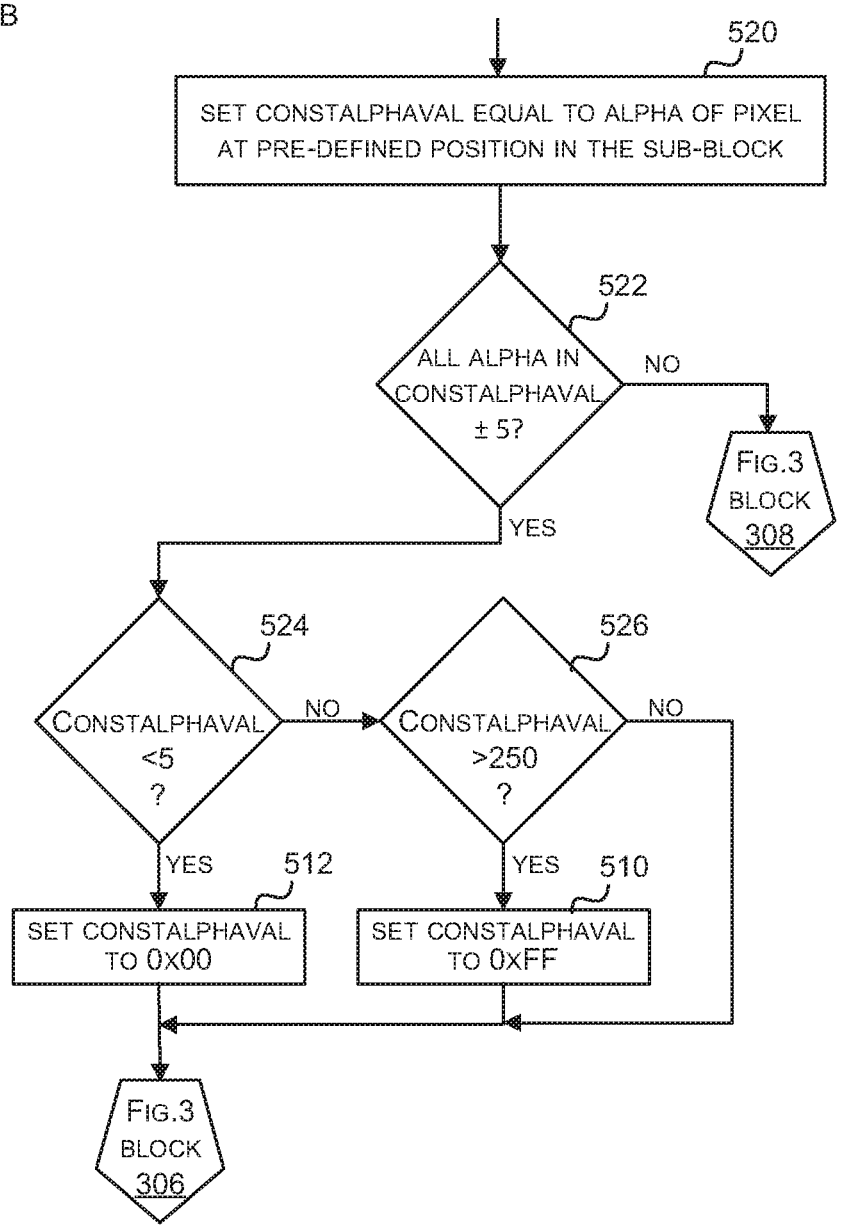

FIG. 7A
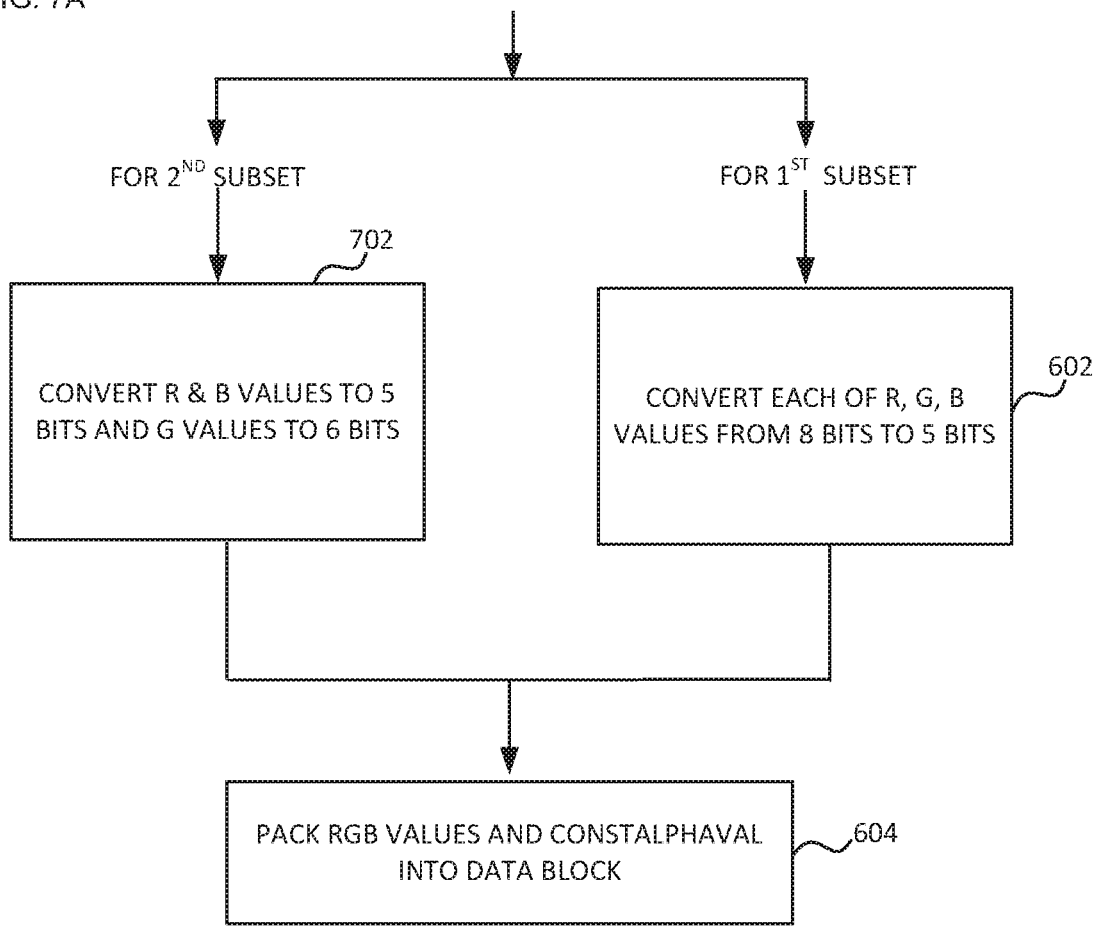
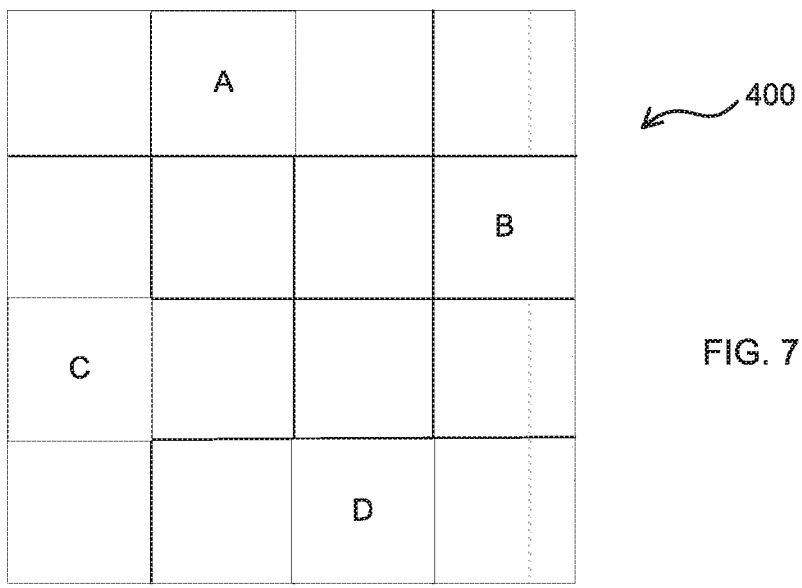
FIG. 7B

| R0 | A | R1 |  |
|---|---|---|---|
| R3 | R2 | R4 |  |
|  |  |  |  |
|  |  |  |  |

|  |  | R3 | R0 |
|---|---|---|---|
|  |  | R2 | B |
|  |  | R4 | R1 |
|  |  |  |  |

|  |  |  |  |
|---|---|---|---|
| R1 | R4 |  |  |
| C | R2 |  |  |
| R0 | R3 |  |  |

|  |  |  |  |
|---|---|---|---|
|  |  |  |  |
|  | R4 | R2 | R3 |
|  | R1 | D | R0 |

FIG. 8B

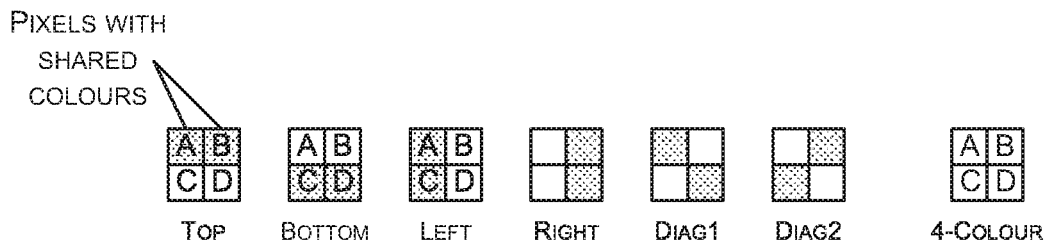
FIG. 10A
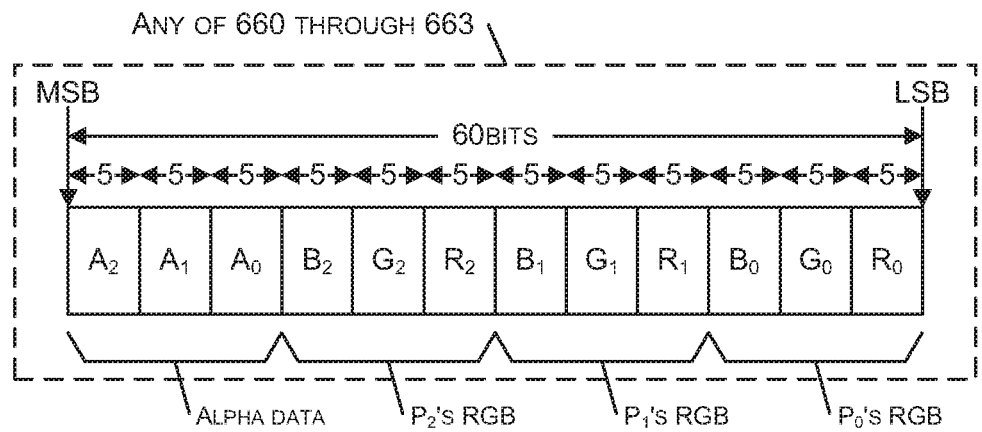
FIG. 10B
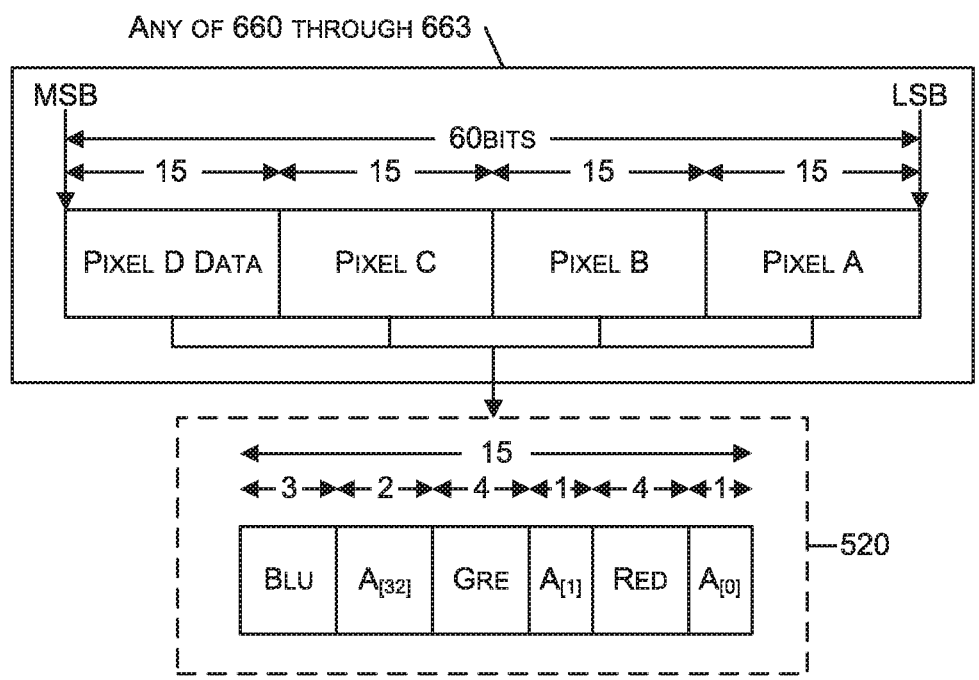
FIG. 10C
FIG. 10D
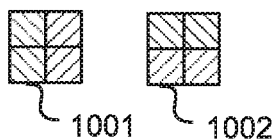

GUARANTEED DATA COMPRESSION

CROSS-REFERENCE TO RELATED APPLICATIONS AND CLAIM OF PRIORITY

This application is a continuation under 35 U.S.C. 120 of copending application Ser. No. 16/457,958 filed Jun. 29, 2019, which claims foreign priority under 35 U.S.C. 119 from United Kingdom Application No. 1810794.6 filed Jun. 29, 2018, the disclosures of which are incorporated herein in their entireties.

BACKGROUND

Data compression, either lossless or lossy, is desirable in many applications in which data is to be stored in, and/or read from, a memory. By compressing data before storage of the data in a memory, the amount of data transferred to the memory may be reduced. An example of data for which data compression is particularly useful is image data, such as depth data to be stored in a depth buffer, pixel data to be stored in a frame buffer and texture data to be stored in a texture buffer. These buffers may be any suitable type of memory, such as cache memory, separate memory subsystems, memory areas in a shared memory system or some combination thereof.

A Graphics Processing Unit (GPU) may be used to process image data in order to determine pixel values of an image to be stored in a frame buffer for output to a display. GPUs usually have highly parallelised structures for processing large blocks of data in parallel. There is significant commercial pressure to make GPUs (especially those intended to be implemented on mobile devices) operate at lower power levels. Competing against this is the desire to use higher quality rendering algorithms on faster GPUs, which thereby puts pressure on a relatively limited resource: memory bandwidth. However, increasing the bandwidth of the memory subsystem might not be an attractive solution because moving data to and from, and even within, the GPU consumes a significant portion of the power budget of the GPU. The same issues may be relevant for other processing units, such as central processing units (CPUs), as well as GPUs.

The embodiments described below are provided by way of example only and are not limiting of implementations which solve any or all of the disadvantages of known methods of data compression.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Lossy methods and hardware for compressing data and the corresponding decompression methods and hardware are described. The lossy compression method comprises dividing a block of pixels into a number of sub-blocks and then analysing, for each sub-block, and selecting one of a candidate set of lossy compression modes. The analysis may, for example, be based on the alpha values for the pixels in the sub-block. In various examples, the candidate set of lossy compression modes comprises at least one mode that uses a fixed alpha channel value for all pixels in the sub-block and one or more modes that encode a variable alpha channel value.

A first aspect provides a lossy method of compressing data comprising: dividing a block of pixels into a plurality of sub-blocks; and for each sub-block: analysing an alpha channel value for each pixel in the sub-block to select a lossy compression mode from a set of candidate lossy compression modes, wherein the set of candidate lossy compression modes comprises two or more lossy compression modes including at least one compression mode which uses a fixed alpha channel value for all pixels in the sub-block; and compressing the sub-block using the selected lossy compression mode.

A second aspect provides a method of data decompression comprising: unpacking data from a compressed data block to generate compressed data for a plurality of sub-blocks; for each sub-block: identifying a compression mode from a block mode field within the compressed data block, wherein the compression mode is one of a set of candidate lossy compression modes, the set of candidate lossy compression modes comprising two or more lossy compression modes including at least one compression mode which uses a fixed alpha channel value for all pixels in the sub-block; and decompressing the sub-block using a decompression mode corresponding to the selected compression mode.

A third aspect provides a data compression unit comprising: hardware logic arranged to dividing a block of pixels into a plurality of sub-blocks; hardware logic arranged, for each sub-block, to analyse an alpha channel value for each pixel in the sub-block to select a lossy compression mode from a set of candidate lossy compression modes, wherein the set of candidate lossy compression modes comprises two or more lossy compression modes including at least one compression mode which uses a fixed alpha channel value for all pixels in the sub-block; and a data compression element arranged to compress the sub-block using the selected lossy compression mode.

A fourth aspect provides a data decompression unit comprising: hardware logic arranged unpack data from a compressed data block to generate compressed data for a plurality of sub-blocks; hardware logic arranged, for each sub-block, to identify a compression mode from a block mode field within the compressed data block, wherein the compression mode is one of a set of candidate lossy compression modes, the set of candidate lossy compression modes comprising two or more lossy compression modes including at least one compression mode which uses a fixed alpha channel value for all pixels in the sub-block; and a data decompression element arranged to decompress the sub-block using a decompression mode corresponding to the selected lossy compression mode.

The data compression and/or decompression unit as described herein may be embodied in hardware on an integrated circuit. There may be provided a method of manufacturing, at an integrated circuit manufacturing system, a data compression and/or decompression unit as described herein. There may be provided an integrated circuit definition dataset that, when processed in an integrated circuit manufacturing system, configures the system to manufacture a data compression and/or decompression unit as described herein. There may be provided a non-transitory computer readable storage medium having stored thereon a computer readable description of an integrated circuit that, when processed, causes a layout processing system to generate a circuit layout description used in an integrated circuit manufacturing system to manufacture a data compression and/or decompression unit as described herein.

There may be provided an integrated circuit manufacturing system comprising: a non-transitory computer readable storage medium having stored thereon a computer readable integrated circuit description that describes the data compression and/or decompression unit as described herein; a layout processing system configured to process the integrated circuit description so as to generate a circuit layout description of an integrated circuit embodying the data compression and/or decompression unit as described herein; and an integrated circuit generation system configured to manufacture the data compression and/or decompression unit as described herein according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 3A is a flow diagram of an example lossy data compression method;

FIG. 3B is a flow diagram of a data decompression method that may be used to decompress data that was compressed using the method of FIG. 3A;

FIGS. 5A and 5B show two different example implementations of the analysis stage of the method of FIG. 3A;

FIG. 7A is a flow diagram of a second example method of compressing a sub-block using the constant alpha mode of FIG. 3A;

FIG. 7B is a schematic diagram showing an example of how the pixels in a sub-block may be divided into the two subsets in the method of FIG. 7A;

FIG. 8B is a schematic diagram illustrating a part of the method of FIG. 8A;

FIG. 10A is a schematic diagram showing encoding patterns that may be used in the method of FIG. 9;

FIGS. 10B and 10C are schematic diagrams showing two different ways in which compressed data for a mini-block is packed into a data field;

FIG. 10D is a schematic diagram showing two further encoding patterns that may be used in the method of FIG. 9;

Figure 1:
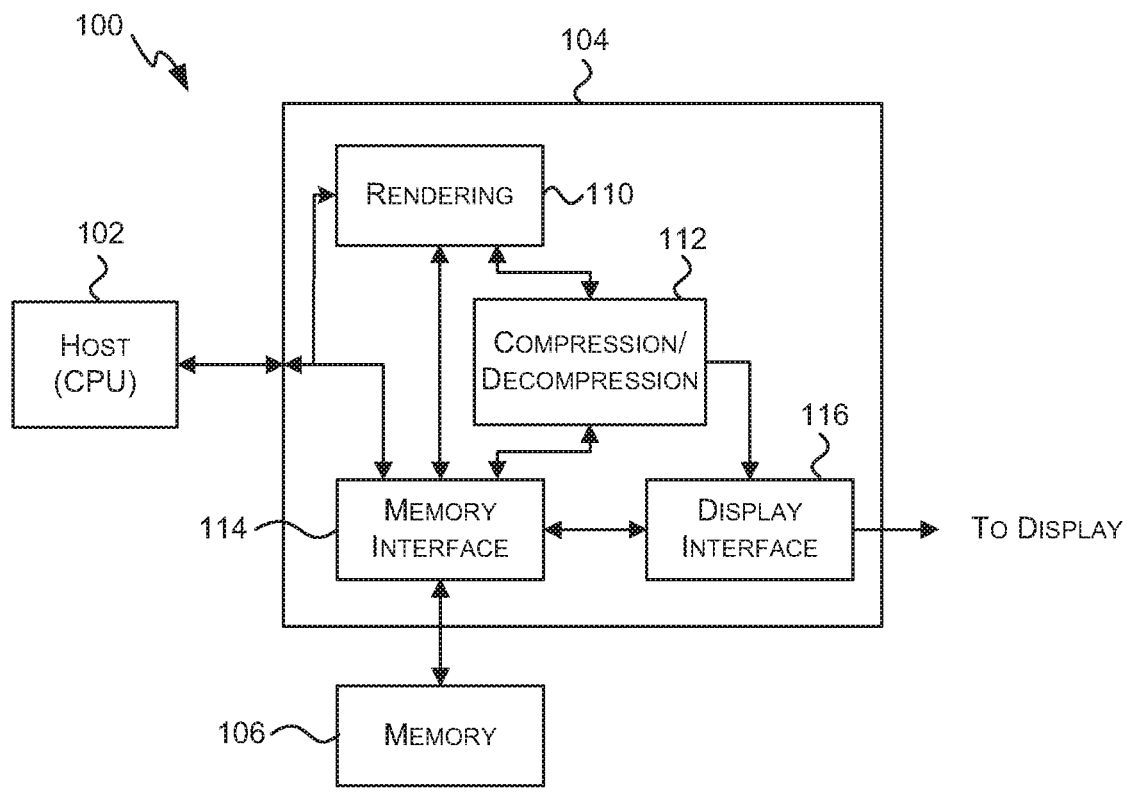
FIG. 1 shows a graphics rendering system.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As described above, memory bandwidth is a relatively limited resource within a processing unit (e.g. a CPU or GPU), similarly, memory space is a limited resource because increasing it has implications in terms of both physical size of a device and power consumption. Through the use of data compression before storage of data in a memory, both the memory bandwidth and the space in memory are reduced.

Many data compression schemes exist, some of which are lossless and others that are lossy. Lossless compression techniques may be preferred in some situations because the original data can be perfectly reconstructed from the compressed data. In contrast, where lossy compression techniques are used, data cannot be perfectly reconstructed from the compressed data and instead the decompressed data is only an approximation of the original data. The accuracy of the decompressed (and hence reconstructed) data will depend upon the significance of the data that is discarded during the compression process. Additionally, repeatedly compressing and decompressing data using lossy compression techniques results in a progressive reduction in quality, unlike where lossless compression techniques are used. Lossless compression techniques are often used for audio and image data and examples of general purpose lossless compression techniques include run-length encoding (RLE) and Huffman coding.

The amount of compression that can be achieved using lossless compression techniques (e.g. as described in UK patent number 2530312) depends on the nature of the data that is being compressed, with some data being more easily compressed than other data. The amount of compression that is achieved by a compression technique (whether lossless or lossy) may be expressed in terms of a percentage that is referred to herein as the compression ratio and is given by:

$$\text{Compression ratio} = \frac{\text{Compressed size}}{\text{Uncompressed size}} \times 100$$

It will be appreciated that there are other ways to define the compression ratio; however, the above convention is used throughout. This means that a compression ratio of 100% indicates that no compression has been achieved, a compression ratio of 50% indicates that the data has been compressed to half of its original, uncompressed size and a compression ratio of 25% indicates that the data has been compressed to a quarter of its original, uncompressed size. Lossy compression techniques can typically compress data to a greater extent (i.e. achieve smaller compression ratios) than lossless compression techniques. Therefore, in some examples, e.g. where the extent of achievable compression is considered more important than the quality of the decompressed (i.e. reconstructed) data, lossy compression techniques may be preferred over lossless compression techniques. The choice between a lossless and a lossy compression technique is an implementation choice.

The variability in the amount of compression that can be achieved (which is dependent upon characteristics of the actual data that is being compressed) has an impact on both memory bandwidth and memory space and may mean that the full benefit of the compression achieved is not realised in relation to one or both of these two aspects, as described below.

In many use cases, random access of the original data is required. Typically for image data, to achieve this, the image data is divided into independent, non-overlapping, rectangular blocks prior to compression. If the size of each compressed block varies because of the nature of the data in the block (e.g. a block which is all the same colour may be compressed much more than a block which contains a lot of detail) such that in some cases a block may not be compressed at all, then in order to maintain the ability to randomly access the compressed data blocks, the memory space may be allocated as if the data was not compressed at all. Alternatively, it is necessary to maintain an index, with an entry per block that identifies where the compressed data for that block resides in memory. This requires memory space to store the index (which is potentially relatively large) and the memory accesses (to perform the look-up in the index) adds latency to the system. For example, in systems where it is important to be able to randomly access each compressed block of data and where an index is not used, even if an average compression ratio (across all data blocks) of 50% is achieved, memory space still has to be allocated assuming a 100% compression ratio, because for some blocks it may not be possible to achieve any compression using lossless compression techniques.

Furthermore, as the transfer of data to memory occurs in fixed size bursts (e.g. in bursts of 64 bytes), for any given block there are only a discrete set of effective compression ratios for the data transfer to memory. For example, if a block of data comprises 256 bytes and the transfer of data occurs in 64 byte bursts, the effective compression ratios for the data transfer are 25% (if the block is compressed from 256 bytes to no more than 64 bytes and hence requires only a single burst), 50% (if the block is compressed into 65-128 bytes and hence requires two bursts), 75% (if the block is compressed into 129-192 bytes and hence requires three bursts) and 100% (if the block is not compressed at all or is compressed into 193 or more bytes and hence requires four bursts). This means that if a block of data comprising 256 bytes is compressed into anywhere in the range of 129-192 bytes, then three bursts are required for the compressed block, compared to four for the uncompressed block, making the effective compression ratio for the memory transfer 75% whilst the actual data compression achieved could be much lower (e.g. as low as 50.4% if compressed into 129 bytes). Similarly, if the compression can only compress the block into 193 bytes, the memory transfer sees no benefit from the use of data compression, as four bursts are still required to transfer the compressed data block to memory. In other examples, blocks of data may comprise a different number of bytes, and bursts to memory may comprise a different number of bytes.

Described herein are various methods of performing data compression. Some of the methods described herein provide a guarantee that a compression threshold, which may be defined in terms of a compression ratio (e.g. 50%), compressed block size (e.g. 128 bytes) or in any other way, is met. An effect of this guarantee is that a reduced amount of memory space can be allocated whilst still enabling random access to blocks of compressed data and there is also a guaranteed reduction in the memory bandwidth that is used to transfer the compressed data to and from memory. In other examples the compression ratio may be targeted (i.e. the method may be configured to achieve the ratio in the majority of cases) but there is no guarantee that it will be met.

Also described herein are methods for converting 10-bit (e.g. 10:10:10:2) data to 8-bit (e.g. 8:8:8:3) data and methods for mapping from an n-bit number to an m-bit number. As described below, the methods for converting 10-bit (e.g. 10:10:10:2) data to 8-bit (e.g. 8:8:8:3 or 8888) data may be used as a pre-processing (or pre-encoding) step for the methods of performing data compression described herein or may be used independently (e.g. with another data compression method or with only a lossless compression method, such as that described below with reference to FIGS. 20A-B, 21A-B and 22). By first converting the 10-bit (e.g. 10:10:10:2) data using one of the methods described herein, the 10-bit can then subsequently be compressed by methods that are arranged to operate on 8888 format data. The conversion method may be lossy with respect to three of the channels (e.g. the RGB data) and lossless for the fourth channel (e.g. the alpha data); however as this format is typically used for high dynamic range (HDR) data and the majority of pixels (e.g. 75%) will still be of low dynamic range (LDR), the conversion can be performed with only a small loss of accuracy. The method for mapping from an n-bit number to an m-bit number described herein may be used within the methods of performing data compression as described below or may be used independently. By using this mapping method, data of other formats can be subsequently compressed by methods that are arranged to operate on 8888 format data and/or it can be used to reduce the internal buffering (e.g. registers, etc.) by, for example, 6 bits per pixel (i.e. 19%) and this may, for example, be used in the initial reserve compression sub-unit 204A described below and shown in FIG. 2C.

FIG. 1 shows a graphics rendering system 100 that may be implemented in an electronic device, such as a mobile device. The graphics rendering system 100 comprises a host CPU 102, a GPU 104 and a memory 106 (e.g. a graphics memory). The CPU 102 is arranged to communicate with the GPU 104. Data, which may be compressed data, can be transferred, in either direction, between the GPU 104 and the memory 106.

The GPU 104 comprises a rendering unit 110, a compression/decompression unit 112, a memory interface 114 and a display interface 116. The system 100 is arranged such that data can pass, in either direction, between: (i) the CPU 102 and the rendering unit 110; (ii) the CPU 102 and the memory interface 114; (iii) the rendering unit 110 and the memory interface 114; (iv) the memory interface 114 and the memory 106; (v) the rendering unit 110 and the compression/decompression unit 112; (vi) the compression/decompression unit 112 and the memory interface 114; and (vii) the memory interface 114 and the display interface. The system 100 is further arranged such that data can pass from the compression/decompression unit 112 to the display interface 116. Images, which are rendered by the GPU 104, may be sent from the display interface 116 to a display for display thereon.

In operation, the GPU 104 processes image data. For example, the rendering unit 110 may perform scan conversion of graphics primitives, such as triangles and lines, using known techniques such as depth-testing (e.g. for hidden surface removal) and texturing and/or shading. The rendering unit 110 may contain cache units to reduce memory traffic. Some data is read or written by the rendering unit 110, to the memory 106 via the memory interface unit 114 (which may include a cache) but for other data, such as data to be stored in a frame buffer, the data preferably goes from the rendering unit 110 to the memory interface 114 via the compression/decompression unit 112. The compression/decompression unit 112 reduces the amount of data that is to be transferred across the external memory bus to the memory 106 by compressing the data, as described in more detail below.

The display interface 116 sends completed image data to the display. An uncompressed image may be accessed directly from the memory interface unit 114. Compressed data may be accessed via the compression/decompression unit 112 and sent as uncompressed data to the display 108. In alternative examples the compressed data could be sent directly to the display 108 and the display 108 could include logic for decompressing the compressed data in an equivalent manner to the decompression of the compression/decompression unit 112. Although shown as a single entity, the compression/decompression unit 112 may contain multiple parallel compression and/or decompression units for enhanced performance reasons.

Figure 2A:
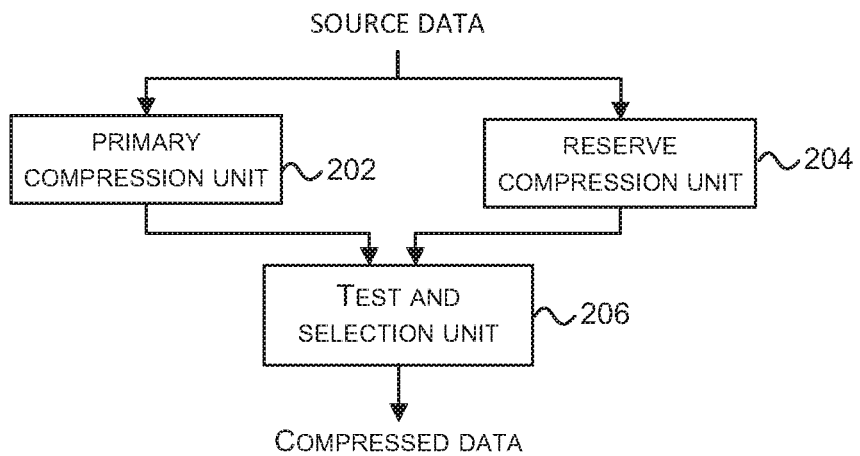
FIGS. 2A, 2B and 2C show three different data compression architectures.
Figure 2B:
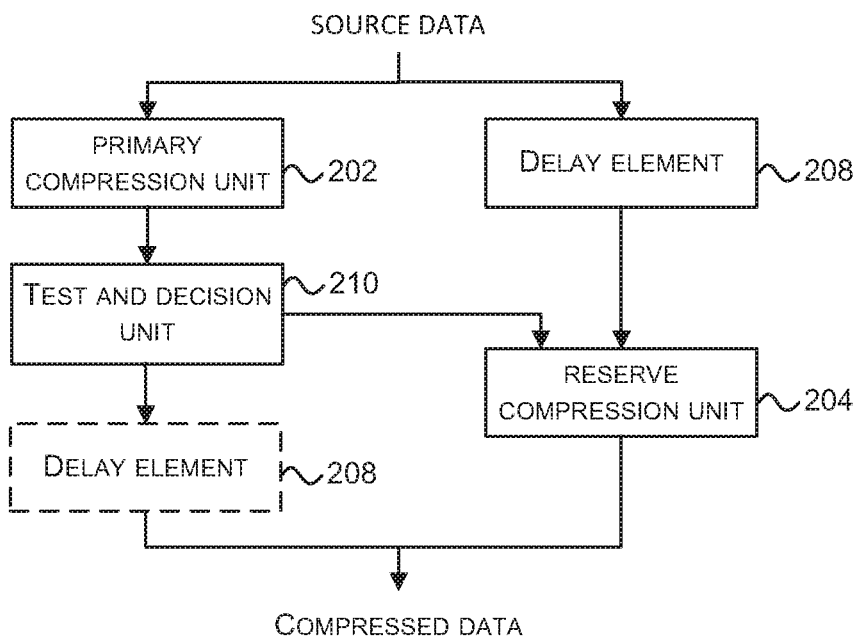
Figure 2C:
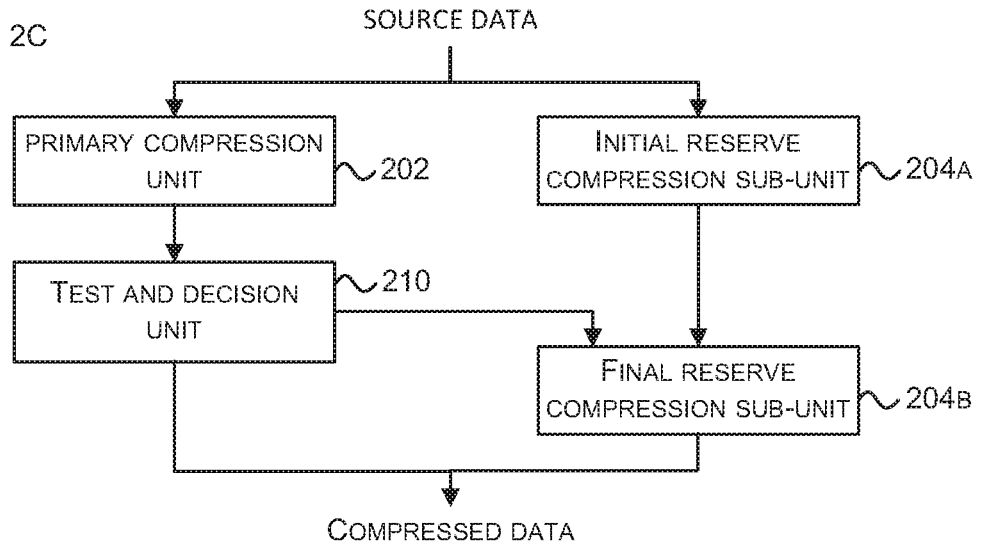

In various examples, the compression/decompression unit 112 may implement a compression method (or scheme) that guarantees that a compression threshold (which may be pre-defined and hence fixed or may be an input variable) is met. As detailed above, the compression threshold may, for example, be defined in terms of a compression ratio (e.g. 50% or 25%), compressed block size (e.g. 128 bytes) or in any other way. In order to provide this guarantee in relation to the amount of compression that is provided, and given that the exact nature of the data is not known in advance, a combination of lossless and lossy compression methods are used and three example architectures are shown in FIGS. 2A-C. In most if not all cases, a lossless compression technique (such as that described in UK patent number 2530312 or as described below with reference to FIGS. 20A-B, 21A-B and 22) is used to compress a block of data and then a test is performed to determine whether the compression threshold is met. In the event that the compression threshold is not met, a lossy compression technique (such as vector quantisation (VQ) techniques) or the method described below with reference to FIGS. 3A and 4-11 that provides the guaranteed compression according to the compression threshold) is instead applied to the data block to achieve the compression threshold.

In the method shown in FIG. 2A, the uncompressed source data, (e.g. a block of 256 bytes) is input to both a primary compression unit 202 (which may also be referred to as a lossless compression unit) and a reserve compression unit 204 (which may also be referred to as a lossy or fallback compression unit). The input data block is therefore independently and in parallel compressed using two different methods (a potentially lossless method in the primary compression unit 202 and a lossy method in reserve compression unit 204). An example method of lossless compression that may be implemented by the primary compression unit 202 is described below with reference to FIGS. 20A-B, 21A-B and 22. The reserve compression unit 204 compresses the input data block in such a way so as to guarantee that the compression threshold is satisfied. The two versions of the compressed data block are then input to a test and selection unit 206. This test and selection unit 206 determines whether the compressed data block generated by the primary compression unit 202 satisfies the compression threshold (e.g. if it is no larger than 128 bytes for a 256 byte input block and a 50% compression threshold). If the compressed data block generated by the primary compression unit 202 satisfies the compression threshold, then it is output, otherwise the compressed data block generated by the reserve compression unit 204 is output. In all cases the compressed data block that is output satisfies the compression threshold and by only using lossy compression (in the reserve compression unit 204) for those blocks that cannot be suitably compressed using lossless techniques (in the primary compression unit 202), the overall quality of the compressed data is improved (i.e. the amount of data that is lost due to the compression process is kept low whilst still satisfying the compression threshold).

In the method shown in FIG. 2B, the uncompressed source data, (e.g. a block of 256 bytes) is initially input to only the primary compression unit 202 and the input of the source data to the reserve compression unit 204 is delayed (e.g. in delay unit 208). The amount of delay may be arranged to be similar to the time taken to compress the source data block using the lossless compression technique (in the primary compression unit 202) or a little longer than this to also include the time taken to assess the size of the compressed data block output by the primary compression unit 202 (in the test and decision unit 210). The compressed data block output by the primary compression unit 202 is input to the test and decision unit 210 and if it satisfies the compression threshold it is output and no lossy compression is performed. If, however, the compressed data block output by the primary compression unit 202 does not satisfy the compression threshold (i.e. it is still too large), then the test and decision unit 210 discards this compressed block and triggers the lossy compression of the block by the reserve compression unit 204. The compressed data block output by the reserve compression unit 204 is then output.

In the method shown in FIG. 2C, the reserve compression unit 204 is divided into two sub-units: an initial reserve compression sub-unit 204A and a final reserve compression sub-unit 204B, with each sub-unit performing a part of the lossy compression method. For example, the initial reserve compression sub-unit 204A may compress each byte from 8 bits to 5 bits (e.g. using truncation or the method described below with reference to FIGS. 12A-B) and any further compression that is required to satisfy the compression threshold may be performed by the final reserve compression sub-unit 204B. In other examples, the reserve compression sub-unit 204B may perform a pre-processing step, (e.g. as described below with reference to FIG. 14). In yet further examples, the lossy compression method may be split in different ways between the two reserve compression sub-units 204A, 204B.

In the method shown in FIG. 2C, the uncompressed source data, (e.g. a block of 256 bytes) is input to both the primary compression unit 202 and the initial reserve compression sub-unit 204A. The input data block is therefore independently and in parallel compressed using two different methods (a lossless method in the primary compression unit 202 and the first part of a lossy method in sub-unit 204A). The compressed data block output by the primary compression unit 202 is input to the test and decision unit 210 and if it satisfies the compression threshold it is output, the partially compressed data block output by the initial reserve compression sub-unit 204A is discarded and no further lossy compression is performed for that data block. If, however, the compressed data block output by the primary compression unit 202 does not satisfy the compression threshold (i.e. it is still too large), then the test and decision unit 210 discards this compressed block and triggers the completion of the lossy compression of the block output by the initial reserve compression sub-unit 204A by the final reserve compression sub-unit 204B. The compressed data block output by the final reserve compression sub-unit 204B is output.

In certain situations, it may be possible to compress a data block by more than the compression threshold. In such instances, the primary compression unit 202 may output a compressed data block that always exactly satisfies the compression threshold or alternatively, the size of the output compressed data block may, in such situations, be smaller than that required to satisfy the compression threshold. Similarly, the lossy compression technique that is used in FIGS. 2A, 2B and 2C (and implemented in the reserve compression unit 204 or sub-units 204A, 204B) may output a compressed data block which always exactly satisfies the compression threshold or alternatively, the size of the compressed data block may vary whilst still always satisfying the compression threshold. In the case where a compressed data block is smaller than is required to exactly satisfy the compression threshold, there may still be memory bandwidth and memory space inefficiencies caused by fixed burst sizes and pre-allocation requirements respectively; however, as the compression threshold is satisfied, there is always an improvement seen in relation to both memory bandwidth and memory space. In various examples, headers may be used to reduce the used memory bandwidth for some blocks even further (e.g. by including in the header information about how much data to read from memory or write to memory).

Depending upon the particular implementation, any of the architectures of FIGS. 2A-C may be used. The arrangement shown in FIG. 2A provides a fixed throughput and fixed latency (which means that no buffering of data is needed and/or no bubbles are caused later in the system) but the power consumption may be increased (e.g. compared to just having a single compression unit performing either lossless or lossy compression). The arrangement shown in FIG. 2B may have a lower power consumption (on average) than the arrangement shown in FIG. 2A because the reserve compression unit 204 in FIG. 2B can be switched off when it is not needed; however the latency may vary and as a result buffers may be included in the system. Alternatively, an additional delay element 208 (shown with a dotted outline in FIG. 2B) may be added between the test and decision unit 210 and the output to delay the compressed data block output by the primary compression unit 202 (e.g. the amount of delay may be arranged to be comparable to the time taken to compress the source data block using the lossy compression technique in the reserve compression unit 204). The inclusion of this additional delay element 208 into the arrangement of FIG. 2B has the effect of making the latency of the arrangement fixed rather than variable. The arrangement shown in FIG. 2C may also have a lower power consumption (on average) than the arrangement shown in FIG. 2A because the final reserve compression sub-unit 204B in FIG. 2C can be switched off when it is not needed; however in some circumstances data is discarded by the initial reserve compression sub-unit 204A that would have been useful later and this may reduce the accuracy of the decompressed data (for example, where data is compressed initially from 8 bits to 6 bits and then from 6 bits to 4 bits, the decompression from 4 bits back to 8 bits, may introduce more errors than if the data was compressed directly from 8 bits to 4 bits).

The methods described above with reference to FIGS. 2A-C may be used in combination with any compression threshold; however, in many examples the compression threshold will be 50% (although this may be expressed in another way, such as 128 bytes for 256-byte data blocks). In examples where a compression threshold other than 50% is used, the compression threshold may be selected to align with the burst size (e.g. 25%, 50% or 75% for the example described above) and the architectures shown in FIGS. 2A-C provide the greatest efficiencies when this threshold can be met using lossless compression for the majority of the data blocks (e.g. >50%) and lossy compression is only used for the remainder of the blocks.

To identify which compression technique was used (e.g. lossless or lossy), data may be appended that indicates the type of compression used (e.g. in a header) or this may be incorporated into any existing header (or header table) that is used or each compressed block of data may include a number of bits, in addition to the compressed data, that indicates the type of compression used (e.g. as described below with reference to FIGS. 3-11).

In any of the architectures of FIGS. 2A-C, there may be an additional pre-processing step (not shown in FIGS. 2A-C) that is a lossy pre-processing step and puts the source data into a suitable format for the primary compression unit 202 and/or reserve compression unit 204, 204A. This lossy pre-processing step may, for example, change the format of the data from 10-bit (e.g. RGBA1010102) format into 8-bit (e.g. RGBA8883 or 8888 format) and two example methods for performing this pre-processing are described below with reference to FIGS. 14 and 16. In various examples, the method of FIG. 16 may be used as a pre-processing step for the primary compression unit 202 and the method of FIG. 14 may be used as a pre-processing step for the reserve compression unit 204, or vice versa, or the same method may be used for both the primary and reserve compression units.

The use of different data formats and/or pre-processing steps in the architectures of FIGS. 2A-C may also require modifications to the compression methods used (e.g. in the primary compression unit 202 and/or reserve compression units 204, 204A, 204B) and some examples of these are also described below. By combining a lossy pre-processing step with the lossless compression (implemented in the primary compression unit 202), it will be appreciated that the compressed data which is output by the primary compression unit 202 is no longer lossless.

A lossy compression technique which guarantees that a pre-defined compression threshold is met is described with reference to FIGS. 3-11. This technique may be implemented by the compression/decompression unit 112 shown in FIG. 1 and/or by the reserve compression unit 204 shown in FIGS. 2A and 2B. As described above, use of data compression reduces the requirements for both memory storage space and memory bandwidth, and guaranteeing that a compression threshold (which may be defined in any suitable way, as described above) is met ensures that benefits are achieved in terms of both memory storage space and memory bandwidth. In the examples described below the compression threshold is 50% (or 128 bytes where each uncompressed data block is 256 bytes in size); however in other examples the method may be used for different compression thresholds (e.g. 75% or 25%) and as described above the compression threshold selected may be chosen to correspond to an integer number of bursts for memory transfer.

The lossy compression method shown in FIG. 3A takes as input, source data in RGBA8888 or RGBX8888 format or in corresponding formats with the channels in a different order (e.g. ARGB or other corresponding formats e.g. comprising four channels each having 8-bit values). The source data may, in various examples, comprise channels with data values having less than 8 bits and examples of the consequential changes to the method are described below (e.g. with reference to FIGS. 15A-D). In examples where the source data is not in a suitable format (e.g. where the RGB channels each comprise more than 8-bits), a pre-processing step (e.g. as described below with reference to FIG. 14 or FIG. 16) may be used to convert the source data into an appropriate format. Alternatively, the method of FIG. 3A may be used for data where the channels comprise more than 8-bits (e.g. 10:10:10:2 data); however by using the pre-processing technique described below with reference to FIG. 14 which includes an HDR flag, there is one extra bit that can be shared across the RGB values. The following examples relate to compressing and decompressing image data, e.g. in RGBA format, but it is to be understood that the same principles can be applied for compressing and decompressing other types of data in other formats.

Figure 4A:
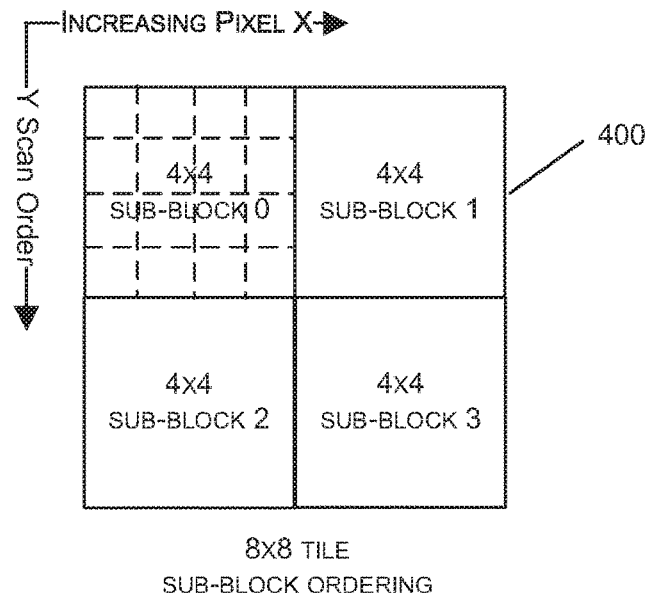
FIGS. 4A and 4B are schematic diagram showing different blocks of data and their subdivision into sub-blocks.
Figure 4B:
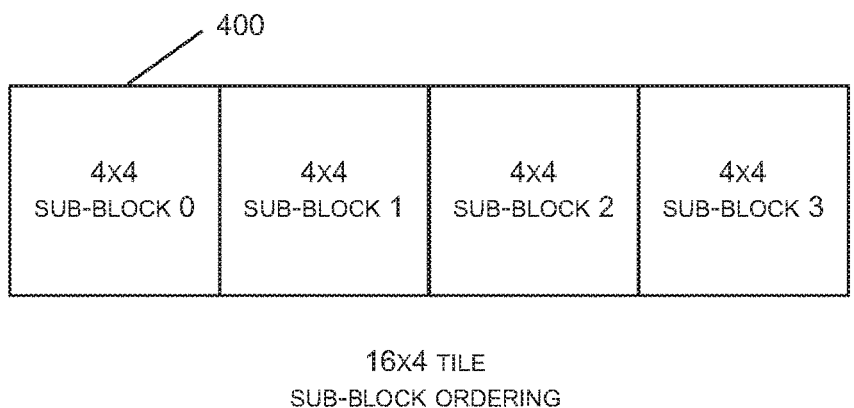

The source data that is input to the method of FIG. 3A comprises blocks of data. For image data each block of data relates to a tile (or block) of pixels (e.g. tiles comprising 8×8 pixels or 16×4 pixels) and each block is subdivided into a plurality of sub-blocks (block 302). In various examples, each block of data is subdivided (in block 302) into four sub-blocks. If the block of data is subdivided (in block 302) into a smaller number of larger blocks, then the amount of compression than can be achieved may be larger but random access is made more difficult and unless many pixels in a block are accessed, the bandwidth usage increases as the 'data per accessed pixel' would increase. Similarly, with a larger number of smaller blocks, random access is made easier (and the data per accessed pixels may be reduced); however the amount of data compression that can be achieved may be reduced. If, for example, the block of data relates to an 8×8 tile of pixels or a 16×4 tile of pixels, the block may be subdivided into four sub-blocks 400 each corresponding to a 4×4 arrangement of pixels, as shown in FIG. 4A for an 8×8 tile and FIG. 4B for a 16×4 tile. The sub-blocks may be denoted sub-block 0-3. Having performed this sub-division (in block 302), each sub-block is considered independently and a lossy compression mode is selected for each sub-block based on the results of an analysis of the alpha values for the pixels within the sub-block (block 304). Dependent upon the outcome of this analysis, the selected mode may be a mode that uses a constant value for alpha (as applied in block 306 and referred to as the constant alpha mode) or a mode that uses a variable value for alpha across the sub-block (as applied in block 308 and referred to as the variable alpha mode). These may be the only two available modes or alternatively there may be one or more additional modes (e.g. as applied in block 310). The compressed data for each sub-block (as output by one of blocks 306-310) in a source data block is then packed together to form a corresponding compressed data block (block 312).

Figure 4C:
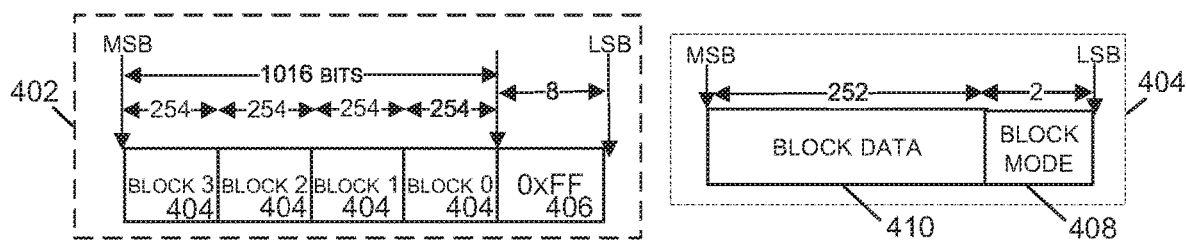
FIG. 4C is a schematic diagram showing an example compressed data block.

FIG. 4C shows a compressed data block 402 comprising compressed data 404 for each of the sub-blocks and a further data field 406 that indicates that the lossy compression method of FIG. 3A is being used. The data 404 for each sub-block 400 is divided into two fields: a 2-bit block mode 408 and a 252-bit block data 410. The block mode bits 408 indicate whether the variable alpha mode (block 308), constant alpha mode (block 306), or other mode (block 310) is used. The field values may, for example, be as follows:

| Field value | Interpretation |
| --- | --- |
| 0b00 | Constant alpha |
| 0b01 | Variable alpha |
| 0b1- | Other modes (where used) |

An example implementation of the analysis stage (block 304) in FIG. 3A is shown in detail in FIG. 5A. In this example, the alpha values for each of the pixels within the sub-block are analysed and two parameters are computed: minalpha and maxalpha, which are the minimum and maximum values of alpha for all of the pixels in the sub-block (block 502). These may be determined in any way including, for example, use of a loop (as in the example pseudo-code below, or its functional equivalent) or use of a tree of tests, with the first step determining maximum and minimum alpha values for pairs of pixels and then the second step determining maximum and minimum alpha values for pairs of outputs from the first step, etc. These two parameters (minalpha and maxalpha) are then used in a subsequent decision process (blocks 504-508) and although the decision process is shown as being applied in a particular order, in other examples the same tests may be applied in a different order (e.g. blocks 506 and 508 may be swapped over, assuming alphadifftol<254). Furthermore, it will be appreciated that the test in block 504 may alternatively be maxalpha>(minalpha+alphadifftol).

A first decision operation (block 504) assesses the range of alpha values across the sub-block and determines whether the range is greater than the errors that would be introduced by the use of the (best case) variable alpha mode (in block 308). The size of these errors is denoted alphadifftol in FIG. 5A and this value may be predetermined. The value of alphadifftol may be determined by comparing the loss in quality caused by the different methods within the variable alpha mode (i.e. 4-colour encoding with 4 bits of alpha or 3-colour encoding with 5 bits of alpha, and with two pixels sharing the same colour) in a training process (hence the use of the phrase 'best case' above). Alternatively, the value of alphadifftol may be determined (again in a training process) by assessing different candidate values against a large test set of images to find the candidate value that provides the best results using either a visual comparison or an image difference metric. The value of alphadifftol may be fixed or may be programmable.

In response to determining that the range is greater than the errors that would be introduced by the use of the (best case) variable alpha mode ('Yes' in block 504), a variable alpha mode of compression (block 308) is applied to this sub-block. However, in response to determining that the range is not greater than the errors that would be introduced by the use of the (best case) variable alpha mode ('No' in block 504), a constant alpha mode of compression (block 306) is applied to this sub-block and two further decision operations (blocks 506, 508) are used to determine the value of alpha which is used for the entire sub-block. If the value of maxalpha is the maximum possible value for alpha (e.g. 0xFF, 'Yes' in block 506), then the value of alpha used in the constant alpha mode (constalphaval) is set to that maximum possible value (block 510). This ensures that if there are any fully opaque pixels, they stay fully opaque after the data has been compressed and subsequently decompressed. If the value of minalpha is zero (e.g. 0x00, 'Yes' in block 508), then the value of alpha used in the constant alpha mode (constalphaval) is set to zero (block 512). This ensures that if there are any fully transparent pixels, they stay fully transparent after the data has been compressed and subsequently decompressed. If neither of these conditions are held ('No' in both blocks 506 and 508), then an average value of alpha is calculated across the pixels in the sub-block (block 514) and used in the constant alpha mode.

The following pseudo-code (or its functional equivalent) may, for example, be used to implement the analysis shown in FIG. 5 and in this code, P.alp is the alpha value for the pixel P being considered:

```
CONST AlphaDiffTol = 4;
U8 MinAlpha := 0xFF;
U8 MaxAlpha := 0x00;
U12 AlphaSum := 0;
FOREACH Pixel, P, in the 4x4block
    MinAlpha := MIN(P.alp, MinAlpha);
    MaxAlpha := MAX(P.alp, MaxAlpha);
    AlphaSum += P.alp;
ENDFOR
IF((MaxAlpha - MinAlpha) > AlphaDiffTol) THEN
    Mode := VariableAlphaMode;
ELSEIF (MaxAlpha == 0xFF)
    Mode := ConstAlphaMode;
    ConstAlphaVal := 0xFF;
ELSEIF (MinAlpha == 0x00)
    Mode := ConstAlphaMode;
    ConstAlphaVal := 0x00;
ELSE
    Mode := ConstAlphaMode;
    ConstAlphaVal := (AlphaSum + 8) >> 4;
ENDIF
```

An alternative example implementation of the analysis stage (block 304 in FIG. 3A) is shown in FIG. 5B. In this example, the parameter constalphaval is set initially to the alpha value of a pixel at a pre-defined location within the sub-block (block 520). For example, constalphaval may be set to the alpha value of the pixel at the top left of the sub-block (i.e. the first pixel in the sub-block). All the alpha values of the other pixels in the sub-block are then compared to this constalphaval (in blocks 522-526). Where all the alpha values are very similar to constalphaval (e.g. within a range of ±5, 'Yes' in block 522) then the constant alpha mode (of block 306 in FIG. 3A) is used, but where they vary more than this ('No' in block 522) then the variable alpha mode (of block 308 in FIG. 3A) is used. Then, in a similar manner to the method of FIG. 5A, for the constant alpha mode, the parameter constalphaval is set to zero (in block 512) or the maximum value (in block 510) where the pixels are all nearly fully transparent (constalphaval<5, 'Yes' in block 524) or nearly fully opaque (constalphaval>250, 'Yes' in block 526) respectively. It will be appreciated that the particular values used in FIG. 5B as part of the analysis (e.g. in blocks 522-526) are provided by way of example only and in other examples these values may differ slightly.

Figure 6A:
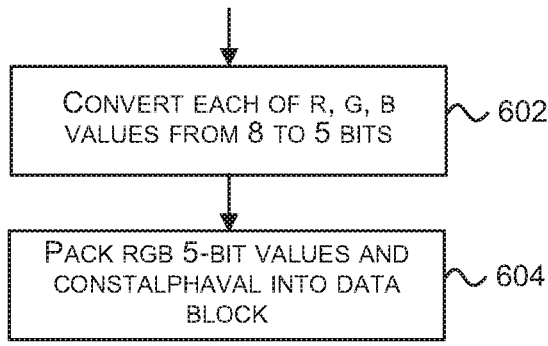
FIG. 6A is a flow diagram of a first example method of compressing a sub-block using the constant alpha mode of FIG. 3A.

In comparison to the method of FIG. 5A, the method of FIG. 5B does not require the determination of minalpha and maxalpha which reduces the computational effort required to perform the analysis. However, the method of FIG. 5B may produce some visible artefacts (e.g. aliasing) particularly when an object moves slowly across the screen and is less likely to detect a 'constant alpha' tile because of the use of a pre-defined location as the centre of the alpha values.

Where the analysis of the alpha values within a sub-block (in block 304, e.g. as shown in FIG. 5A or 5B) determines that the constant alpha mode (of block 306) is to be used and also sets the value of the parameter constalphaval (in one of blocks 510-514 and 520), then the compression of the sub-block proceeds as shown in FIG. 6A or FIG. 7A. FIG.

6A shows a flow diagram of a first example method of compressing a sub-block using the constant alpha mode (block 306 of FIG. 3A). For each pixel, each of the RGB values are compressed from 8 bits to 5 bits (block 602 e.g. as described below with reference to FIGS. 12A-B or using an alternative truncation approach) and then the compressed values are packed into a data block along with the value of constalphaval (block 604). Therefore, in this example, the data for the 4×4 sub-block is compressed from 512 bits (in RGBA8888 format (16*32=512 bits)) to 248 bits (8+16* (5+5+5)=248 bits).

Figure 6B:
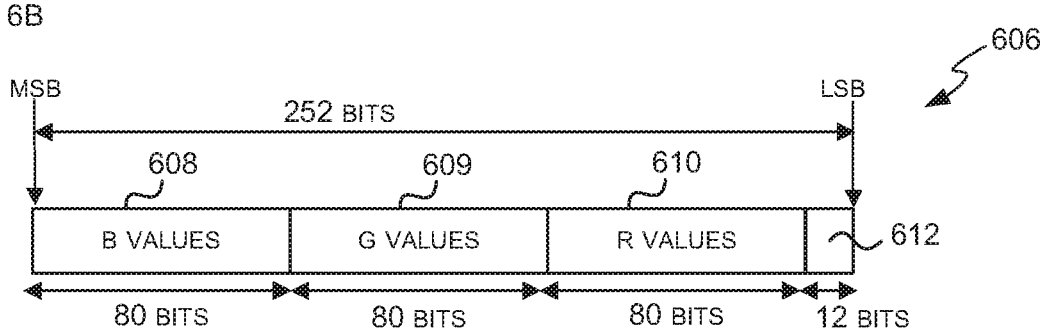
FIGS. 6B, 6C and 6D are schematic diagrams showing two different ways of packing the compressed values into a data block.
Figure 6C:
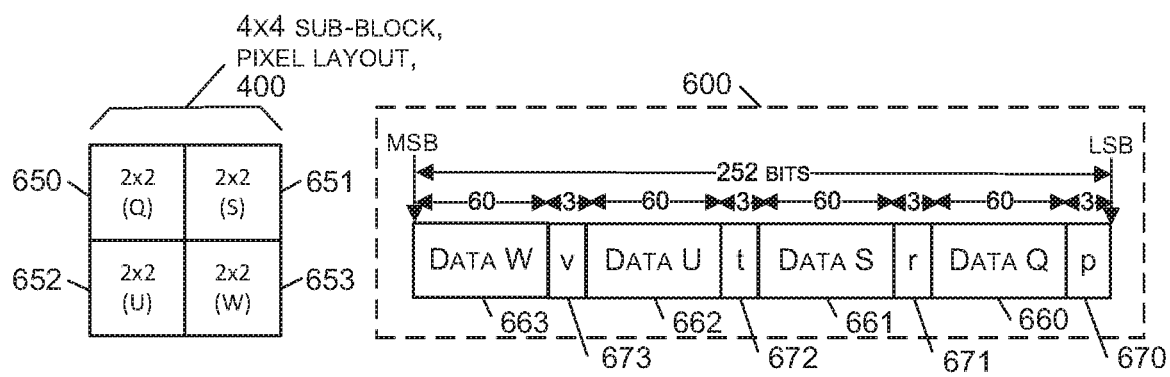
Figure 6D:
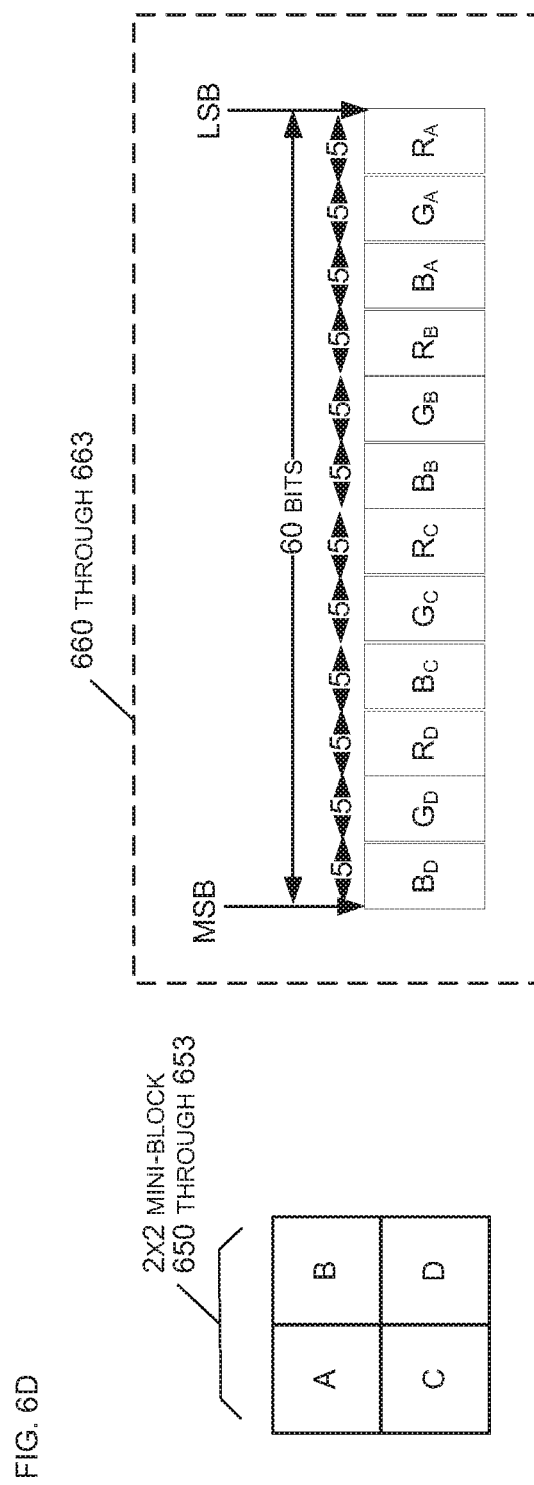

Two different ways of packing the compressed values into a data block are shown in FIGS. 6B-6D, although it will be appreciated that the compressed values may alternatively be packed into a data block in other ways. In the first example, as shown in FIG. 6B, the data block 606 comprises three 80-bit fields 608-610, each comprising data from one of the three channels (e.g. R, G or B) and a 12-bit field 612 which includes the 8-bit constalphaval (e.g. as determined using FIG. 5A or 5B) and the remaining 4 bits may be unused or reserved for future use. In each of the 80-bit fields 608-610 there are 5-bit values for each of the pixels in the sub-block.

In the second example, as shown in FIGS. 6C-6D the layout of data is similar to that for the second method of performing the variable alpha mode (of block 308, as described below with reference to FIG. 9) as this results in less complex hardware (and hence smaller hardware with a lower power consumption) where the two methods (i.e. the methods of FIGS. 6A and 9) are used together. As shown in FIG. 6C, each sub-block 400 (e.g. each 4×4 pixel sub-block) is subdivided into four mini-blocks 650-653 (e.g. four 2×2 pixel mini-blocks). Each mini-block has a corresponding 60-bit data field 660-663 that contains the RGB data for the pixels in the mini-block. In FIG. 6C, the mini-blocks and their corresponding data fields have been labelled Q, S, U and W. The 8-bit constalphaval (e.g. as determined using FIG. 5A or 5B) is distributed amongst the four 3-bit fields 670-673. Within each of the mini-block data fields 660-663, the RGB data is distributed as shown in FIG. 6D. If each of the mini-blocks comprises four pixels, labelled A-D, these are each represented by three 5-bit values, one for each of the R, G and B channels (e.g. 5-bit values $R_A$, $G_A$ and $B_A$ represent pixel A, 5-bit values $R_B$, $G_B$ and $B_B$ represent pixel B, etc.).

FIG. 7A shows a flow diagram of a second example method of compressing a sub-block using the constant alpha mode (block 306 of FIG. 3A) which is a variant of the method shown in FIG. 6A. As shown in FIG. 7A, the pixels in the sub-block 400 are divided into two non-overlapping subsets and then the pixels in each of the subsets are compressed by different amounts. In the specific example shown in FIG. 7A which may be used where the constalphaval can be stored in less than 8 bits (e.g. the constant alpha is <5 or >250), the pixels in the first subset are compressed in the same way as in FIG. 6A, i.e. by converting each of the R, G, B values from RGB888 format to RGB555 format (block 602), whereas the pixels in the second subset are compressed in a different way (block 702), i.e. by converting the RGB data from RGB888 format (i.e. three 8-bit values, one for each channel) to RGB565 format (i.e. 5-bit values for the R and B channels and 6-bit values for the G channel). The compression (in blocks 602 and 702) may be performed as described below with reference to FIGS. 12A-B or may use an alternative approach (e.g. truncation of the values by removing one or more of the LSBs). In other examples, the two subsets of pixels may be compressed in different ways (e.g. the pixels of the second subset may be compressed by converting the RGB data from RGB888 format to RGB554).

FIG. 7B shows an example of how the pixels in a sub-block may be divided into the two subsets. In the example shown in FIG. 7B, the 4 pixels marked A-D form the first subset and the 12 shaded pixels form the second subset. In other examples, the split between the two subsets may be different (e.g. there may more or fewer than four pixels in the first subset, with the remaining pixels forming the second subset) and/or the position of the pixels in the first subset may be different.

Figure 8A:
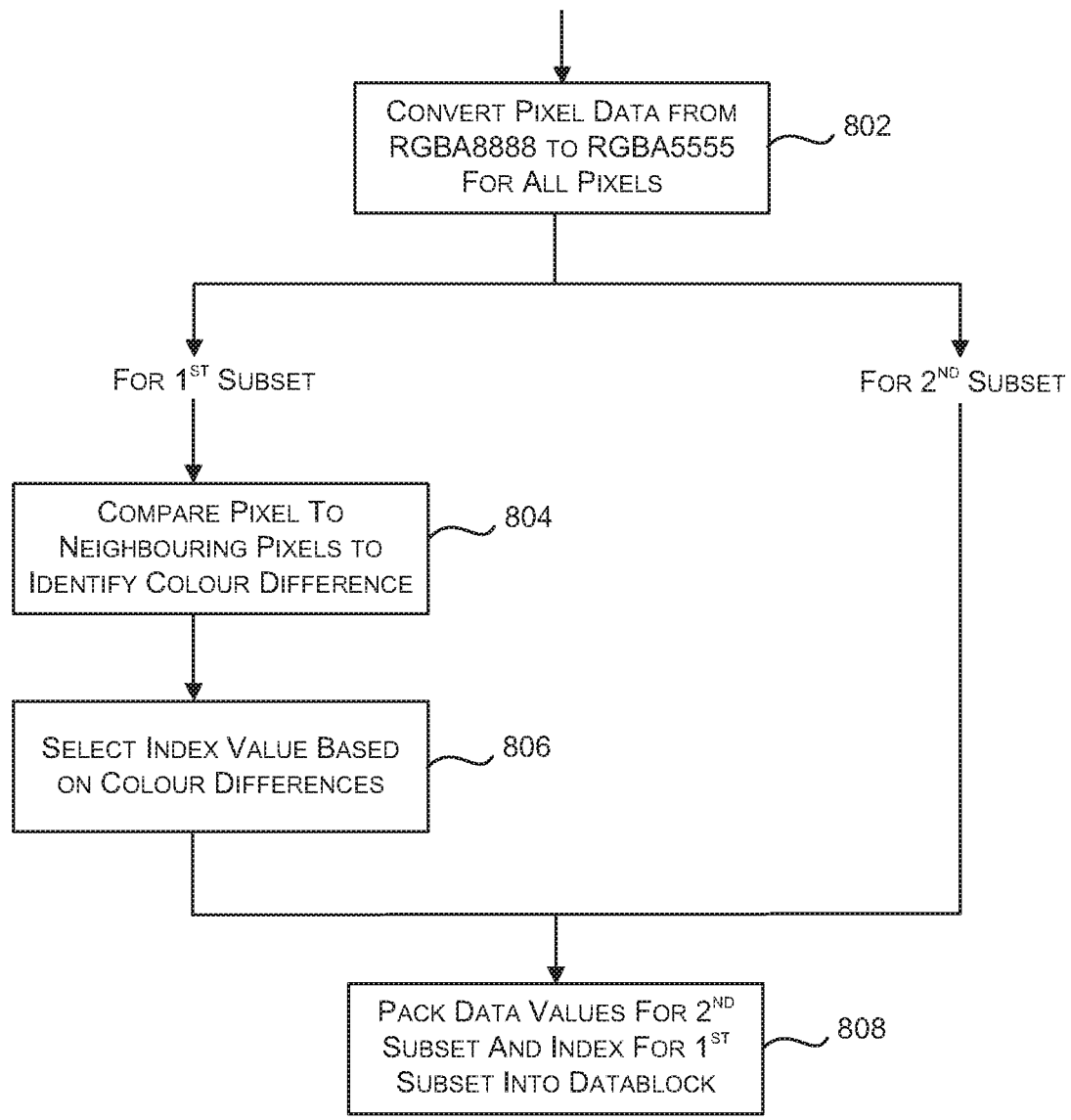
FIG. 8A is a flow diagram of a first example method of compressing a sub-block using the variable alpha mode of FIG. 3A.
Figure 9:
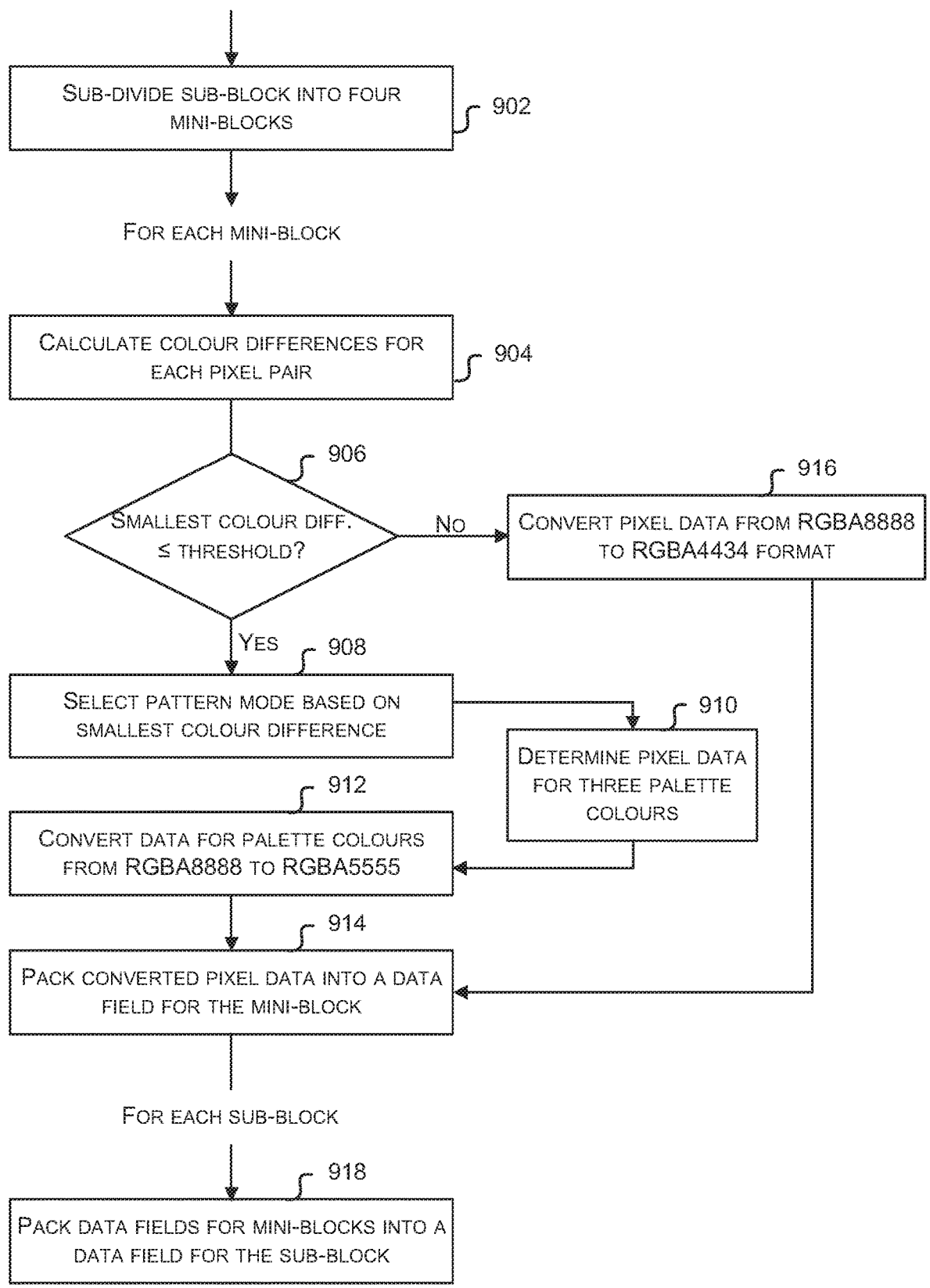
FIG. 9 is a flow diagram of a second example method of compressing a sub-block using the variable alpha mode of FIG. 3A.

In examples where the constalphaval is an 8-bit value (e.g. where the constant alpha is not <5 or >250), the method of FIG. 7A may be modified such that the pixels in the second subset are compressed in the same way as in FIG. 6A, i.e. by converting each of the R, G, B values from RGB888 format to RGB555 format (block 602), whereas the pixels in the first subset are compressed in a different way (block 702), i.e. by converting the RGB data from RGB888 format (i.e. three 8-bit values, one for each channel) to RGB565 format (i.e. 5-bit values for the R and B channels and 6-bit values for the G channel). As before, the compression (in blocks 602 and 702) may be performed as described below with reference to FIGS. 12A-B or may use an alternative approach (e.g. truncation of the values by removing one or more of the LSBs).

Where the analysis of the alpha values within a sub-block (in block 304, e.g. as shown in FIG. 5A or 5B) determines that the variable alpha mode (of block 308) is to be used, then the compression of the sub-block proceeds as shown in FIG. 8A or 9. FIG. 8A shows a flow diagram of a first example method of compressing a sub-block using the variable alpha mode (block 308 of FIG. 3A). As shown in FIG. 8A, the data for each pixel in the sub-block is compressed by converting from RGBA8888 format, i.e. four 8-bit values, one for each channel including the alpha channel, to RGBA5555 format, i.e. four 5-bit values, one for each channel including the alpha channel, (block 802, e.g. as described below with reference to FIGS. 12A-B). The pixels in the sub-block 400 are then divided into two non-overlapping subsets (e.g. as described above with reference to FIG. 7B) and the pixels in the first subset (e.g. pixels A-D in FIG. 7B) are then subject to further compression (blocks 804-806) which can be described with reference to FIG. 8B. To further compress the pixels in the first subset, each of these pixels is compared to its neighbour pixels to identify which neighbouring pixel is most similar (block 806). The similarity may be assessed using a colour difference parameter, with the most similar pixel having the smallest colour difference to the particular pixel and where colour difference between a pixel and a neighbour pixel (i.e. between a pair of pixels) may be calculated as:

$$|\text{Red difference}|+|\text{Green difference}|+|\text{Blue difference}|+|\text{Alpha difference}| \quad (1)$$

Having identified the most similar neighbouring pixel for each pixel in the first subset, an index is selected for each pixel in the first subset using a look-up table, such as:

| Index | Most similar neighbouring pixel |
|-------|-------------------------------|
| 000   | R0                            |
| 001   | R1                            |
| 010   | R2                            |
| 011   | R3                            |
| 100   | R4                            |

Where the references for the neighbouring pixels R0-R4 are defined as shown in FIG. 8B. It will be appreciated however, that where the positions of the pixels of the first subset are different, these may be defined differently.

In various examples, there may be additional indices that are used where there is a gradient around a pixel in the first subset. In such examples, the pixel data for one or more additional notional neighbour pixels are calculated, for example by the addition of a single additional notional neighbour pixel, R5, where the pixel data for R5 is calculated using:

$$R5=(R0+R1)/2$$

In other examples, one or more further notional neighbour pixels may also be considered, e.g. R6 and/or R7, where the pixel data for R6 and R7 is calculated using:

$$R6=(R0+R4)/2$$

$$R7=(R1+R3)/2$$

Where additional notional neighbour pixels are used, the look-up table includes corresponding additional entries to identify the indices, for example:

| Index | Most similar neighbouring pixel |
|---|---|
| 000 | R0 |
| 001 | R1 |
| 010 | R2 |
| 011 | R3 |
| 100 | R4 |
| 101 | R5 |
| 110 | R6 |
| 111 | R7 |

In various examples, there may be an additional special case index that indicates that none of the neighbouring pixels (including any notional neighbouring pixels, where used) are sufficiently similar to the particular pixel. This may, for example, be determined based on a threshold and where the closest colour difference exceeds this threshold, an index of 000 may be used. In an example, the threshold may be 31 for 5-bit values. In addition to using the index 000, the pixel referred to by the index 000 is changed to a value that is an average between the current pixel and the pixel referred to. Alternatively, in a variation of FIG. 8A, if the conversion of pixel data from RGBA8888 to RGBA5555 (in block 802) is not performed until immediately prior to the packing of data values (in block 808), such that the comparison (in block 804) is performed on 8-bit values, the threshold will be different (e.g. 255 for 8-bit values).

FIG. 9 shows a flow diagram of a second example method of compressing a sub-block using the variable alpha mode (block 308 of FIG. 3A). As shown in FIG. 9, the sub-block 400 (e.g. each 4×4 pixel sub-block) is subdivided (block 902) into four mini-blocks 650-653 (e.g. 2×2 pixel mini-blocks), as shown in FIG. 6C. Each mini-block is then compressed individually, with each mini-block having a corresponding data field 660-663 that contains the RGB data for the pixels in the mini-block. The corresponding four 3-bit fields 670-673 do not contain the constalphaval, as is the case in the earlier discussion of FIG. 6C, but where variable alpha mode is used, these 3-bit fields identify the encoding (or palette) mode that is used for each of the mini-blocks in the sub-block, as described below.

The encoding mode is determined for each of the mini-blocks based on colour differences that are calculated for each pixel pair in the mini-block (block 904). The colour difference may be calculated using equation (1) above and this may be implemented by the functional equivalent of the pseudo-code provided below in which the colour difference is clamped to 6 bits (i.e. a maximum value of 63). In this code, the notation is as follows: IntermediateResult[5,0] refers to the 6 LSBs of the IntermediateResult 10-bit value and red/grn/blu/alp refer to red/green/blue/alpha respectively).

```
U6 DiffMetric(PIXEL Pix1, PIXEL Pix2)
{
    U6 Result;
    U10 IntermediateResult;
    U8 R1 := Pix1.red;
    U8 R2 := Pix2.red;
    U8 G1 := Pix1.grn;
    U8 G2 := Pix2.grn;
    U8 B1 := Pix1.blu;
    U8 B2 := Pix2.blu;
    U8 A1 := Pix1.alp;
    U8 A2 := Pix2.alp;
    IntermediateResult:= SAD4x5(R1, R2, G1, G2, B1, B2, A1, A2);
    IF((IntermediateResult > 63) THEN
        Result := 63;
    ELSE
        Result := IntermediateResult[5..0];
    ENDIF
    RETURN Result;
}
```

The pseudo-code above includes a sum of absolute differences (SAD) function and this may, for example, be implemented in any way (e.g. as implemented by a logic synthesis tool or as described in FIG. 2 of "Efficient Sum of Absolute Difference Computation on FPGAs" by Kumm et al).

Having calculated the colour differences (in block 904), the smallest colour difference for any pixel pair in the mini-block is used to determine the mini-block encoding mode that is used (block 906). There are two distinct types of mini-block encoding mode that are used dependent upon whether the smallest colour difference (between any pixel pair in the mini-block) exceeds a threshold value (which may, for example be set at a value in the range 0-50, e.g. 40). If the smallest colour difference does not exceed the threshold ('Yes' in block 906), then one of a plurality of encoding patterns are used (as selected in block 908) and three per-mini-block palette colours are stored (blocks 910-914). However, if the smallest colour difference does exceed the threshold ('No' in block 906) then a four colour mode is used (block 916). These different mini-block modes are described in detail below. The encoding patterns rely on an assumption that in the majority of mini-blocks there are no more than three distinct colours and in such cases the mini-block can be represented by three palette colours along with an assignment of pixels to palette entries. The four colour mode is present to handle the exceptions to this.

As noted above, the value of the threshold may be in the range 0-50. In various examples it may be a fixed value that is set at design time. Alternatively, it may be a variable which is stored in a global register and read each time the method of FIG. 9 is performed. This enables the threshold to be changed dynamically or at least periodically. In various examples, the value of the threshold may be set based on results from a training phase. The training phase may use an image quality metric, for example peak signal-to-noise ratio (PSNR) or structural similarity metric (SSIM) to assess a selection of images compressed using each of the three colour approach (blocks 908-912) or the four colour approach (block 916) and then the threshold value may be selected such that overall the highest image quality metrics are obtained.

It may be noted that the threshold used in the method of FIG. 9 may have a different value to the threshold used in the method of FIG. 8A because the two thresholds serve different purposes as they are aiming to address different situations and remove different kinds of artefact. In the method of FIG. 8A, the threshold is used to identify when one of the pixels is an 'isolated colour', in that it cannot be represented well with one of its neighbours. In contrast, the threshold in the method of FIG. 9, the threshold is used to identify when the four colours are too different to each other.

As shown in FIG. 9, if the smallest colour difference is smaller than or equal to the threshold ('Yes' in block 906), such that an encoding pattern can be used, the particular pattern that is used is selected from a set of six assignment patterns as shown in FIG. 10A based on the pixel pair (in the mini-block) that has the smallest colour difference (block 908). In each pattern in FIG. 10A, the two pixels that are shown shaded share a palette entry that is derived by averaging the two source pixel colours. Determining the three palette colours $P_0$, $P_1$, $P_2$ (block 910) for the selected pattern (from block 908) therefore comprises performing this average and identifying the pixel data for the other two remaining pixels in the mini-block. Example pseudo-code for implementing this selection along with the calculation of three palette colours is provided below, but referring to FIG. 10A, if the smallest colour difference is for pixel pair AB (denoted DiffAB in the pseudo-code), then the mode that is selected is the mode called 'Top', and the three palette colours are an average of A and B, and then pixels C and D. Similarly, if the smallest colour difference is for pixel pair CD (denoted DiffCD in the pseudo-code), then the mode that is selected is the mode called 'Bottom' and the three palette colours are an average of C and D and then pixels A and B. The palette colours in other modes (i.e. the 'Left', 'Right', Diag1' and 'Diag2' modes) are apparent from FIG. 10A.

The following table shows an example mapping of the corresponding palette colours for each of the pixels A-D in a mini-block for each of the encoding modes along with the encoding value that is stored in the 3-bit field 670-673 for the mini-block (as shown in FIG. 6C). The pixels that are represented by identical palette colours are shown in bold and italic. In this example, the mapping has been arranged so that each pixel (e.g. pixel A, B, C or D) accesses only one of two possible palette colours and this results in a hardware implementation which is less complex than if all four pixels can access any of the three palette colours.

| Encoding value | Pattern name | Pixel A ($P_0$ or $P_1$) | Pixel B ($P_0$ or $P_1$) | Pixel C ($P_0$ or $P_2$) | Pixel D ($P_0$ or $P_2$) |
|---|---|---|---|---|---|
| 000 | Top | *$P_1$* | *$P_1$* | $P_0$ | $P_2$ |
| 001 | Bottom | $P_0$ | $P_1$ | *$P_2$* | *$P_2$* |
| 010 | Left | *$P_0$* | $P_1$ | *$P_0$* | $P_2$ |
| 011 | Right | $P_1$ | *$P_0$* | $P_2$ | *$P_0$* |
| 100 | Diag 1 | *$P_0$* | $P_1$ | $P_2$ | *$P_0$* |
| 101 | Diag 2 | $P_1$ | *$P_0$* | *$P_0$* | $P_2$ |

A portion of example pseudo-code that implements this table (and blocks 908-910 of FIG. 9) is as follows:

```
ELSIF (MinDiff == DiffAB)
    MODE := TOP;
    P0full:= PixelC;
```

```
    P2full:= PixelD;
    P1full:= Average(PixelA, PixelB);
ELSIF (MinDiff == DiffAC)
    MODE := LEFT;
    P0full:= Average(PixelA, PixelC);
    P1full:= PixelB;
    P2full:= PixelD;
ELSIF . . .
```

The Average function in the pseudo-code above may be implemented as follows (or its functional equivalent):

```
PIXEL Average(PIXEL Pix1, PIXEL Pix2)
{
    PIXEL Result;
    Result.red := (Pix1.red + Pix2.red + 1) >> 1;
    Result.grn := (Pix1.grn + Pix2.grn + 1) >> 1;
    Result.blu := (Pix1.blu + Pix2.blu + 1) >> 1;
    Result.alp := (Pix1.alp + Pix2.alp + 1) >> 1;
    Return Result;
}
```

Having determined the three palette colours, $P_0$, $P_1$, $P_2$ in RGBA8888 format, the values are converted to RGBA5555 format (block 912, e.g. as described below with reference to FIGS. 12A-B). Whilst the operations of generating the palette colours (in block 910) and the compression by converting format (in block 912) are shown and described separately, it will be appreciated that the two operations may be combined into a single step and this may result in less complex hardware.

As shown in FIG. 9, if the smallest colour difference is not smaller than or equal to the threshold ('No' in block 906, i.e. the threshold is exceeded), then the encoding patterns shown in FIG. 10A cannot be used and instead the four colour mode is used. In this mode, the number of bits used to represent each channel is reduced (in block 916) and in the example shown in FIG. 9, the pixel data is converted from RGBA8888 format to RGBA4434 format for each of the four pixels in the mini-block (block 916 e.g. as described below with reference to FIGS. 12A-B). The encoding value that is used to indicate that this mode is being used is one of the values that are not used for the encoding patterns (as detailed in the table above) and in various examples an encoding value of 111 may be used. This encoding value is stored in the 3-bit field 670-673 for the mini-block (as shown in FIG. 6C).

Whilst the four colour mode is shown as using RGBA4434 format, alternative compressed formats may alternatively be used (e.g. RGBA4443). The RGBA4434 format may be used because although the human eye is sensitive to blue, the human visual system does not perceive the colour with the same resolution as red or green. In addition, a dither pattern may additionally be applied when using the four colour mode (e.g. in block 916 and also block 602 in FIG. 11).

Having generated the compressed data for a mini-block, using any one of the encoding patterns or the four colour mode, the compressed data for the mini-block is packed into a 60-bit data field 660-663 for the mini-block and the corresponding encoding value is inserted in the associated field 670-673 (block 914). The way that the data is packed differs depending upon the mode used and these are shown in FIGS. 10B and 10C. FIG. 10B shows the packing of pixel data for a mini-block that has been compressed using an encoding pattern and FIG. 10C shows the packing of pixel data for a mini-block that has been compressed using the four colour mode.

As described above, for a mini-block that has been compressed using an encoding pattern, the data to include in the data field comprises three palette colours in RGBA5555 format and these may be packed into the data field as shown in FIG. 10B. As shown, the RGB data may be separated from the alpha channel data in order to more closely match the packing arrangement that may be used in the constant alpha mode (as shown in FIG. 6D). For a mini-block that has been compressed using the four colour mode, the data to include in the data field comprises four RGBA4434 values and these may be packed into the data field as shown in FIG. 10C. Again the arrangement shown is selected to more closely match the packing arrangement that may be used in the constant alpha mode. The arrangement for packing the data for each pixel is also shown in FIG. 10C and by packing the data in this way, with the four alpha bits being separated and placed between the RGB data, the R, G, B channel data corresponds to the positions of, respectively, four, four and three MSBs of the RGB data of the constant alpha mode shown in FIG. 6D. The alpha channel for the given pixel is distributed in the unused sections, matching LSB to MSB order.

Having formed the data fields for the mini-blocks (in block 914), these are then packed into data fields to the sub-blocks (block 918, e.g. as shown in FIG. 6C).

Figure 11:
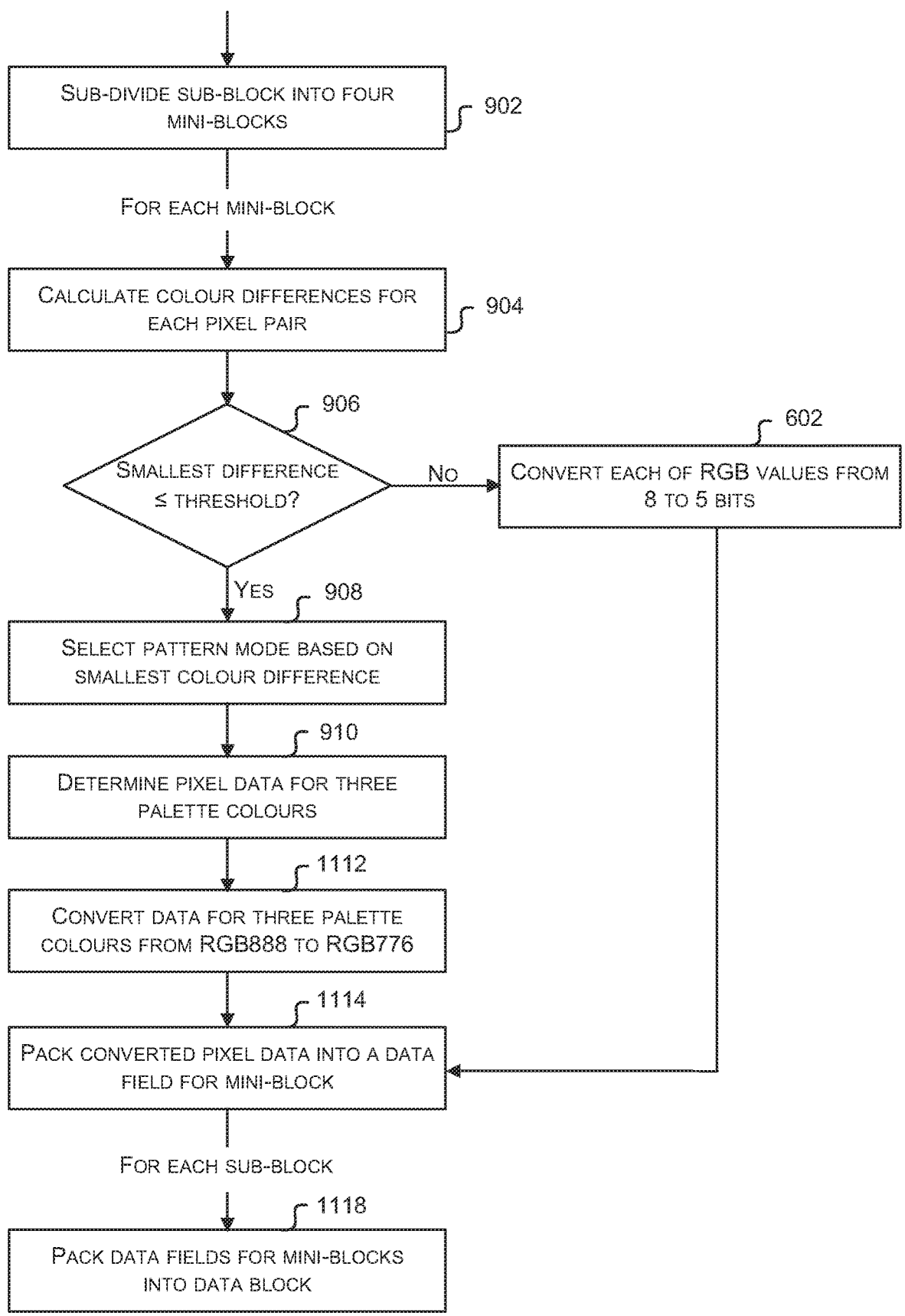
FIG. 11 is a flow diagram of a further example method of compressing a sub-block using a constant alpha mode.

Although the encoding patterns are described above in relation to the variable alpha mode, in various examples they may also be used to provide a higher-precision constant alpha mode where the constant alpha value is 255 (or other pre-defined value) as shown in FIG. 11, with the previously described constant alpha mode (e.g. as shown in FIG. 6A or 7A) being used for other constant alpha values. FIG. 11 shows a flow diagram of a third example method of compressing a sub-block using the constant alpha mode (block 306 of FIG. 3A) which is a variant of the methods shown in FIGS. 6A and 9. In this example method, the sub-block 400 (e.g. each 4×4 pixel sub-block) is subdivided (block 902) into four mini-blocks 650-653 (e.g. 2×2 pixel mini-blocks), as shown in FIG. 6C. Each mini-block is then compressed individually, with each mini-block having a corresponding data field 660-663 that contains the RGB data for the pixels in the mini-block. The corresponding four 3-bit fields 670-673 identify the encoding mode that is used for each of the mini-blocks in the sub-block. In this example, the constalphaval is not included as it is a known constant value, e.g. 255, and this in turn may be indicated using a dedicated block encoding mode (e.g. one of the 0b1—modes which are indicated as reserved above). In yet further examples, the encoding patterns may in addition, or instead, be used to provide higher-precision constant alpha mode where the constant alpha value is stored and not assumed to have a known constant value (e.g. 255). In such examples, constalphaval may be stored alongside the pixel data and in order that there is room to store constalphaval, the method of FIG. 11 may be modified such that the three palette colours are converted from RGB888 to RGB676 (in block 1112, instead of RGB776) and the four-colour mode converts each colour from RGB888 to RGB554 (in block 602, instead of RGB555).

The encoding mode is then determined for each of the mini-blocks based on colour differences that are calculated for each pixel pair in the mini-block (block 904). The colour difference may be calculated using any of the methods described above but omitting the alpha channel data.

Having calculated the colour differences (in block 904), the smallest colour difference for any pixel pair in the mini-block is used to determine the mini-block encoding mode that is used (block 906). There are two distinct types of mini-block encoding mode that are used dependent upon whether the smallest colour difference (between any pixel pair in the mini-block) exceeds a threshold value (which may, for example be set at a value in the range 0-50, e.g. 40). If the smallest colour difference does not exceed the threshold ('Yes' in block 906), then one of a plurality of encoding patterns are used (as selected in block 908) and three per-mini-block palette colours are stored (blocks 910-914). However, if the smallest colour difference does exceed the threshold ('No' in block 906) then the earlier compression approach (from FIG. 6A), of converting each of the RGB values from 8 bits to 5 bits is used (block 602). As before the encoding patterns rely on an assumption that in the majority of mini-blocks there are no more than three distinct colours and in such cases the mini-block can be represented by three palette colours along with an assignment of pixels to palette entries. The earlier approach (of block 602) present to handle the exceptions to this. Where encoding patterns are used, higher precision can be used (e.g. more than 5 bits per colour channel) as there are only three palette colours rather than four pixels.

The selection of an encoding pattern then proceeds as described above with reference to FIG. 9, except that there is no alpha data to consider (blocks 908-910). Having determined the three palette colours, $P_0$, $P_1$, $P_2$ in RGB888 format, the values are converted to a format with higher resolution than RGB555, e.g. RGB776 or RGB666 format (block 1112, e.g. by truncation or as described below with reference to FIGS. 12A-B).

Having generated the compressed data for a mini-block, using either one of the encoding patterns or the four colour mode (although in some examples, this four colour mode may not be used where alpha is constant value of 255), the compressed data for the mini-block is packed into a 60-bit data field 660-663 for the mini-block and the corresponding encoding value is inserted in the associated field 670-673 (block 1114). As described above, in various examples where the encoding patterns are used to provide higher-precision constant alpha mode, constalphaval may also be packed into the 60-bit data fields 660-663. Having formed the data fields for the mini-blocks (in block 1114), these are then packed into data fields to the sub-blocks (block 1118, e.g. as shown in FIG. 6C). This method of FIG. 11 provides improved RGB accuracy (e.g. RGB776 or RGB676 instead of RGB555) and hence improved image quality.

In the description above, there are six different palette assignment (or encoding) modes, as shown in FIG. 10A (along with a four colour mode). In various examples there may be one or more additional mode, as shown in FIG. 10D. In such an additional mode there are only two palette colours (as indicated by the different shadings in FIG. 10D), with each of the two palette colour being the average of the two pixels sharing the same palette colour. In the first example, 1001, pixels A and C are averaged to generate the first palette colour, which is then used to replace the data for pixels A and C and similarly for pixels B and D to generate the second palette colour (which is then used to replace the data for those pixels). In the second example, 1002, pixels A and B are averaged to generate the first palette colour and pixels C and D are averaged to generate the second palette colour. As only two palette colours are stored (compared to the three in the earlier encoding modes), the palette colours may be stored at higher precision (e.g. RGBA8888 for constant alpha and RGBA7878 for variable alpha).

The first of the two palette colour modes 1001 (as shown in FIG. 10D) may, for example be used if the colour difference between pixels A and C (DiffAC in the notation used above) and the colour difference between pixels B and D (DiffBD) are both less than a pre-defined threshold. Similarly, the second of the two palette colour modes 1002 may, for example be used if the colour difference between pixels A and B (DiffAB in the notation used above) and the colour difference between pixels C and D (DiffCD) are both less than a pre-defined threshold. Furthermore, whilst FIG. 10D shows only two palette colour modes, it will be appreciated that there may, in various examples, be a third two palette colour modes in which one palette colour is an average of pixels A and D and the other palette colour is an average of pixels B and C.

Where the two palette colour modes are used, an additional test against the pre-defined threshold (which may be different from the threshold used in block 906) may be inserted between blocks 904 and 906 in FIG. 9. If the test determines that a two palette colour mode may be used (as described above), the pixel data is averaged to form the two palette colours and then those palette colours may be converted to RGB7878 format (or they may be left as RGB888 for the constant alpha case) and then the pixel data is packed into a data field (block 914). If the test determines that a two palette colour mode cannot be used, then the method proceeds to block 906.

As detailed above, there are many operations in data compression that involve converting an n-bit number, N, to an m-bit number, M, where n>m. The ideal mapping from n to m bits is given by:

$$M = IdealMap(N, n, m) = \text{floor}\left(\frac{(2^m - 1)}{(2^n - 1)}N + \frac{1}{2}\right)$$

This may, for example, be implemented using a large look-up table (LUT) comprising N entries. Alternatively, since the results are 'symmetrical' around a half, in that:

IdealMap($\overline{N}$,n,m)=$\overline{IdealMap(N,n,m)}$ where $\overline{X}$ means the complement of the bits of X, then the size of the LUT may be halved. In such examples, one half of the LUT may be retained (e.g. the lower half) and the other half of the table (e.g. the upper half) may be derived by inverting N−1 LSBs on input and similarly, inverting M−1 LSBs on output (e.g. by XORing X−1 LSBs with the MSB—the MSB is the same on input and output).

Figure 12A:
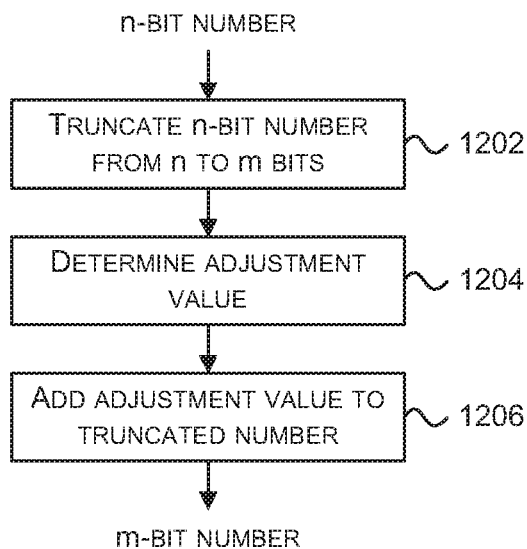
FIG. 12A is a flow diagram of a method of converting an n-bit number to an m-bit number, where n>m.

FIG. 12A is a flow diagram of an alternative method of performing this conversion. Using the method of FIG. 12A provides a hardware implementation, as shown in FIG. 12B, that is both accurate and efficient (e.g. in hardware, i.e. in terms of size, etc.). Whilst it still uses a LUT, the LUT is significantly smaller than the LUTs mentioned above (but does require an additional addition element). Whilst the method is described herein in the context of data compression, the methods described herein with reference to FIG. 12A may also be used in other situations and independently of any other methods described herein.

Figure 12B:
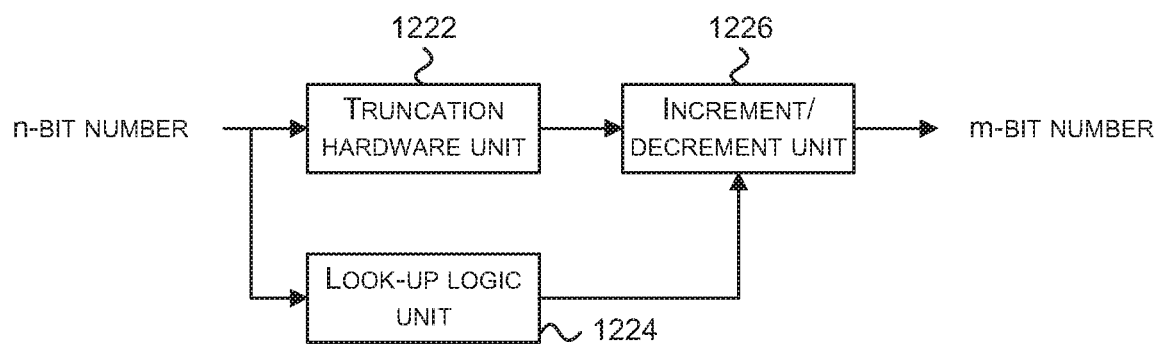
FIG. 12B is a schematic diagram of a hardware implementation of the method of FIG. 12A.

As shown in FIG. 12A, the method comprises receiving an input n-bit number, N, and truncating that number from n-bits to m-bits (block 1202) and this may be implemented in the truncation hardware unit 1222 in FIG. 12B. An adjustment value is then determined (block 1204) based on the input n-bit number, N, and, as described below, this may be implemented using a number of AND and OR gates in the look-up logic unit 1224. These AND and OR logic gates (or alternative logic arrangements that are functionally equivalent) compare a plurality of pre-determined subsets of the bits of the input n-bit number with pre-determined values in fixed-function circuitry and based on the outcome of the comparisons, determine an adjustment value which is then added to the truncated value (from block 1202 and truncation hardware unit 1222) in the increment/decrement unit 1226 (block 1206). The value of the adjustment value is either zero, one, or minus one.

The operation of the look-up logic unit 1224 to determine the adjustment value (in block 1204) can be described with reference to a specific example where n=8 and m=5 and the following VHDL (or its functional equivalent), where "0-0-111" is an example of a pre-defined bit sequence which is compared to the bits in the input n-bit number and "01" its associated adjustment value:

```
function CorrectionsFor8to5(i : std_logic_vector(7 downto 0))
   return std_logic_vector is
   variable results:std_logic_vector(1 downto 0);
begin
   results:=(others=>'0');
   if std_match(i, "00---11-") then results:= "01"; end if;
   if std_match(i, "0-0-111") then results:= results OR "01"; end if;
   if std_match(i, "000--1-1") then results:= results OR "01"; end if;
   if std_match(i, "0-00011-") then results:= results OR "01"; end if;
   if std_match(i, "0--00111") then results:= results OR "01"; end if;
   if std_match(i, "1--11000") then results:= results OR "11"; end if;
   if std_match(i, "111--0-0") then results:= results OR "11"; end if;
   if std_match(i, "1-11100-") then results:= results OR "11"; end if;
   if std_match(i, "11---00-") then results:= results OR "11"; end if;
   if std_match(i, "1-1--000") then results:= results OR "11"; end if;
   return results;
end function CorrectionsFor8to5;
```

In this example, 'std_logic_vector(7 downto 0)' refers to all 8 bits of N (labelled 0-7, with bit 0 being the LSB and bit 8 being the MSB) and the function 'std_match' may be implemented using AND gates, for example, 'std_match(i, "00---11-")' may be implemented as follows:

$\overline{b7} \wedge \overline{b6} \wedge b2 \wedge b1$

Where by is bit y of N and $\wedge$ represents a logical AND. Similarly 'std_match(i, "11---00-")' may be implemented as:

$b7 \wedge b6 \wedge \overline{b2} \wedge \overline{b1}$

Furthermore, in this example, the initial value of 'results' is set to the two LSBs (i.e. bits 0 and 1) of N and the final value of 'results' is either set to 01 or 00 or to the initial value of results combined using an OR gate with a 2-bit value that is dependent upon the outcome of the 'std_match' function described above. This assumes that common factors are shared. It is estimated that approximately 31 AND/OR gates are required to implement the look-up logic unit 1224 for n=8 and m=5; however, it will be appreciated that any equivalent logic functionality (e.g. implemented using NANDs, NORs, XORs, etc.) may alternatively be used, e.g. dependent upon the silicon process used for fabrication or target clock speed).

In this way, the look-up logic unit 1224 compares pre-determined subsets of the bits of the input n-bit number with pre-determined values in fixed-function circuitry, and sets the adjustment value in dependence on the results of the comparisons. Implementing the conversion from an n-bit number to an m-bit number in hardware using AND/OR gates as described above to determine an adjustment value to be applied to a truncated version of the n-bit number provides a very efficient implementation (e.g. in terms of silicon area, latency and power consumption) for performing a particular conversion (e.g. 8-bit values to 5-bit values). In this example, the hardware is inflexible in the sense that it is implemented in fixed-function circuitry using AND and OR gates for performing one or more specific conversions (e.g. conversions from 8-bit numbers to 5-bit numbers). If different conversions are required, e.g. different values of n and/or m, then different hardware can be used. The trade-off for this inflexibility is that the hardware can be implemented very efficiently (in terms of silicon area, latency and power consumption). Since the compression process described herein uses an 8-bit to 5-bit converter, and this is known at design time, the inflexibility is not a big problem whereas the efficiency advantages can be significant.

Although data decompression is not described above, it will be appreciated that the data compression operations described above are reversed in order to achieve data decompression. For example, the methods of FIGS. 3A, 6A, 7A, 8A, 9 and 11 are reversed when performing data decompression. FIG. 3B shows a method of data decompression which is the reverse of the data compression method shown in FIG. 3A. As shown in FIG. 3B, for each sub-block of the compressed data, the compression mode is identified from the block mode (block 322) and depending upon the mode, the compressed sub-block data is decompressed using a variable alpha mode (block 308', which is the reverse of block 308 described above), or a constant alpha mode (block 306', which is the reverse of block 306 described above) and similarly if any other data compression mode is used (block 310'). The data decompression of the sub-blocks (in blocks 306', 308', 310') may involve converting a number from n-bits to m-bits where n<m (e.g. in inverse operations to blocks 602, 702, 802, 912, 916 and 1112). This may be implemented using the method shown in FIG. 13A and the hardware shown in FIG. 13B.

Figure 13A:
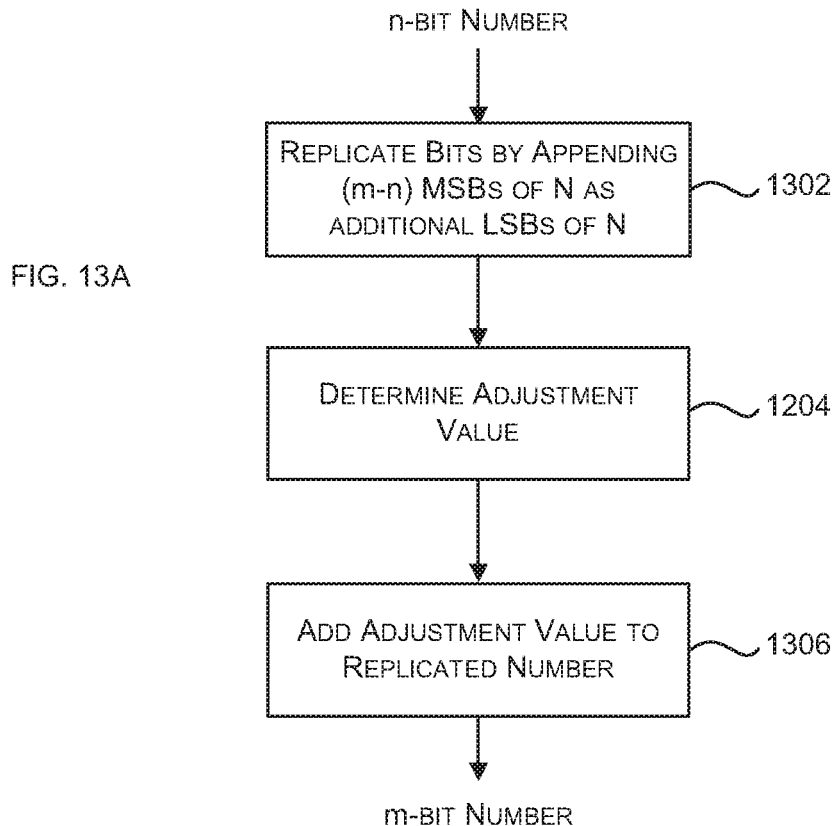
FIG. 13A is a flow diagram of a method of converting an n-bit number to an m-bit number, where n<m.
Figure 13B:
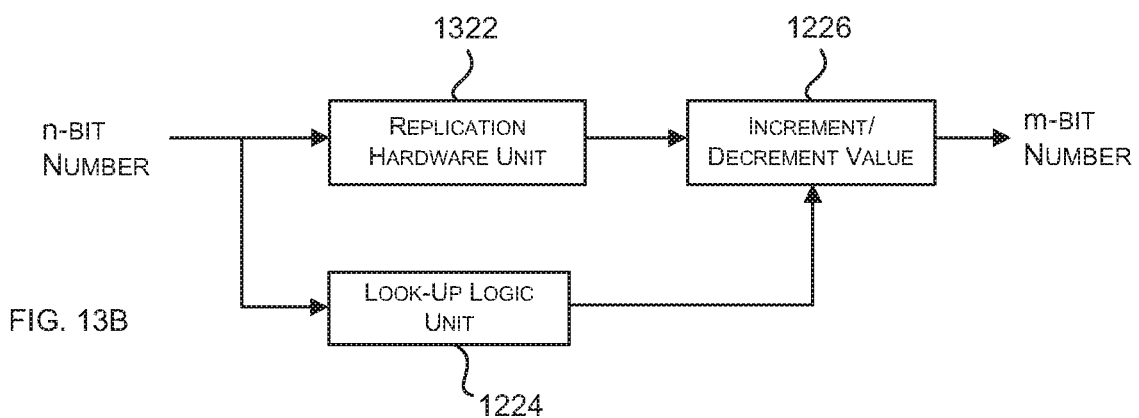
FIG. 13B is a schematic diagram of a hardware implementation of the method of FIG. 13A.
Figure 13C:
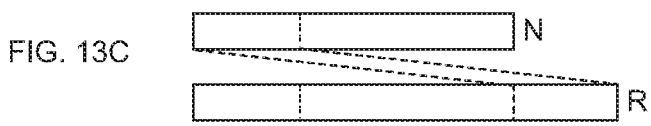
FIGS. 13C and 13D are schematic diagrams illustrating two examples of the method of FIG. 13A.
Figure 13D:
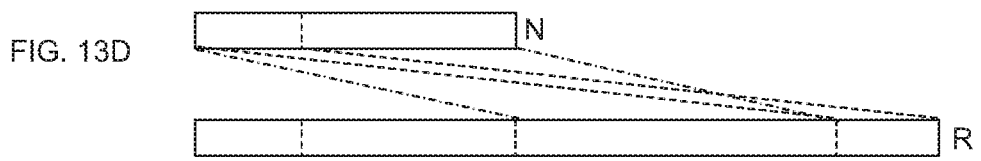

As shown in FIG. 13A, the method comprises receiving an input n-bit number, N, and using bit replication to expand that number from n-bits to m-bits (block 1302) and this may be implemented in the replication hardware unit 1322 in FIG. 13B. This bit replication involves appending the (m−n) MSBs from N to the least significant end of N to generate an intermediate m-bit number, R, as shown in FIG. 13C. If m>2n, then (m−n)>n and hence it is necessary to first append all n-bits (i.e. the entirety of N) at least once (e.g. k times) and then append the (m−kn−n) MSBs from N to form the intermediate m-bit number R, as shown in FIG. 13D. The bit replication operation may alternatively be described as follows: assuming (n≤m) and defining k=⌊(m/n)⌋ and r=m mod n, form a new value, R, comprising, in the MSB position, k repetitions of N, followed, in LSBs, the r MSBs of N.

An adjustment value is then determined (block 1204) based on the input n-bit number, N, and, as described below, this may be implemented using a number of AND and OR gates in the look-up logic unit 1224. These AND and OR logic gates (or alternative logic arrangement that is functionally equivalent) compare a plurality of pre-determined subsets of the bits of N with pre-determined values in fixed-function circuitry and based on the outcome of the comparisons, determine an adjustment value which is then added to the replicated value (from block 1302 and replication hardware unit 1322) in the increment/decrement unit 1226 (block 1306). The value of the adjustment value is either zero, one, or minus one. In some examples, i.e. for some combinations of values of n and m (where n<m), the adjustment value is always zero and hence both the increment/decrement unit 1226 and the look-up logic unit 1224 can be omitted from FIG. 13B.

The operation of the look-up logic unit 1224 to determine the adjustment value (in block 1204) can be described with reference to a specific example where n=5 and m=8 and the following VHDL (or its functional equivalent):

```
function CorrectionsFor5to8(i : std_logic_vector(4 downto 0))
    return std_logic_vector is
    variable results:std_logic_vector(1 downto 0);
begin
    results:=(others=>'0');
    if std_match(i, "00-11") then results:= "01"; end if;
    if std_match(i, "11-00") then results:= results OR "11"; end if;
    return results;
end function CorrectionsFor5to8;
```

In this example, 'std_logic_vector(4 downto 0)' refers to all 5 bits of N (labelled 0-4, with bit 0 being the LSB and bit 4 being the MSB) and the function 'std_match' may be implemented using AND gates, for example, 'std_match(i, "00-11")' may be implemented as follows:

$$\overline{b4} \wedge \overline{b3} \wedge b1 \wedge b0$$

Where by is bit y of N and $\wedge$ represents a logical AND. Similarly 'std_match(i, "11-00")' may be implemented as:

$$b4 \wedge b3 \wedge \overline{b1} \wedge \overline{b0}$$

Furthermore, in this example, the initial value of 'results' is set to the two LSBs (i.e. bits 0 and 1) of N and the final value of 'results' is either set to 01 or 00 or to the initial value of results combined using an OR gate with 11. It is estimated that approximately 7 AND/OR gates are required to implement the look-up logic unit 1224 for n=5 and m=8.

The look-up logic unit 1224 compares pre-determined subsets of the bits of the input n-bit number with pre-determined values in fixed-function circuitry, and sets the adjustment value in dependence on the results of the comparisons. As described above, the use of fixed-function hardware using the AND and OR gates described above allows the hardware to be implemented very efficiently in terms of silicon area, latency and power consumption. The hardware may be configured to perform conversions for a small group of different values for n and m.

Further examples below show how the adjustment value is calculated (in block 1204 and unit 1224) for other values of n and m.

For n=8 and m=4, the following example VHDL shows how the adjustment value is calculated (in block 1204 and unit 1224):

```
function CorrectionsFor8to4(i : std_logic_vector(7 downto 0))
    return std_logic_vector is
    variable results:std_logic_vector(1 downto 0);
begin
    results:=(others=>'0');
    if std_match(i, "00--11--") then results:= "01"; end if;
    if std_match(i, "000-1-1-") then results:= results OR "01"; end if;
    if std_match(i, "0-0-111-") then results:= results OR "01"; end if;
    if std_match(i, "00001--1") then results:= results OR "01"; end if;
    if std_match(i, "0-0011-1") then results:= results OR "01"; end if;
    if std_match(i, "00-01-11") then results:= results OR "01"; end if;
    if std_match(i, "0--01111") then results:= results OR "01"; end if;
    if std_match(i, "1--10000") then results:= results OR "11"; end if;
    if std_match(i, "11-10-00") then results:= results OR "11"; end if;
    if std_match(i, "1-1100-0") then results:= results OR "11"; end if;
    if std_match(i, "11110--0") then results:= results OR "11"; end if;
    if std_match(i, "1-1-000-") then results:= results OR "11"; end if;
    if std_match(i, "111-0-0-") then results:= results OR "11"; end if;
```

```
    if std_match(i, "11--00--") then results:= results OR "11"; end if;
    return results;
end function CorrectionsFor8to4;
```

It is estimated that approximately 41 AND/OR gates are required to implement the look-up logic unit 1224 for n=8 and m=4. In contrast, for n=4 and m=8 only bit replication is required and the adjustment value is zero in all cases.

For n=8 and m=3, the following example VHDL shows how the adjustment value is calculated (in block 1204 and unit 1224):

```
function CorrectionsFor8to3(i : std_logic_vector(7 downto 0))
    return std_logic_vector is
    variable results:std_logic_vector(1 downto 0);
begin
    results:=(others=>'0');
    if std_match(i, "00-11---") then results:= "01"; end if;
    if std_match(i, "0001-1--") then results:= results OR "01"; end if;
    if std_match(i, "0-0111--") then results:= results OR "01"; end if;
    if std_match(i, "0001--11") then results:= results OR "01"; end if;
    if std_match(i, "00-1-111") then results:= results OR "01"; end if;
    if std_match(i, "11-0-000") then results:= results OR "11"; end if;
    if std_match(i, "1110--00") then results:= results OR "11"; end if;
    if std_match(i, "1-1000--") then results:= results OR "11"; end if;
    if std_match(i, "11-00---") then results:= results OR "11"; end if;
    if std_match(i, "1110-0--") then results:= results OR "11"; end if;
    return results;
end function CorrectionsFor8to3;
```

It is estimated that approximately 31 AND/OR gates are required to implement the look-up logic unit 1224 for n=8 and m=3. In contrast, for n=3 and m=8 only bit replication is required and the adjustment value is zero in all cases.

Figure 16:
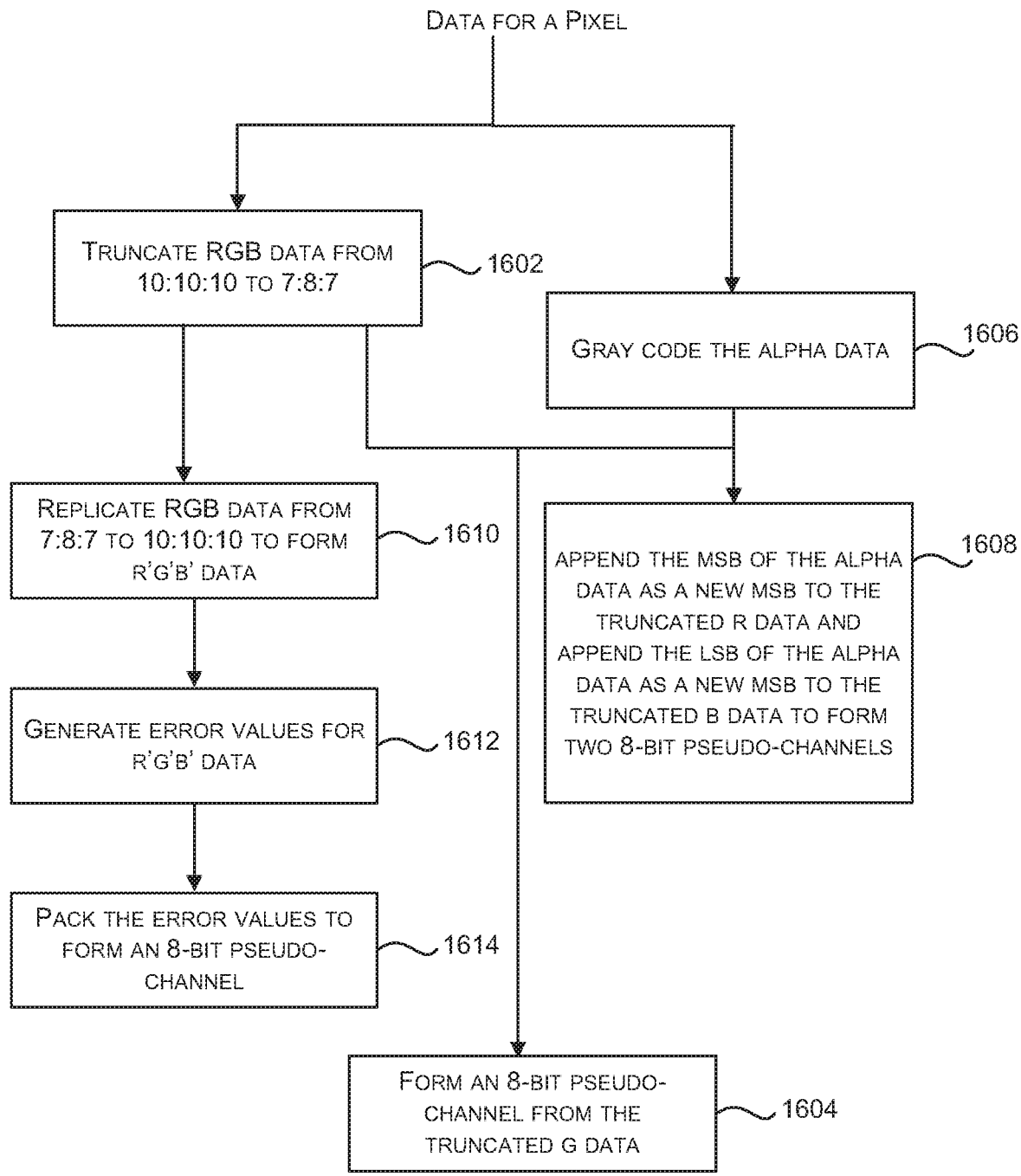
FIG. 16 is a flow diagram of a first example method of converting 10-bit data to 8-bit data.

The compression methods described above with reference to FIGS. 2A-C, 3A and 4-11 take as input, source data in RGBA8888 or RGBX8888 format or in corresponding formats with the channels in a different order (e.g. ARGB). As mentioned above, in examples where the source data is not in this format, a pre-processing step may be used to convert the source data into an appropriate format (e.g. into 888Z where Z is an integer that is not greater than 8). A first example of this pre-processing step can be described with reference to FIG. 14 that converts data values from RGBA10:10:10:2 format to RGBA8883. An alternative technique for pre-processing 10-bit data is described below with reference to FIG. 16. By using one or both of these pre-processing methods, the likelihood that the compression threshold is met (and hence a lossless compression method in the primary compression unit 202 of any of FIGS. 2A-C is used) is increased; although minor modifications are required to the methods performed by the architectures shown in FIGS. 2A-C, as described below. Furthermore, whilst these conversion methods are described herein in terms of a pre-processing step for the compression methods described above, both of the conversion methods may alternatively be used independently of any of the other methods described herein. It will further be appreciated that whilst the compression method implemented by the primary compression unit 202 is itself lossless, if used in combination with the conversion method of FIG. 14 (which is not lossless), the overall data compression method is lossy. The conversion method of FIG. 16 is lossless and so is suited to be used as a pre-processing step for the primary compression unit 202 as the overall method is still lossless; however, if having performed the method of FIG. 16, any bits from the fourth pseudo-channel are discarded, then the overall data compression method becomes lossy.

Figure 14:
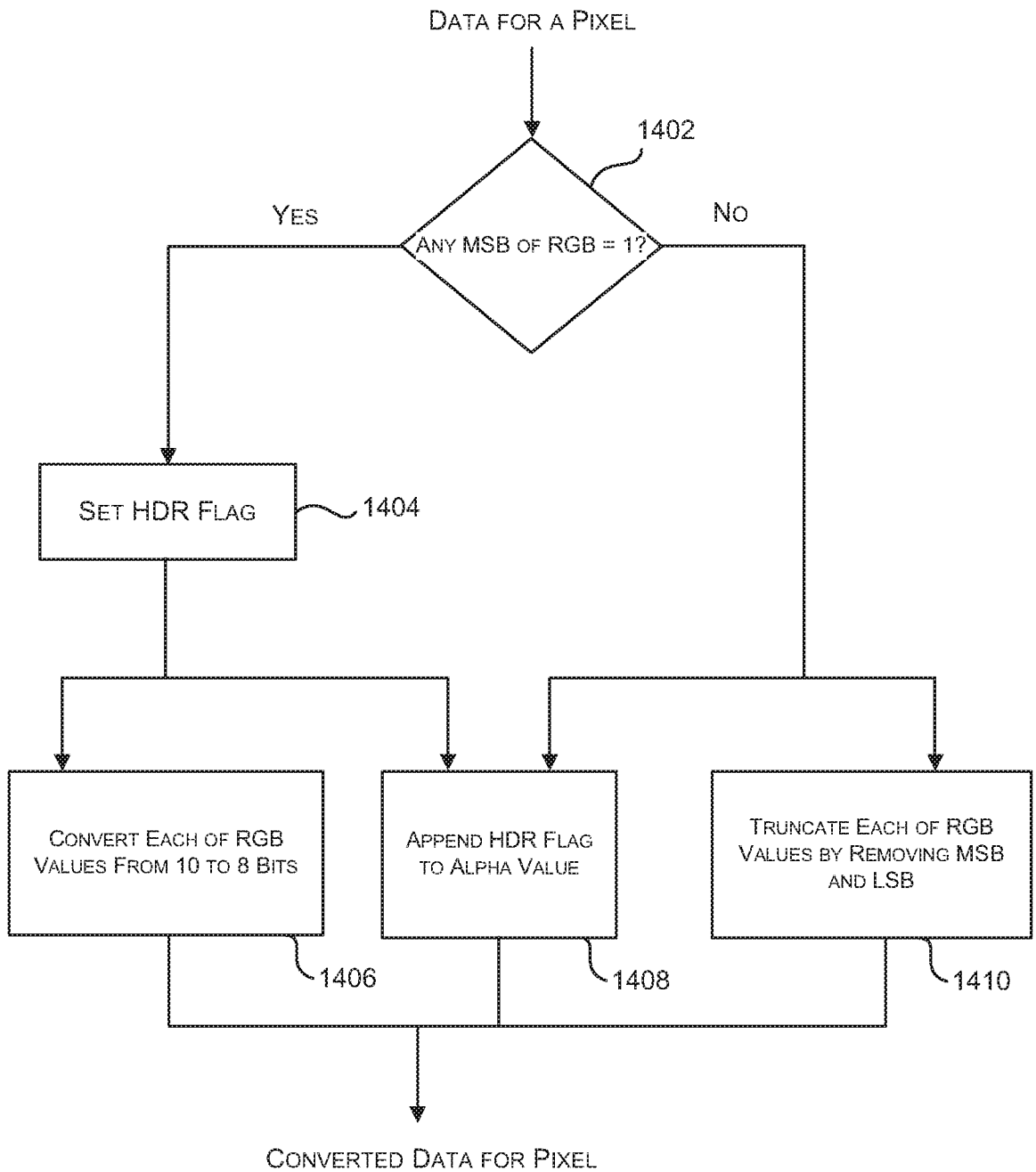
FIG. 14 is a flow diagram of a first example method of converting 10-bit data to 8-bit data.

FIG. 14 shows a flow diagram of a first example method of converting pixel data from RGBA10:10:10:2 format to RGBA8883. As shown in FIG. 14, the MSBs of each of the RGB channels are checked (block 1402) and if one or more of these three MSBs are equal to one ('Yes' in block 1402) then a flag is set (block 1404), otherwise the flag is not set. This flag may be referred to as the high-dynamic-range (HDR) flag because if at least one MSB is equal to one then it is likely that the pixel data is HDR data. HDR images can represent a greater range of luminance levels than non-HDR images and HDR images are typically created by merging multiple low- or standard-dynamic-range (LDR or SDR) photographs or by using a special image sensor. Hybrid log-gamma is an HDR standard that defines a non-linear transfer function in which the lower half of the signal values (this is the SDR part of the range) use an $x^2$ curve and the upper half of the signal values (this is the HDR part of the range) use a logarithmic curve and the reference white level is set to a signal value of 0.5. Of the 10 bits of R/G/B data, the most significant bit indicates whether a value is in the bottom half of the range (the SDR part) or in the top half of the range (the HDR part).

As well as setting the flag or not, the pixel data is reduced from 10-bits to 8-bits in different ways dependent upon whether one or more of the MSBs for the RGB channels is one. If none of the three MSBs are equal to one ('No' in block 1402), then each of the 10-bit values for the RGB channels is truncated by removing both the MSB (which is known to be a zero) and the LSB (block 1410). If any of the three MSBs are equal to one ('Yes' in block 1402), then there are two different ways in which the 10-bit values may be reduced to 8-bits (in block 1406). In a first example, the two LSBs may be removed from each 10-bit value and in a second example, the method as described above with reference to FIGS. 12A-B may be used.

Where the method of FIG. 12A is used, n=10 and m=8 and the following example VHDL shows how the adjustment value is calculated (in block 1204 and unit 1224):

```
function CorrectionsFor10to8(i : std_logic_vector(9 downto 0))
    return std_logic_vector is
    variable results:std_logic_vector(1 downto 0);
begin
    results:=(others=>'0');
    if std_match(i, "00------11") then results:= "01"; end if;
    if std_match(i, "0-00----11") then results:= results OR "01"; end if;
    if std_match(i, "0-0-00--11") then results:= results OR "01"; end if;
    if std_match(i, "0-0-0-0011") then results:= results OR "01"; end if;
    if std_match(i, "1-1-1-1100") then results:= results OR "11"; end if;
    if std_match(i, "1-1-11--00") then results:= results OR "11"; end if;
    if std_match(i, "1-11----00") then results:= results OR "11"; end if;
    if std_match(i, "11------00") then results:= results OR "11"; end if;
    return results;
end function CorrectionsFor10to8;
```

It is estimated that approximately 25 AND/OR gates are required to implement the look-up logic unit 1224 for n=10 and m=8.

To reverse this mapping (e.g. as shown in FIG. 13A), such that n=8 and m=10, the following example VHDL shows how the adjustment value is calculated (in block 1204 and unit 1224):

```
function CorrectionsFor8to10(i : std_logic_vector(7 downto 0))
   return std_logic_vector is
   variable results:std_logic_vector(1 downto 0);
begin
   results:=(others=>'0');
   if std_match(i, "0011----") then results:= "01"; end if;
   if std_match(i, "001-11--") then results:= results OR "01"; end if;
   if std_match(i, "001-1-11") then results:= results OR "01"; end if;
   if std_match(i, "110-0-00") then results:= results OR "11"; end if;
   if std_match(i, "110-00--") then results:= results OR "11"; end if;
   if std_match(i, "1100----") then results:= results OR "11"; end if;
   return results;
end function CorrectionsFor8to10;
```

It is estimated that approximately 19 AND/OR gates are required to implement the look-up logic unit 1224 for n=8 and m=10.

Irrespective of the values of the three MSBs for the RGB channels for the pixel, the 2-bit alpha channel value is modified in the same way. As shown in FIG. 14, the HDR flag is appended to the existing 2-bit value (block 1408), making the output alpha channel value 3-bits.

The method of FIG. 14 may be implemented on a per-pixel basis, although in variations on this method, the decision (in block 1402) that leads to the setting of the HDR block may alternatively be performed less frequently, e.g. on a sub-block or mini-block basis.

As noted above, where the method of FIG. 14 is used as a pre-processing step, the methods implemented in the architectures shown in FIGS. 2A-C may be modified slightly. In particular, the compression threshold used by the test and selection unit 206 (in FIG. 2A) or the test and decision unit 210 (in FIGS. 2B-C) is calculated based on the size of the original data, prior to pre-processing, or alternatively, the threshold may be modified to account for the reduced size of the alpha channel values in the source data (i.e. 3-bits rather than 8-bits). This means, for example, that instead of defining the compression threshold in terms of a ratio, the threshold that is used may be defined in terms of the size of the compressed data block (e.g. 128 bytes) rather than a ratio. Additionally, where the reserve compression unit 204 implements the method described above with reference to FIGS. 3A and 4-11, this lossy compression method is also modified, as described below, as a consequence of the alpha value only comprising 3-bits, one of which is the HDR flag.

In a first variation on the lossy compression method of FIG. 3A, there may be three constant alpha modes that are used (in block 306) along with the variable alpha mode (in block 308). This is because there are only four possible alpha values, A, (instead of the 256 values where alpha is an 8-bit value) and hence the mode can be determined in a less complex manner than described above with reference to FIGS. 5A-B. Each of the constant alpha modes has a different pre-defined value of constalphaval which can be specified by using a different field value that is inserted into the block mode bits 408 (in FIG. 4C) and hence the value of constalphaval does not need to be stored separately (e.g. in fields 670-673 as is the case in the earlier description). As noted below, where the alpha value is zero, this uses the same field value as variable alpha; however as such a block is fully transparent, the RGB may be less important than for other alpha values and in this mode, the data is encoded as if alpha were variable per pixel.

| Field value | Interpretation |
|---|---|
| 0b00 | Constant alpha<br>Fully opaque: A = 0 × 3 |
| 0b01 | Constant alpha<br>Transparent: A = 0 × 2 |
| 0b10 | Constant alpha<br>Transparent: A = 0 × 1 |
| 0b11 | Variable alpha<br>or<br>Constant alpha, fully transparent: A = 0 × 0 |

The constant alpha modes (of block 306) are then implemented using the method of FIG. 11, i.e. using the encoding patterns and three palette colours; however, in this case the palette colours are each represented as RGB676 plus a 1-bit HDR flag and hence block 1112 involves a different conversion to that described above. To perform this conversion, for the G channel, the value is truncated and for the R and B channels, the method described above with reference to FIGS. 12A-B may again be used, with n=8 and m=6, or alternatively the values may simply be truncated.

The adjustment value for n=8 and m=6 may be determined (in block 1204 and look-up logic unit 1224) according to the following example VHDL (or its functional equivalent):

```
function CorrectionsFor8to6(i : std_logic_vector(7 downto 0))
   return std_logic_vector is
   variable results:std_logic_vector(1 downto 0);
begin
   results:=(others=>'0');
   if std_match(i, "00----11") then results:= "01"; end if;
   if std_match(i, "0-00--11") then results:= results OR "01"; end if;
   if std_match(i, "0-0-0011") then results:= results OR "01"; end if;
   if std_match(i, "1-1-1100") then results:= results OR "11"; end if;
   if std_match(i, "1-11--00") then results:= results OR "11"; end if;
   if std_match(i, "11----00") then results:= results OR "11"; end if;
   return results;
end function CorrectionsFor8to6;
```

It is estimated that approximately 19 AND/OR gates are required to implement the look-up logic unit 1224 for n=8 and m=6.

The reverse mapping (e.g. as shown in FIG. 13A), such that n=6 and m=8, may be implemented according to the following example VHDL (or its functional equivalent):

```
function CorrectionsFor6to8(i : std_logic_vector(5 downto 0))
   return std_logic_vector is
   variable results:std_logic_vector(1 downto 0);
begin
   results:=(others=>'0');
   if std_match(i, "0011--") then results:= "01"; end if;
   if std_match(i, "001-11") then results:= results OR "01"; end if;
   if std_match(i, "110-00") then results:= results OR "11"; end if;
   if std_match(i, "1100--") then results:= results OR "11"; end if;
   return results;
end function CorrectionsFor6to8;
```

Furthermore, the four colour mode (in FIG. 11) is modified such that the pixels are represented as RGB554 (instead of RGB555 as in block 602, described above) along with a 1-bit HDR flag. The reduction of bit values from 8-bits to 5-bits or 4-bits may be performed as described above (e.g. with reference to FIGS. 12A-B).

Similar modifications in terms of data format are also made to the variable alpha mode, as described above with reference to FIG. 9. In particular the three palette entries are encoded with a 1-bit HDR flag, 2 alpha bits and RGB665 (in blocks 910-912) and the four colour mode uses a 1-bit HDR flag, 2 alpha bits and RGB444 (in block 916).

Figure 15A:
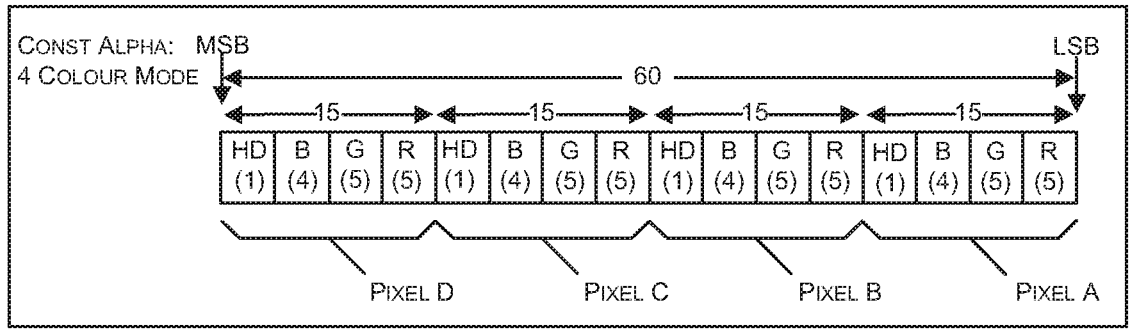
FIGS. 15A, 15B, 15C and 15D are schematic diagrams showing four different ways in which data may be packed into data fields dependent upon whether the methods of FIG. 9 or 11 are used.
Figure 15B:
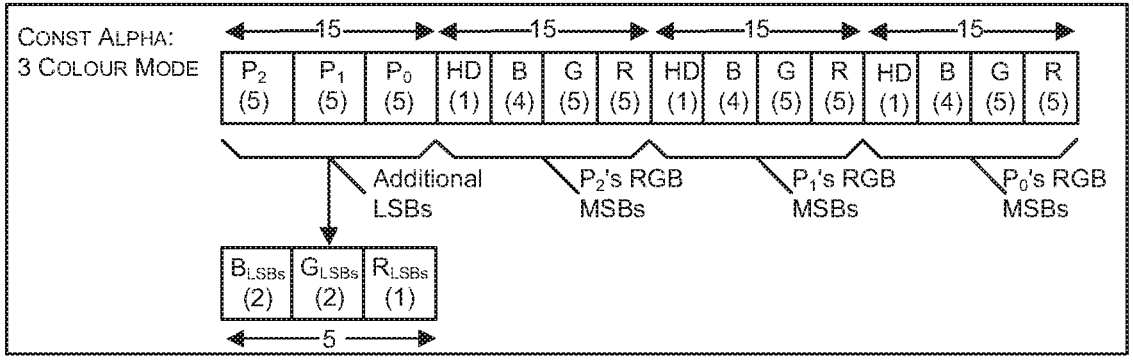
Figure 15C:
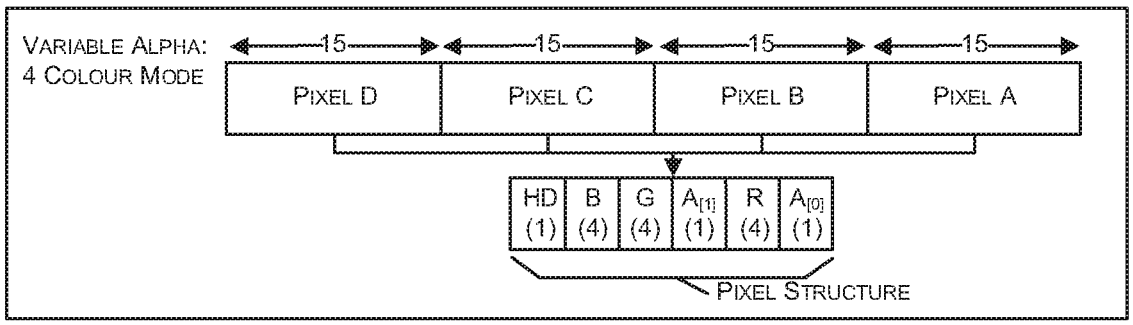
Figure 15D:
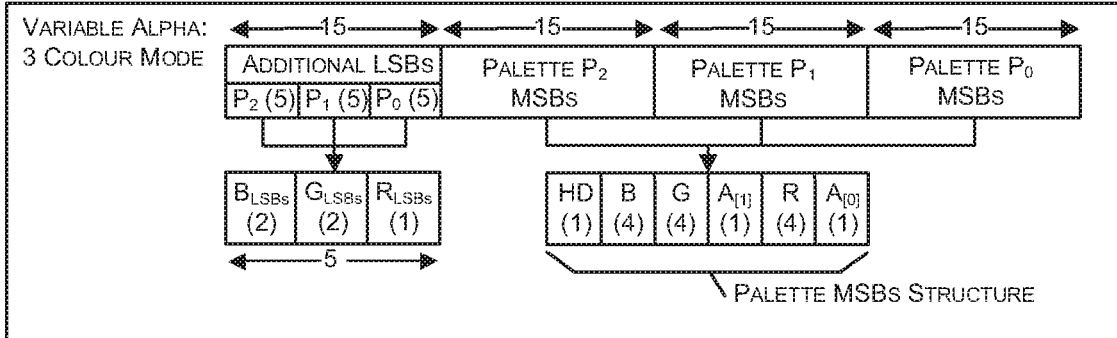

As a consequence of the different data formats used, the data is packed into the data fields (i.e. the 60-bit data fields 660-663 as shown in FIG. 6C) in a slightly different way to that described above and this can be described with reference to FIGS. 15A-D. FIGS. 15A and 15B relate to the constant alpha mode (as packed in block 1114 of FIG. 11) and FIGS. 15C and 15D relate to the variable alpha mode (as packed in block 914 of FIG. 9). FIGS. 15A and 15C show the packing where the four colour mode (of blocks 916 and 602) are used and FIGS. 15B and 15B show the packing where the encoding patterns (of blocks 908-912 and 1112) are used. The packing arrangement shown in FIG. 15C replaces that shown in FIG. 100 and described above. The packing arrangement shown in FIG. 15D replaces that shown in FIG. 10B and described above.

Figure 17:
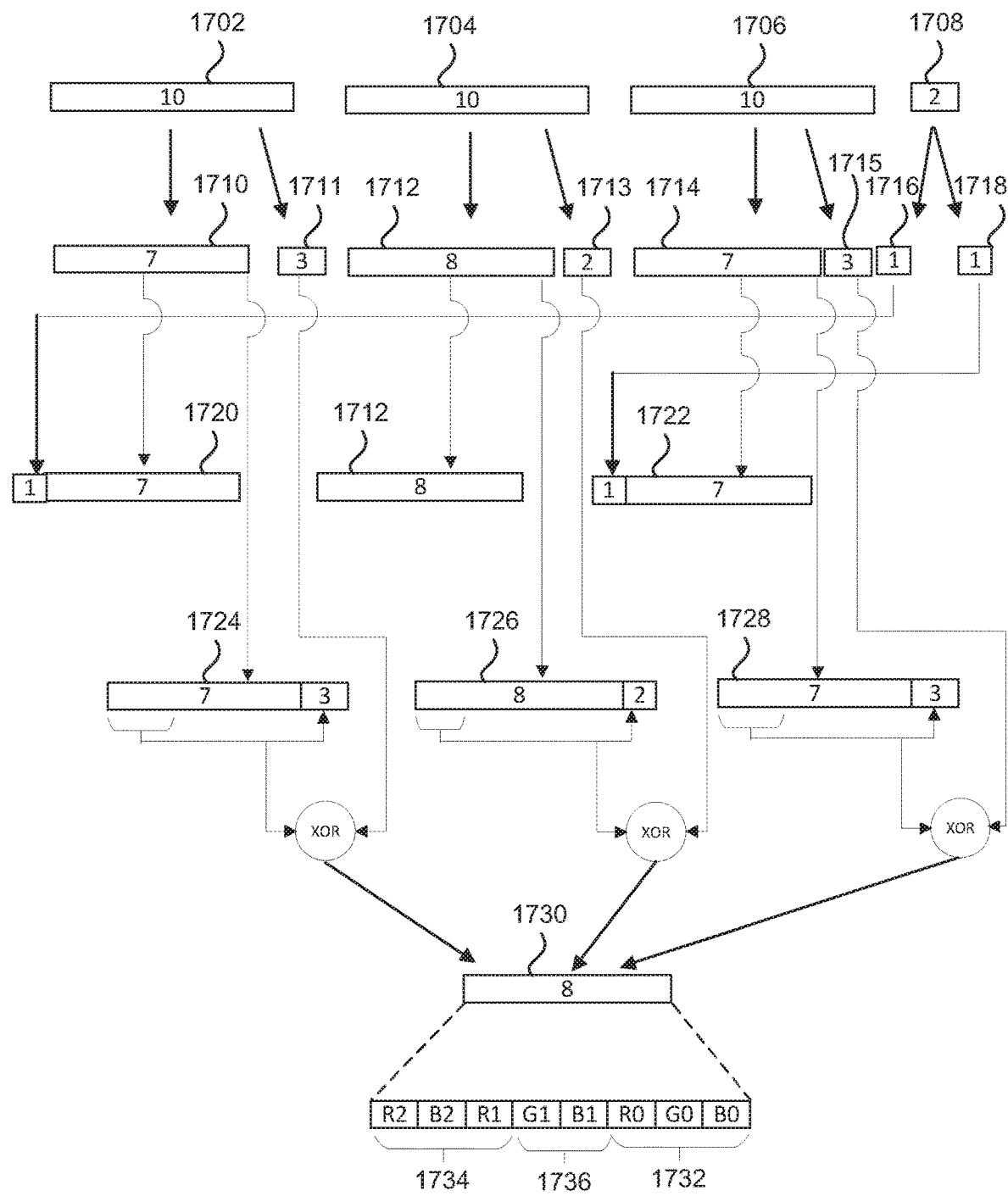
FIG. 17 is a schematic diagram that illustrates the method of FIG. 16.

FIG. 16 shows a flow diagram of a second example method of converting pixel data from 10-bit (e.g. RGBA10: 10:10:2) format to 8-bit format (e.g. 8888 format). This method may, for example, be used as a pre-processing step for RGBA10:10:10:2 format data before it is input to the primary compression unit 202. The method of FIG. 16 can be described with reference to the schematic diagram in FIG. 17. As shown in FIG. 17, the input pixel data comprises four input channels 1702-1708, which are referred to here as RGBA channels although this data may alternatively represent other channels. The output from the method are four 8-bit pseudo-channels.

The RGB input channels 1702-1706 each comprise 10 bits and the A (alpha) input channel 1708 comprises two bits. The RGB channels are each truncated by removing one or more LSBs (block 1602) and in the method shown, the R and B channels are truncated to 7 bits 1710, 1714 by removing three bits from each channel, 1711, 1715 and the G channel is truncated to 8 bits 1712 by removing two bits 1713. The 8-bit channel 1712 formed by truncation of the G channel forms one of four output pseudo-channels (block 1604).

The alpha channel data is optionally Gray coded (block 1606) before one bit 1716 is appended as a new MSB on the truncated R data 1710 to form another one of the four output pseudo-channels 1720 and the other bit 1718 from the (optionally Gray coded) alpha channel data is appended as a new MSB on the truncated B data 1714 to form a further one of the four output pseudo-channels 1722 (block 1608).

The fourth of the four output pseudo-channels 1730 is formed from error values. In one example, to generate the error values, the truncated RGB787 data 1710, 1712, 1714 is replicated so that each channel comprises 10 bits 1724, 1726, 1728 (block 1610). As shown in FIG. 17, this bit replication involves copying the three (for R and B) or two (for G) MSBs and appending them as new LSBs to the truncated data. These new LSBs of the updated 10:10:10 data are then combined with a corresponding number of the original LSBs of the input data channels 1711, 1713, 1715 to generate the error values (block 1612). One way to combine these three or two bit values would be using a subtraction operation (modulo 8 for R and B and modulo 4 for G), as follows:

Red error=(3 new red LSBs−3 LSBs of input red data)mod 8

Green error=(2 new green LSBs−2 LSBs of input green data)mod 4

Blue error=(3 new blue LSBs−3 LSBs of input blue data)mod 8

However, use of an XOR, as shown in FIG. 17, provides a more compact hardware implementation. In other examples, any reversible function may be used. In an alternative example, instead of performing the bit replication of the MSBs as new LSBs to the truncated data, the three (for R and B) and two (for G) MSBs of the truncated RGB787 data may be directly combined with the original LSBs of the input data channels 1711, 1713, 1715 to generate the error values in block 1612. As above, the combination may be through a subtraction, XOR, or any suitable reversible function.

Having generated the three error values (in block 1612), these are packed together to form the fourth pseudo-channel 1730 (block 1614). This may be formed by concatenating the three error values, or alternatively, the bits from the error values may be interleaved such that the three LSBs 1732 of the pseudo-channel 1730 comprise the LSB from each of the three error values, the two MSBs 1734 of the pseudo-channel 1730 comprise the MSB from each of the red and blue error values and the middle three bits 1736 comprise the remaining three bits, one from each of the three error values, as shown in FIG. 17. By using this arrangement of bits in the fourth pseudo-channel 1730, the reduction in image quality that results from the discarding of one or more of these bits (e.g. as described below with reference to FIG. 18A) is minimised. For example, if the 3 LSBs of the fourth pseudo-channel 1730 are discarded, this results in the loss of a single MSB of the error value for each of the RGB channels, rather than the loss of the entire error value for one of the channels (e.g. the B channel).

The following pseudo-code (or its functional equivalent) may be used to implement the method of FIG. 16:
 r'[9:0]:=Replicate(Truncate(r[9:0], 10,7),7,10);
 g'[9:0]:=Replicate(Truncate(g[9:0], 10,8),8,10);
 b'[9:0]:=Replicate(Truncate(b[9:0], 10,7),7,10);
 r_x[2:0]:=r'[2:0] xor r[2:0];
 g_x[1:0]:=g'[1:0] xor g[1:0];
 b_x[2:0]:=b'[2:0] xor b[2:0];
 a'[1:0]:={a[1], a[1] xor a[0]}
 ch0_Red:={a'[0], r'[9:3]}
 ch1_Grn:=g'[9:2]
 ch2_Blu:={a'[1], b'[9:3]}
 ch3_Lsb:={r_x[2], b_x[2], r_x[1], g_x[1], b_x[1], r_x[0], g_x[0], b_x[0]}

Whilst FIGS. 16 and 17 and the pseudo-code above show the bits from the alpha channels being appended as MSBs on the truncated R and B channel data (in block 1608), in other examples the alpha bit may be inserted at different positions (e.g. as an LSB or in the middle of the truncated 7-bit data). However, the data compression that can be achieved, when this method is used in combination with a lossless compression technique, may be improved by positioning the alpha bit as the MSB.

The four 8-bit pseudo-channels 1720, 1712, 1722, 1730 generated using the method of FIG. 16 can then be fed into a data compression method that is designed to operate on RGBX8888 data, such as the lossless compression method implemented by the primary compression unit 202 in FIG. 2.

As described above, use of Gray coding of the alpha channel (block 1606) is optional. By using Gray coding (in which only a single bit changes as the value increments by one), the amount of data compression that can be achieved using a lossless compression method (such as described below with reference to FIGS. 20A-B, 21A-B and 22 and/or in UK Patent Number GB2530312) is increased (e.g. by 1-2%). This is because it reduces the influence the alpha channel, which is often uncorrelated with the R, G or B data, has on both colour and/or spatial decorrelation steps, which are common first (or early) steps in lossless compression. Colour channel decorrelation often uses colour transforms such as:

$$R^*=R-G \bmod 2^8$$

$$G^*=G$$

$$B^*=B-G \bmod 2^8$$

$$A^*=A$$

Where the pre-processing of FIG. 16 has been performed, the pseudo-channels do not correspond to the original colour data and instead the alpha data is combined into the red and blue channels. Where the value of alpha changes, the values of R* and B* can change significantly from one pixel to the next, making the data harder to compress; however, through the use of Gray coding, any single value change affects only R* or B* and not both.

As was the case for the method of FIG. 14, if the method of FIG. 16 is used as a pre-processing step, the methods implemented in the architectures shown in FIGS. 2A-C may be modified slightly. In particular, where the method of FIG. 16 is used as a pre-processing step for the primary compression unit 202, an additional option may be considered by the test and selection unit 206 in FIG. 2A or the test and decision unit 210 in FIG. 2B or 2C. In the methods described above, these test and decision/selection units 206, 210 compare the compressed data generated by the primary compression unit 202 to a compression threshold and if the compression threshold is satisfied, the compressed data generated by the primary compression unit 202 is output. If the threshold is not satisfied, data compressed by the reserve compression unit 204 (or sub-units 204A, 204B) is output instead. Where the pre-processing method of FIG. 16 is used, if the compression threshold is not satisfied by the compressed data generated by the primary compression unit 202, the compressed data may be further reduced in size by discarding all of the data corresponding to the fourth pseudo-channel 1730 (i.e. the pseudo-channel formed from the error values). In such an implementation, the compressed data generated by the reserve compression unit 204 (or sub-units 204A, 204B) is only output if, having discarded the entirety of the data corresponding to the fourth pseudo-channel, the compression threshold is still not satisfied. This reduces the amount of data that is lost in data compression (since the lossy compression method in the reserve compression unit 204 is used less often) and hence improves the quality of the subsequently decompressed data.

Instead of discarding the entirety of the fourth pseudo-channel, the bit prediction technique described below with reference to FIG. 19A, may instead be used to partially discard bits prior to compression. In a further variation, a subset of the bits of the fourth pseudo-channel may be discarded and then the data may be fed back into the primary compression unit 202.

Figure 18A:
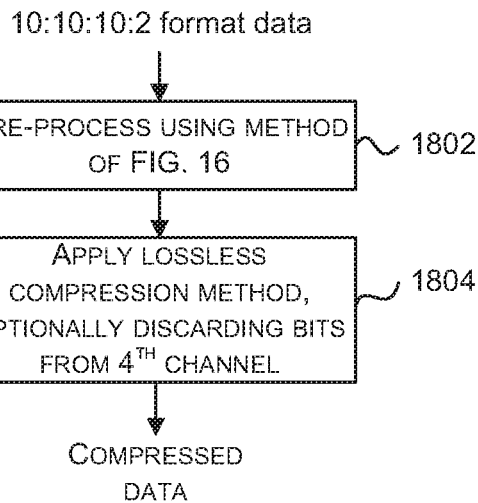
FIG. 18A is a flow diagram of a data compression method which combines the pre-processing method of FIG. 16 with a lossless data compression method.

FIG. 18A shows a flow diagram of a data compression method which combines the pre-processing method of FIG. 16 (block 1802) with a lossless data compression method (block 1804), such as described in GB2530312 and/or below with reference to FIGS. 20A-B, 21A-B and 22. As noted above, some or all of the fourth pseudo-channel may be discarded (in block 1804) to increase the amount of data compression. This discarding may be implemented, as described above, to ensure that a compression threshold is satisfied (as in FIGS. 2A-C) or it may be implemented to improve compression but without any defined threshold or test and decision process. In order that the decompression hardware can operate in the same way irrespective of whether some or all of the fourth pseudo-channel data is discarded (in block 1804), when discarding that data, one or more zeros (e.g. a single byte of data comprising all zeros) or another constant, pre-defined, sequence of bits, may be retained for that channel. Alternatively, a special packing code or other means may be used to indicate to the decompressor that the fourth pseudo-channel data has been discarded. The decompression can then proceed as described below with reference to FIG. 18B.

Figure 18B:
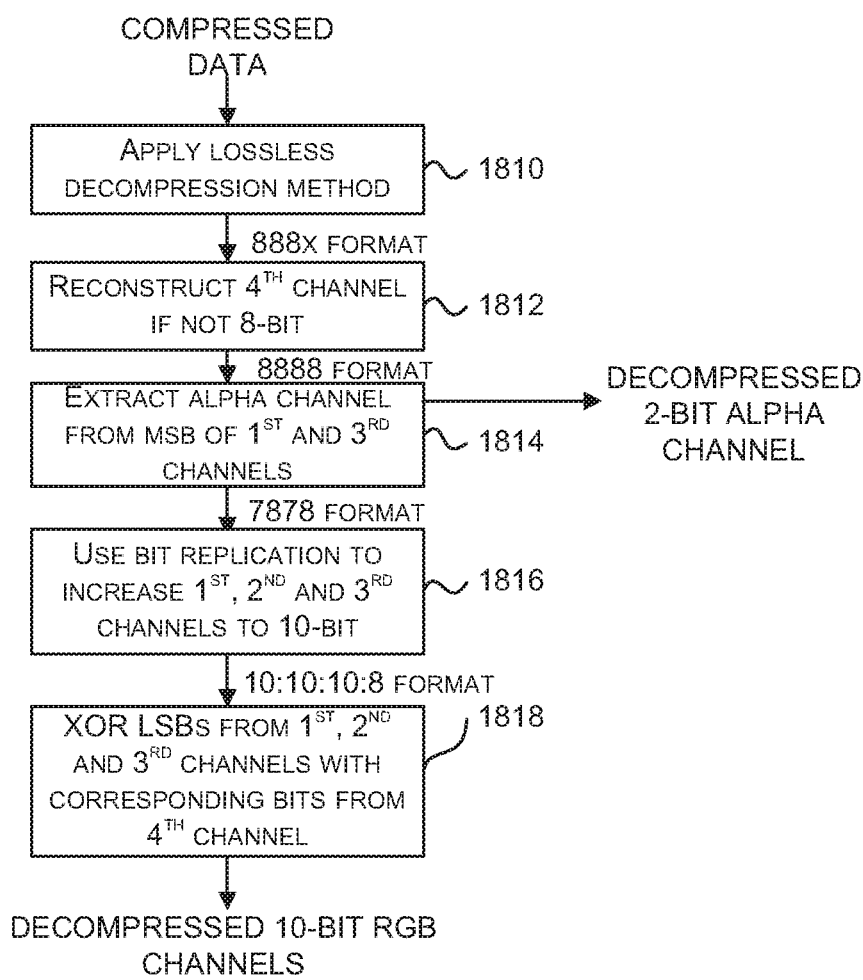
FIG. 18B is a flow diagram of a data decompression method that maybe used where data has been compressed using the method of FIG. 18A.

As shown in FIG. 18B, the compressed data is initially decompressed (block 1810) using the inverse of the lossless compression method used when compressing the data (in block 1802). This operation outputs data in 888X format, as the fourth channel may be 8-bits or fewer, dependent upon how much data was discarded (as described above) and may be totally absent. The fourth channel is then reconstructed such that it comprises 8-bits for the pixel (block 1812) and this may be implemented by adding zeros or another pre-defined sequence of bits. As described above, one or more zeros or the sequence of bits may be present in the compressed data and used in the reconstruction (in block 1812) or alternatively, the reconstruction may proceed based on a known convention without any need for any bits relating to the fourth channel in the compressed data.

The alpha channel data can then be extracted (block 1814) by removing the MSBs from the first and third channels and concatenating them (followed by optional Gray decoding, where this was used in the data compression), leaving 787 format data which is expanded to 10:10:10 format by bit replication (block 1816). The error values from the fourth pseudo-channel are then applied using an inverse of the function used to generate those error values (in block 1612). In the example shown in FIG. 18B, the LSBs from each channel (e.g. 3 bits from the first and third channels and two bits from the second channel) are combined with the corresponding bits from the fourth channel using an XOR logic gate or equivalent logic block (block 1818). Where any bits from the fourth channel were previously discarded, XORing with a zero will not change the value of the LSB. In examples where a pre-defined sequence of bits is used in the reconstruction that does not comprise all zeros, an alternative function may be used both to generate the error values when compressing the data (in block 1612) and to apply the error values when decompressing the data (in block 1818).

In an example implementation, both the pre-processing methods of FIGS. 14 and 16 may be used. In such an example, the pre-processing method shown in FIG. 14 and described above may be used to pre-process RGBA10:10:10:2 format data before it is input to the reserve compression unit 204 or may be implemented prior to or by the initial reserve compression sub-unit 204A. The pre-processing method shown in FIG. 16 and described above may be used to pre-process RGBA10:10:10:2 format data before it is input to the primary compression unit 202.

The methods described above are described with reference to RGBA or RGBX data but as noted above, the methods may also be used with data other than image data, where three of the four channels (e.g. the RGB channels above) are correlated across channels in some way (e.g. colour or spatially correlated). For some types of data, such as YUV or YCbCr data (where YCbCr data is digital luma and two chroma components and YUV is its analogue counterpart, although it may also be used to mean YCbCr) which are frequently arranged in two or three planar formats (e.g. dependent upon whether the U and V data is separate or interleaved), there may be little or no correlation across channels within a data block, as the channels are often assembled by gathering disjoint, albeit adjacent, single- or dual-channel pixel blocks e.g. multiple tiles of only Y, only U or only V or only UV are packed as the channels of the block. As a consequence, whilst the compression methods described above can be used, and despite that the palette modes of the lossy compression method (e.g. as described above with reference to blocks 908-912 of FIG. 9) work well where the data has strong spatial correlation as well as good correlation between channels, they do not work well for YUV or YCbCr data (or other uncorrelated data types) as it is difficult to predict a value from its neighbours and therefore it relies too heavily on the four colour mode (block 916 of FIG. 9).

Figure 19A:
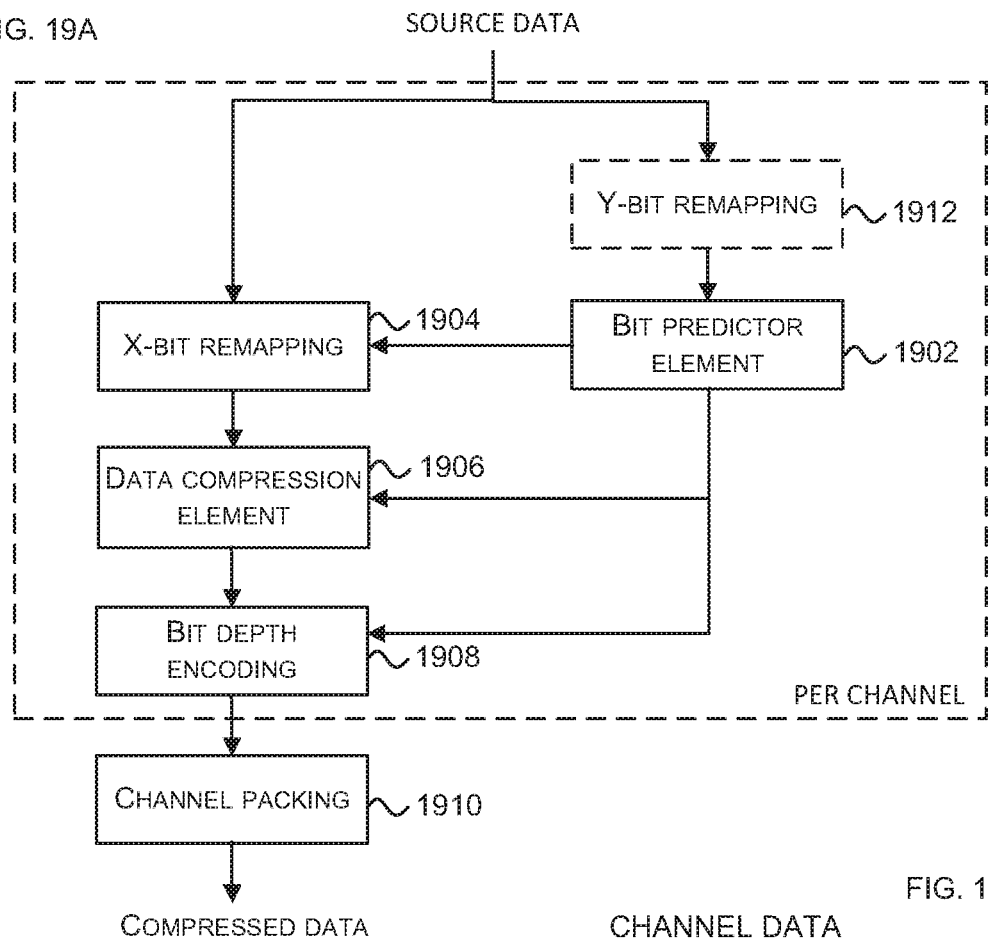
FIG. 19A is a schematic diagram of a further example data compression unit.

FIG. 19A is a schematic diagram of a data compression unit which increases the amount of compression that is achieved compared to a primary compression unit 202 that implements only a lossless compression method such as the method described in UK Patent Number GB2530312 or the method described below with reference to FIGS. 20A-B, 21A-B and 22. This data compression unit shown in FIG. 19A may be used as the primary compression unit 202 in the architectures of any of FIGS. 2A-C, particularly where the input data is not correlated across channels and therefore cannot greatly benefit from colour decorrelation or colour palettes. Furthermore, as the data compression unit of FIG. 19A may operate separately on each channel, it may be implemented within the primary compression unit 202 for only a subset of the channels (e.g. for the alpha channel or the fourth pseudo-channel created using the method of FIG. 16) whilst the remaining channels are compressed using a lossless compression method such as the method described in UK Patent Number GB2530312 or the method described below with reference to FIGS. 20A-B, 21A-B and 22. In examples where the data compression unit of FIG. 19 is used as the primary compression unit 202 in the architectures of any of FIGS. 2A-C, there is less reliance upon the reserve compression unit 204 which may involve more severe quantisation and hence result in a larger reduction in image quality.

The data compression unit shown in FIG. 19A may alternatively be used separately from the architectures shown in FIGS. 2A-C, i.e. without any test and selection/decision unit 206, 210 or reserve compression unit 206 and where there is no need to guarantee that a compression threshold is met. Instead, by using the data compression unit shown in FIG. 19A, the amount of data compression achieved overall may be increased and a particular compression ratio may be targeted. The data compression unit shown in FIG. 19A may also be used with compression methods other than those described in UK Patent Number GB2530312 or the method described below with reference to FIGS. 20A-B, 21A-B and 22 and/or for compression of data other than image data (e.g. for any data that has a compression algorithm as well as multiple levels of quantisation, where further quantisation improves the efficiency of the compression algorithm).

As shown in FIG. 19A, source data block (which for the purposes of the following description is assumed to be in 8888 format) is split up and each channel may be considered separately (as indicated by the dotted box in FIG. 19A). Alternatively, two or more channels (or any subset of the channels) may be considered together (and in this case, the total size that is determined relates to all channels being considered together). For example, RGB data may be considered together, with a single level of quantisation (i.e. a single mapping parameter) being chosen uniformly across the three colour channels. The following description refers to consideration of each channel separately by way of example only.

The data for a single channel is input to both a bit predictor element 1902 and an x-bit remapping element 1904. The operation of the x-bit remapping element is controlled based on an input from the bit predictor element 1902, referred to as the mapping parameter. This mapping parameter specifies a data conversion or truncation operation that is performed by the x-bit remapping element 1904 and in particular, this mapping parameter specifies the value x. By selecting a lower value of x, the amount of data compression that is achieved is increased, however, the accuracy is reduced since the remapping is a lossy operation. The data conversion operation that is performed by the x-bit remapping element 1904 may also include operations such as low pass filtering where the mapping parameter, x, determines how heavily filtered the data is.

Figure 19B:
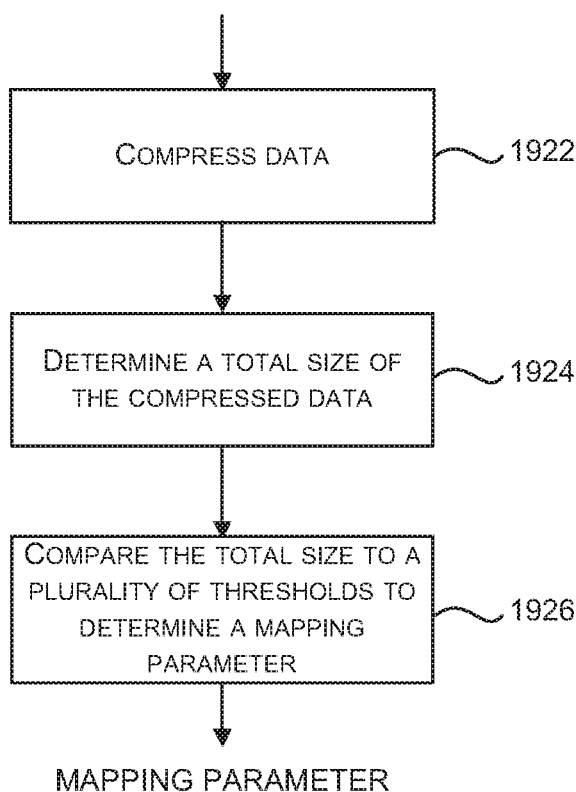
FIG. 19B is a flow diagram of a method of operation of the bit predictor element in the data compression unit shown in FIG. 19A.

The operation of the bit predictor element 1902 is shown in FIG. 19B. The bit predictor element 1902 takes the data for the channel (e.g. 8-bits per pixel for each pixel in the data block), compresses it using the same data compression method used in the data compression element 1906 (block 1922), however, some operations of the data compression method may be omitted (e.g. those operations after entropy encoding). For example, the bit predictor element 1902 may not pack the compressed data into a compressed data block but may instead just determine the total size of the compressed data (block 1924). This total size is then compared to a plurality of thresholds (e.g. $A_y$, $B_y$, $C_y$, $D_y$) which may, for example, be stored in a look-up table, and based on the comparisons, a mapping parameter (i.e. a level of quantisation and hence a value of x) is determined (block 1926) and output.

In examples where the data compression within the bit predictor element 1902 is performed using a lossless compression method such as the method described in UK Patent Number GB2530312 or the method described below with reference to FIGS. 20A-B, 21A-B and 22, the bit predictor element 1902 may compress the data (in block 1922) using wavelet transformation, sign remapping and group length generation; however, group length codes, packing mode codes and the actual packing of data may be omitted as they are not needed in order to generate the size of the compressed block. In such examples, the total size of the compressed data for the channel may be given by the size of the variable length data of the channel (see the description of FIGS. 20A-B, 21A-B and 22 below). This size may be calculated by summing four times the coefficient length for each group (which comprises a 2×2 set of values) other than the top-left. The group sizes may be determined by combining neighbouring values into groups of four and then the number of bits required to encode the largest of these is used as the group bit-depth and is encoded in the block. The size of the group is then four times this bit-depth. The top left group is treated differently as the reference value is always stored at full precision and its size may be determined from a look-up table. In other examples, any suitable data compression method may be used within the bit predictor element 1902 and the data compression element 1906.

The comparison to the plurality of thresholds (in block 1926) may, for example, be implemented as set out in the following pseudo-code (or its functional equivalent), where Chan Size is the total size of the compressed data for the channel:

| If | (Chan Size ≤ $A_Y$) | x = 8 |
|---|---|---|
| Else if | (Chan Size ≤ $B_Y$) | x = 7 |
| Else if | (Chan Size ≤ $C_Y$) | x = 6 |
| Else if | (Chan Size ≤ $D_Y$) | x = 5 |
| Else | | x = 4 | and in various examples, a look-up table may be used. The pseudo-code (or look-up table) comprises at least two rows but may comprise many more rows. Furthermore, whilst the value of x is described herein as referring to an actual bit depth, in other examples the mapping parameter, x, may correspond to a set of different quantisations.

The values of each of the plurality of thresholds (e.g. $A_Y$, $B_Y$, $C_Y$, $D_Y$) used by the bit predictor element 1902 may be determined by compressing a large training set of images multiple times using different configurations of thresholds and analysing the resultant sizes of the compressed data, or the score of an image quality metric for a given target compression ratio. The thresholds may be set to achieve a particular compression threshold or target compression ratio or may be calibrated to minimise certain artefacts of loss compression such as block artefacts or banding. The thresholds may also be set such that only those blocks that do not compress well are quantised.

Having determined the mapping parameter (i.e. value of x) in the bit predictor element 1902, the x-bit remapping element 1904 converts the input data from its original format, which may be 8-bits per pixel to x-bits per pixel, where x is the mapping parameter. This conversion may, for example, use truncation or may alternatively use the method described above with reference to FIGS. 12A-B. As described above, in other examples, the mapping parameter may correspond to a set of different quantisations rather than an actual bit depth and in such examples, the remapping element 1904 converts the input data based on the mapping parameter. In other examples, the bit depth might not be altered but instead, the information content may be reduced by low pass filtering, under the control of the mapping parameter, x. Alternatively, a combination of both filtering and bit precision reduction may be employed.

The data that is generated by the x-bit remapping element 1904 is input to the data compression element 1906 that then compresses the data using a data compression method, such as the lossless compression method described in UK Patent Number GB2530312 or the method described below with reference to FIGS. 20A-B, 21A-B and 22. It will be appreciated that whilst this method may be described as lossless and may be lossless based on the data input to the data compression element 1906, the resultant compressed data is not lossless with reference to the source data, since the conversion performed by the x-bit mapping element 1904 may be lossy.

Figure 19C:
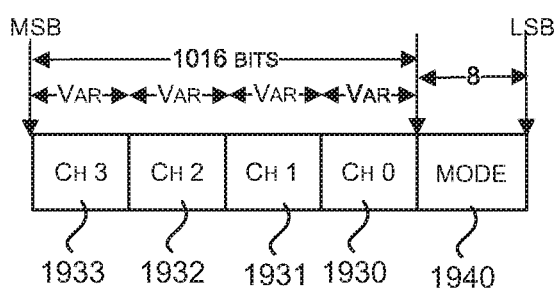
FIG. 19C is a schematic diagram showing an example way in which data may be packed into a compressed data block where the method of FIG. 19A is used.
Figure 20A:
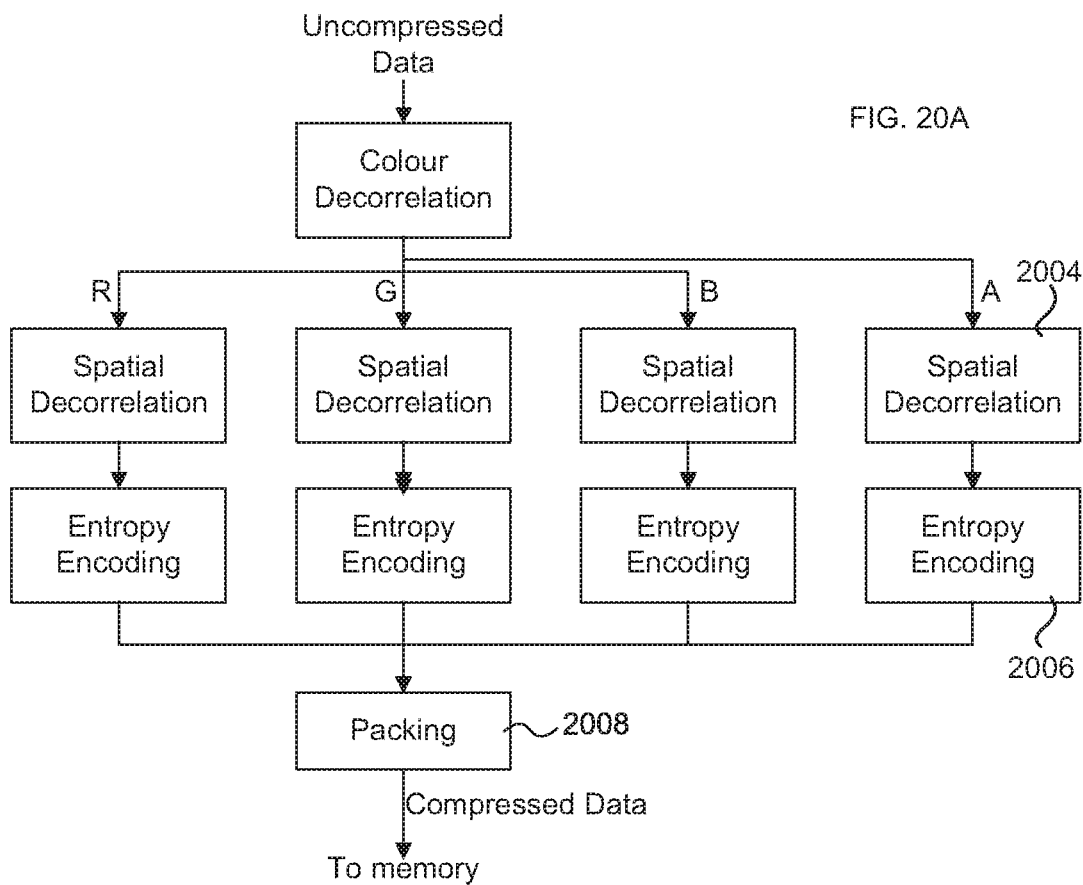
FIG. 20A shows a schematic diagram of another data compression unit.
Figure 20B:
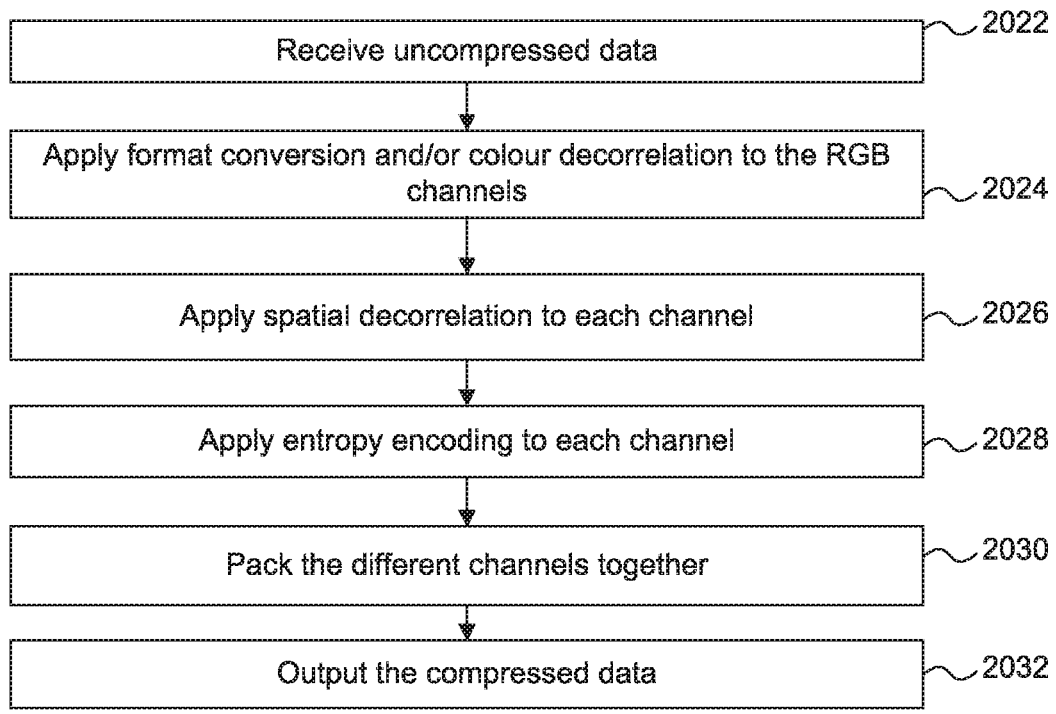
FIG. 20B is a flow diagram of a method of lossless data compression.

In order that the data can subsequently be decompressed, it is necessary to include the value of x the compressed data in some way, so that the correct inverse mapping may be used. FIG. 19C shows an example of the way in which data for the four channels may be packed into a compressed data block (in block 1910). As shown in FIG. 19C, the size of the data for each channel 1930-1933 may be different where the data compression method includes entropy encoding. The 8-bit mode field 1940 comprises a 2-bit packing mode for each channel. One of the possible packing modes may be used to indicate that x<8; however, given the available number of bits, it may not be possible to include the value of x for the channel in the packing mode without increasing the size of the mode field 1940. Consequently, the bit depth encoding element 1908 may encode the value of x (where it is less than 8) in the data generated by the data compression element 1906. For example, the value of x may be encoded within the reference value field of the compressed channel, e.g. by changing the least significant unused bit from 0 to 1, i.e. a unary encoding. As described below with reference to FIGS. 20A-B, 21A-B and 22, the reference value is a data value which is not entropy encoded but is included in a specified reference value field of the encoded data (as generated by the data compression element 1906). This reference value may, for example, be modified to encode the value of x as follows (where '0b' is a binary value indicator and e,f,g,h,i,j,k are used to identify bits that are used to encode the reference value):

| x | Original value | Encoding |
|---|---|---|
| 7 | 0b0efghijk | 0b1efghijk |
| 6 | 0b00fghijk | 0b01fghijk |
| 5 | 0b000ghijk | 0b001ghijk |
| 4 | 0b0000hijk | 0b0001hijk |

If the compressed data has no redundancy that can be exploited, then the value x may instead be packed alongside the compressed data, e.g. occupying a header byte. This can be read at the point of decompression to determine which inverse mapping to perform after decompressing the block in order to map the data back up to its original precision.

FIG. 19A also shows an optional y-bit remapping element 1912. This may be used to reduce the number of bits per pixel in the source data for the channels that are used by the bit predictor element 1902. The y-bit remapping element 1912 may use truncation or the method described above with reference to FIGS. 12A-B to reduce the bit depth of the source data. The bit depth, i.e. the value of y, may be a value between 4 and 8, where y=8 provides the most accurate predictions (i.e. in terms of selecting a value of x to satisfy an overall compression threshold or target) but is most expensive in terms of operations performed by the bit predictor element 1912. A value of y=4 provides the least accurate predictions but is least expensive in terms of hardware and operations implemented by the bit predictor element 1902. Similar to the value x, the value y may correspond to some other kind of quantisation, e.g. a low pass filter. By removing noise from the data the accuracy of the predictor's result can be improved, and can be less susceptible to change due to small perturbations in the original data.

It will be appreciated that whilst the description of FIGS. 19A-C above refer to source data comprising 8-bits per pixel per channel, the methods may also be used where there are more or fewer bits per pixel per channel, e.g. 10, and this may result in more or fewer thresholds being used (in block 1926).

In examples where the source data is 10-bit data, rather than 8888 data, the data compression unit may include an additional pre-processing element, not shown in FIG. 19A. This pre-processing element may perform a data conversion similar to that described above with reference to FIGS. 16 and 17. The 10-bit values are truncated and then expanded back to 10-bit values using bit replication, thereby generating new LSBs and error values are generated by XORing the LSBs of each original 10-bit value with the new LSBs of the corresponding truncated expanded value. The 8 MSBs of three tiles (which correspond to three input channels) form the first, second and third pseudo-channels whilst the error values are packed into the fourth pseudo-channel as described above and shown in FIG. 17. One set of thresholds is then used in the bit predictor element 1902 for the first three pseudo-channels and these thresholds may be different from those used for 8888 data. A second set of thresholds (which also may be different from those used for 8888 data) is used for the fourth pseudo-channel and the quantisation options may be reduced, e.g. to 6 and 3 bits only. Where the data compression unit of FIG. 19A is used as the primary data compression unit 202 in any of the architectures of FIGS. 2A-C, the test and selection/decision units also operate differently. It is initially checked whether all four pseudo-channels fit within the target size, in which case they are included. If they do not all fit, it is checked whether the first three pseudo-channels fit with a single additional byte, and if so the fourth pseudo-channel is replaced by a constant zero channel (occupying a single byte). If this test still does not satisfy the target compression threshold, then the output from the reserve compression unit is used. The data can subsequently be decompressed using a modified version of the method described above with reference to FIG. 18B.

In examples where the data compression unit shown in FIG. 19A targets a particular compression rate (e.g. 50%) and uses the lossless compression method described in UK Patent Number GB2530312 or the method described below with reference to FIGS. 20A-B, 21A-B and 22, the RAW mode of the compression method may be modified to store data at a different precision, e.g. 4 bits rather than 8 bits.

The data compression unit shown in FIG. 19A is a versatile unit that is able to compress multiple types of data, e.g. YUV, RGB(A), non-image data, etc. It is applicable to various combinations of quantisation/lossy compression and can be used to improve compression rates or target a specific compression ratio. The thresholds that are used may be calibrated to produce desired properties, such as minimising block artefacts or banding or to optimise a given metric score, and the thresholds may be set conservatively, so as to minimise use of a reserve compression unit that performs lossy compression (where provided). The data compression unit is also very configurable and the cost/complexity of the bit predictor element 1902 can be traded off against accuracy and performance of the data compression. Additionally it is very scalable and may, for example, be applied only to subsets of the data, e.g. the alpha channel only.

A first example of a lossless compression method which may be implemented in the primary compression unit 202 (shown in FIGS. 2A-C and described above) and within the data compression unit shown in FIG. 19A (e.g. within both the bit predictor element 1902 and data compression element 1906 is described in UK patent number 2530312. UK patent number 2530312 describes a data compression system in which 8×8 blocks of image data are compressed by performing colour decorrelation, spatial decorrelation and entropy encoding, and then packing the resulting encoded data values into data packets for storage. In the system described in that patent, a row of data values from a block is processed per iteration. A modified version of Exponential Golomb coding is used for the entropy encoding wherein each coefficient stored a prefix to indicate a range of values that were then identified by a suffix. Having a prefix and suffix for each encoded coefficient makes decoding multiple values simultaneously difficult because it is not simple to quickly determine the positions of the boundaries between encoded bits.

A second example of a lossless compression method which may be implemented in the primary compression unit 202 (shown in FIGS. 2A-C and described above) can be described with reference to FIGS. 20A-B, 21A-B and 22. As described in UK patent number 2530312 and shown in FIGS. 20A-B, data compression may comprise the following steps (not necessarily in this order): division into blocks, format conversion (block 2024), colour channel decorrelation (block 2024, e.g. as described above), spatial decorrelation (block 2026), entropy encoding (block 2028) and then storage.

The entropy encoding (in block 2028) is performed according to a variable-length coding (VLC) scheme, such that the entropy encoded values will most likely not all have the same number of bits. In general, more probable values are encoded with fewer bits. In this way, it is likely that the total number of bits used to encode all of the data values in a data block will be reduced by the entropy encoding. There are some situations where spatial decorrelation can expand data, and these situations can be treated as special cases (i.e. the data is treated differently to other cases) in order to limit the expansion.

VLC encoding can be reasonably straightforward to perform at a high rate, but VLC decoding at a matching rate can be significantly more difficult because the bit-boundaries between contiguously stored encoded data values are not known until the encoded data is analysed, i.e. the length of the encoded data values is not known until the encoded data is analysed. In particular, when encoding, multiple symbols can be mapped independently to their corresponding codes and code lengths, and then merged into a contiguous output bit stream. However, typically when decoding, each code in the encoded bit stream is examined sequentially in order to determine its length which, in turn, determines the location of the start of the next code. In other words, the bit-boundaries between the different encoded data values need to be found.

In this second example method, entropy encoding is performed on sets of data values (e.g. 2×2 sets of data values). For each set of data values an indication is included in an encoded output (e.g. in a header section thereof) to indicate how many bits are used for each of the encoded data values representing the set of data values. The encoded data values are then included in the encoded output in accordance with the indicated numbers of bits. This system means that the decoding of the encoded data values is simplified (compared to the system of UK patent number 2530312) because a simple read of the indications (e.g. in the header) allows the bit boundaries between different encoded data values to be determined. In other words the indications allow the sizes of the corresponding encoded data sections to be quickly determined (e.g. in just a single clock cycle). This is described below in more detail with reference to FIGS. 21A-B and 22.

Figures 21A, 21B:
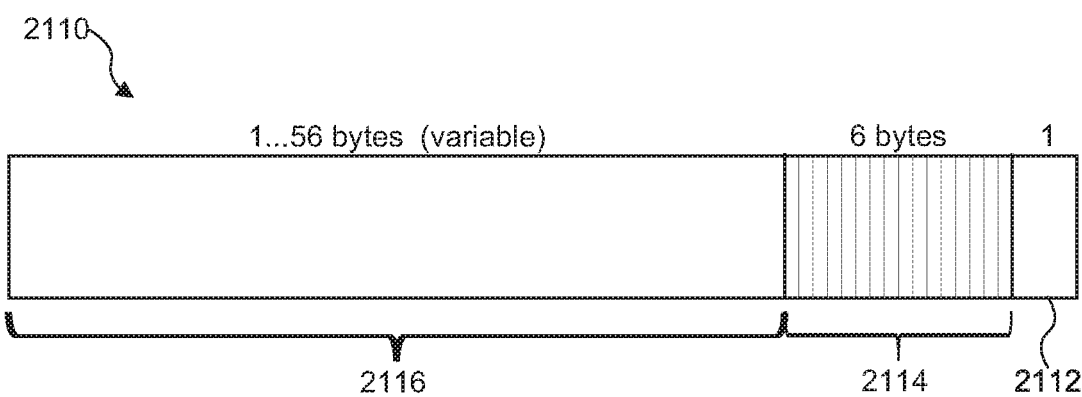
FIG. 21A is a schematic diagram of a block of data that has been spatially decorrelated and remapped using the hardware of FIG. 20A.
FIG. 21B is a schematic diagram showing an encoded data output from the method of FIG. 22.
Figure 22:
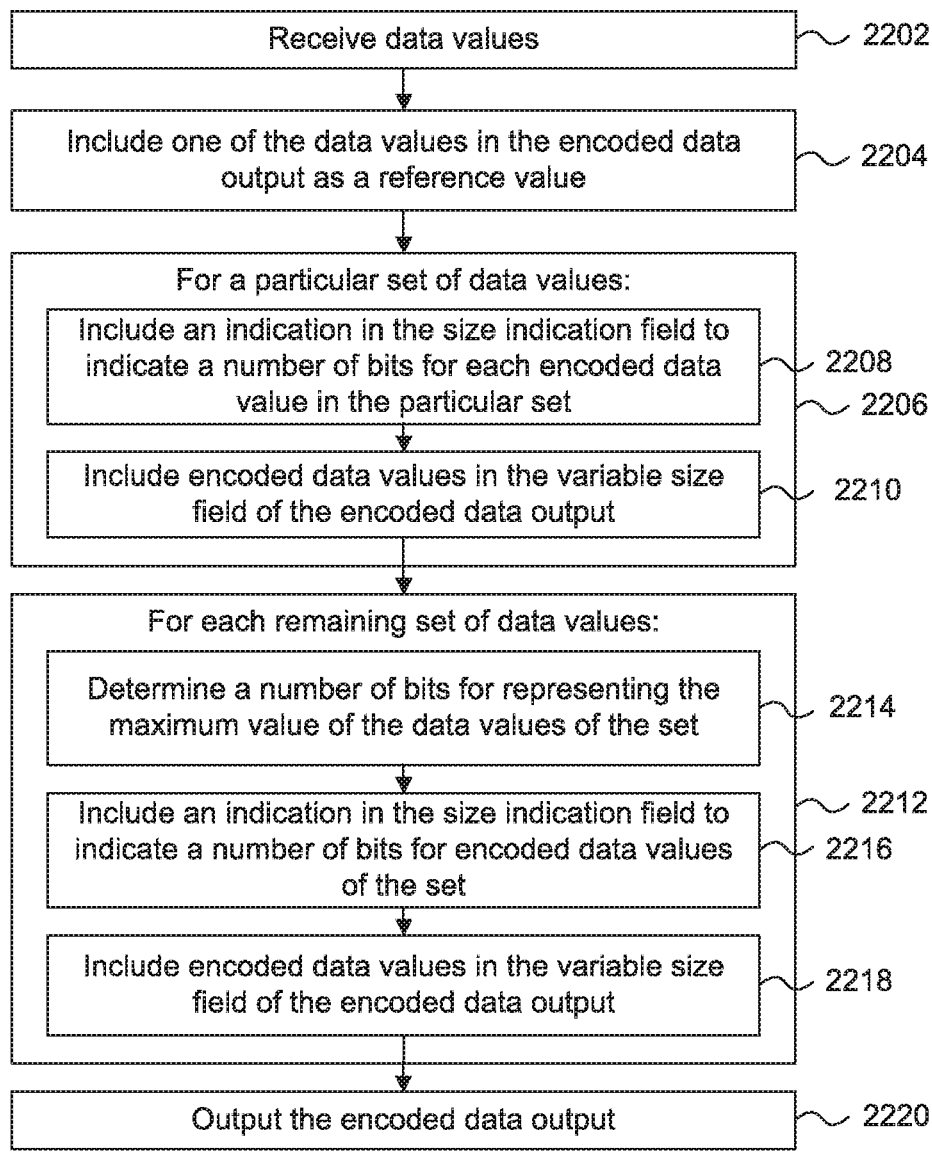
FIG. 22 is a flow diagram showing a method of entropy encoding.

FIG. 21A shows an 8×8 block of data values 2100 which have been spatially decorrelated and remapped by one of the spatial decorrelating modules 2004. The data values relate to respective pixel values. A method of performing entropy encoding on the block of data values at an entropy encoding module 2006 is described with reference to the flow chart shown in FIG. 22. The entropy encoding module 2006 outputs an encoded data output 2110 (as shown in FIG. 21B)

which comprises encoded data values to represent the data values in the 8×8 block 2100. The encoded data output 2110 has a variable length depending on the compression that can be achieved by the entropy encoding process. In particular, in an example in which each received data value in the block 2100 comprises 8 bits (i.e. 1 byte), the encoded data output 2110 comprises a reference value field 2112 which is 8 bits (1 byte) wide, a size indication field 2114 which is 48 bits (6 bytes) wide, and a variable size field which, in this example has been configured to maintain 8-bit alignment of fields, is anywhere between 8 bits (1 byte) and 448 bits (56 bytes) wide. If the entropy encoding process is not able to losslessly represent the data values in the data block 2100 without exceeding the number of bits available in the encoded data output 2110 (i.e. 504 bits or 63 bytes) then the data values in the data block 2100 are stored in raw form in the encoded data output, with 8 bits per data value. A header section of a data packet in which the encoded data output is placed has an indication to indicate the format of the encoded data within the data packet. For example, the indication may comprise two bits such that up to four different encoding modes can be set, which may include a raw data format, an entropy encoded format and a constant format (in which all of the data values within a block have the same value, such that the value can be stored once (using 8 bits) to represent the value of each of the data values within the block.

The block of data values is received at an entropy encoding module 2006 (block 2202). The rows and columns of the block are arranged as shown in FIG. 21A. The block of data values 2100 comprises a plurality of sets of data values (most of which in this example are 2×2 sets of data values (relating to 2×2 sets of pixel values), but in other examples, the sets could be different shapes and/or sizes). The block 2100 comprises fifteen 2×2 sets of data values, and one particular set (in the top left of the block) which comprises just three data values. The top left data value (AO) is not entropy encoded, and instead the data value at position AO is included in the reference value field 2112 of the encoded data output 2110 (block 2204). Since the top left set represents a similar sized set compared to the other sets in the block, but minus the data value which is to be used as the reference value, the top left set includes fewer (e.g. 3 rather than 4) data values than each of the other sets.

In the example shown in FIG. 21A, the rows in the block have the order A", E", C", G", B", D", F", H", and the columns in the block have the order 0, 4, 2, 6, 1, 3, 5, 7 for the purposes of the entropy encoding. Other examples, may order the rows and columns differently to that shown in FIG. 21A. The example order shown in FIG. 21A does not exactly match the order in which the rows are processed by the spatial decorrelation modules (e.g. row 6 is shown above rows 1 and 3). With the exception of the top left 2×2 set (which only groups three values and is encoded slightly differently), each aligned 2×2 set of values will be encoded together. This example grouping has been chosen such that: (a) the values within a set belong (where possible) to the same spatial frequency, and (b) the values within a set come from pixels that are, where possible, nearby spatially. This is done because these are more likely to be "similar" in magnitude and, hence, the sets can be compressed more effectively.

As described above, the data values are unsigned with a distribution which is biased towards zero (due to the colour correlation and spatial decorrelation processes). Therefore, data values are likely to have leading zeroes. Therefore, the data values can be compressed simply by removing one or more leading zeroes from the data values (where possible). An indication is used to indicate how many leading zeroes have been removed.

The top left set of four data values are treated differently in that: (a) the top left pixel is used as the reference and stored separately, and (b) the remaining three values have a different encoding scheme that has been "trained" on a large set of image data so that: (i) for alignment purposes, the total number of bits used to represent the three values is a multiple of 4 (this matches the 2×2 blocks), and (ii) the total storage cost (for the training image set) has been minimised. The particular set of data values in the top left of the block is processed (block 2206). Specifically, an indication for the particular set is included in the size indication field 2114 (block 2208). Each indication in the size indication field has three bits, for a respective set of data values in the block 2100. This 3-bit indication can be used as an index into a Look Up Table to retrieve a number of bits for each data value in the particular set, such that the number of bits for each value is sufficient to store that value. There are sixteen sets of data values in the block 2100, such that the size indication field comprises 48 bits (i.e. 3*16 bits), or 6 bytes. The fifteen sets of four data values in a block will be encoded with numbers of bits which are multiples of four (because, as described below, each encoded data value in a set of four data values has the same number of bits), and on any given row each of these fifteen sets contribute a multiple of two bits. To maintain a convenient alignment of compressed data (as restricting alignment of data can reduce hardware complexity) restrictions are applied to the available choices for the top-left set which only has 3 elements. The top left set has three data values, one of which (E0) is in row 0. For hardware efficiency, it is desirable that the total data for a row is an even number of bits, so the possible lengths of the encoded data values which can be used to represent this data value are restricted to even numbers. Similarly, the combined lengths of the two encoded data values which are used to represent the other two data values of this set (A4 and E4) sum to an even value. Furthermore, in this example, the combined length of all the encoded data values in the encoded data output will be rounded up to the nearest byte (so that the encoded data outputs are aligned on byte boundaries), and all of the other sets of data values in the block. Therefore, the total number of bits used to encode the top left set of data values is also a multiple of four.

With a size indicator including three bits, eight sets of lengths for the encoded data values can be set. For example, the table below shows some possible lengths of the encoded data values which may be represented by the eight different size indications for the top left block. The lengths shown in the table below were made by evaluating a very large set of images and choosing the combinations (from a very large set of possible combinations) that resulted in the lowest overall storage costs.

| Size indication | E0 | A4 | E4 | Total Length |
| --- | --- | --- | --- | --- |
| 000 | 0 | 0 | 0 | 0 |
| 001 | 2 | 1 | 1 | 4 |
| 010 | 2 | 3 | 3 | 8 |
| 011 | 4 | 3 | 5 | 12 |
| 100 | 4 | 5 | 3 | 12 |
| 101 | 6 | 5 | 5 | 16 |
| 110 | 6 | 7 | 7 | 20 |
| 111 | 8 | 8 | 8 | 24 |

The entropy encoding module 2006 chooses the coding from the possible options (e.g. as shown in the table above) with the least total length that is able to (losslessly) represent the {E0,A4,E4} triple by removing leading zeroes from the data values. In the event of a tie (e.g. if deciding between size indications 011 and 100 in the example shown in the table above) either tied code could be chosen, but as an example, the code with the least numerical encoding may be chosen (e.g. 011).

The encoded data values for the top left set are included in the variable size field 2116 (e.g. at the start of the variable size field 2116) of the encoded data output 2110 (block 2210).

The remaining (e.g. fifteen) sets of data values in the block 2100 are then processed (block 2212). Specifically, a number of bits (e.g. a minimum number of bits) for representing the maximum value of the data values of a set is determined (block 2214), and an indication of the determined number of bits is included in the size indication field 2114 of the encoded data output 2110 for the set (block 2216). Block 2214 may be implemented by finding which of the data values in the set has the smallest number of leading zeros, and then by identifying the smallest available encoding that will suffice. It is noted that not all possible data lengths may be available to be encoded. For example, as described in the example below, a data length of seven bits is not available to be encoded. Therefore, the determined number of bits may be a minimum "valid" number of bits which can be used to represent the maximum value of the received data values in the set, wherein a number of bits is valid if it can be indicated by an indication to be included in the size indication field 2114. For example, there may be a predetermined set of valid numbers of bits which can be indicated by said indication (e.g. as listed in the table above), and the minimum valid number of bits may be the minimum of the valid numbers of bits in the predetermined set which is sufficient to represent the maximum value of the received data values in the set.

When the number of bits which is to be used to represent each of the encoded data values in a set has been determined, some leading zeroes can be removed from each of the data values in the set (if appropriate) to thereby determine the encoded data values, such that each of the encoded data values in a set has the determined number of bits for that set.

The encoded data values representing the data values in the set are included in the variable size field 2116 of the encoded data output 2110 (block 2218). The order in which the encoded data values are included in the variable size field 2116 is predetermined and corresponds with the order in which the indications are included in the size indication field 2114, such that when the encoded data values are decoded, the positions of the decoded data values within the block are known.

For example, if the four data values in a set are 00000011, 00000100, 00000001 and 00000000, then 00000100 is the maximum value in the set, and three is the minimum number of bits that can be used to represent the maximum value. Three is a valid number of bits in the example shown in the table above in the sense that an indication can be included to indicate that each of the encoded data values of the set have three bits. Therefore, five leading zeroes can be removed from each of the data values in the set. Therefore, the encoded data values for the set are 011, 100, 001 and 000, and these encoded data values are included in the variable size field 2116. An indication (e.g. 011) to indicate that three bits are used to represent each encoded data value in the set is included in the size indication field 2114.

Different sets (e.g. 2×2 sets) can use different numbers of bits for their encoded data values, and each set has its own indication in the size indication field 1304 to indicate how many bits are used in the variable size field 2116 for the encoded data values of that set.

As an example, the table below shows how the indications may correspond to numbers of bits for the 2×2 sets.

| Size indication | Number of bits per encoded data value |
| --- | --- |
| 000 | 0 |
| 001 | 1 |
| 010 | 2 |
| 011 | 3 |
| 100 | 4 |
| 101 | 5 |
| 110 | 6 |
| 111 | 8 |

It is noted that there is no indication to indicate that seven bits are used for each encoded data value. Therefore, in this example, if the maximum 8-bit value within a set has just one leading zero then the minimum valid number of bits which can be used to represent each of the encoded data values in that set is eight (not seven). This omission of seven from the predetermined set of valid lengths for encoded data values was chosen by examining all the possible choices of number of 3 bits to a set of 8 choices. Since there are 9 options (bit lengths 0 to 8), one option is left out. Having evaluated all the possibilities (e.g. trialing leaving out 0, or 1, or 2 . . . ) against a large test suite of images, it was confirmed that leaving out "7" gives the best level of compression. It is noted that the likelihood of data values having only one leading zero is small because the colour decorrelation and the spatial decorrelation processes cause the data values to be biased towards zero.

It should be apparent that the examples described herein relate to 8-bit data values, but in other examples, the data values may include different numbers of bits (e.g. 6-bit data values), and a person skilled in the art would be able to modify the disclosure provided herein to operate with these different numbers of bits.

For example, if each of the data values received from a spatial decorrelation module has n bits, and the determined minimum valid number of bits for a particular set of received data values is m, where m≤n, then each of the received data values of the particular set has at least (n−m) leading zeroes. In this case, each of the encoded data values for the particular set consists of the m least significant bits of a corresponding n-bit received data value of the particular set. Referring to the same example as above, if the four n-bit data values (where n=8) in a set are 00000011, 00000100, 00000001 and 00000000, then the determined minimum valid number of bits for representing the maximum value of the set, m=3. A data length of 3-bits per encoded data value is a valid encoding from the table above. Each of the data values has at least five leading zeroes. Therefore, the m-bit encoded data values for the set are 011, 100, 001 and 000.

Different sets within the block 2100 can be processed in parallel by an entropy encoding module 2006. For example, the indications for the different sets within the block 2100 can be determined and included in the size indication field 2114 in parallel operations within the entropy encoding module 2006. However, since the encoded data values can have variable lengths, they are included in the variable size field 2116 in a predetermined sequence.

When all of the encoded data values of the block have been included in the encoded data output 2110 then, the encoded data output is outputted from the entropy encoding module 2006 (block 2220). The encoded data output representing a block of pixel values is provided to the packing module 2008 for each of the colour channels, where they are packed together. For example, the packing module 2008 places the encoded data outputs for the block of data values from the different colour channels into a data packet. In other words, a plurality of encoded data outputs are formed for a respective plurality of colour channels relating to the same pixels, and the plurality of encoded data outputs for a group of pixels (e.g. an 8×8 block) are packed together into a data packet for storage. The encoded data block can then be sent for storage in the memory 106, e.g. via the memory interface 114 (as shown in FIG. 1).

A header is stored with a group of encoded data blocks, e.g. the data blocks representing an image or a frame. For each encoded data block (e.g. each 8×8 block of encoded data values), a header indication is included in the header to indicate the size of the compressed data for the respective encoded data block. The header is stored separately from the encoded data values (e.g. in a dedicated portion of the encoded data output), and due to its small size, a significant portion of the header data may remain resident in a cache within the GPU. The header allows the size of the encoded data block to be known before the encoded data block is retrieved from memory, so an encoded data block can be retrieved without retrieving extraneous data. This is very useful for allowing random access to different parts of encoded data. In general, any number of bits may be used in the header as a header indication for a respective encoded data block, but in a specific example described below, four bits are used for each of the header indications.

As noted above, whilst the method described above with reference to FIGS. 20A-B, 21A-B and 22 and the method described in UK patent number 2530312 are both inherently lossless, if either is used in combination with a lossy pre-processing step (e.g. as described above with reference to FIG. 14 or with reference to FIGS. 16 and 18A when one or more bits from the fourth pseudo-channel are discarded), the resultant compressed data is no longer lossless.

Any reference to particular logic gates above (e.g. OR, AND gates, etc.) is by way of example only and it will be appreciated that they may be replaced by logic elements that provide the same functionality and may be more broadly referred to as logic blocks.

The description above describes many different methods, including methods of data compression (e.g. FIGS. 2A-C, 3A, 4-11 and 19A), methods of bit mapping (e.g. FIGS. 12A-12B), including conversion from 10-bit to 8-bit format (e.g. FIGS. 14 and 16). These methods may be used individually or two or more of these methods may be used together in various combinations and several examples are described above. Also described above are the reverse operations (e.g. data compression, inverse mapping and conversion from 8-bit to 10-bit format) and the hardware for implementing any of these methods or any combination of these methods.

Figure 23:
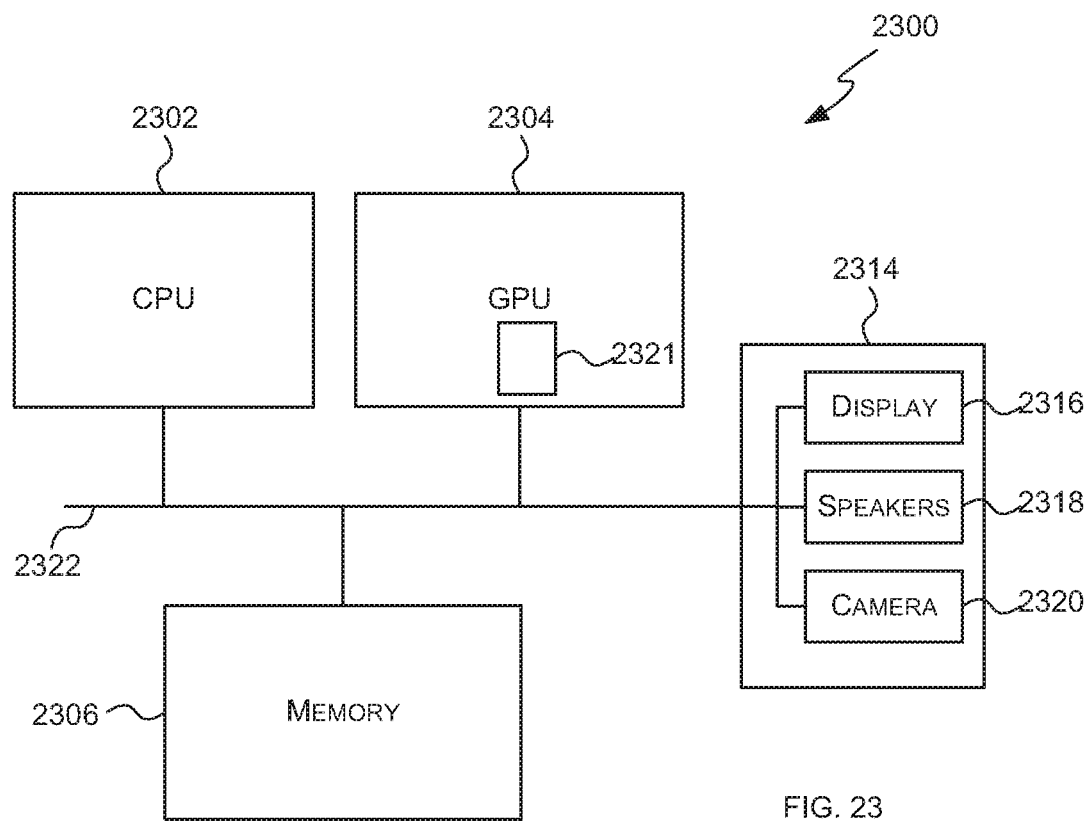
FIG. 23 shows a computer system in which a data compression and/or decompression unit is implemented.

FIG. 23 shows a computer system in which the data compression and decompression methods and apparatus described herein may be implemented. The computer system comprises a CPU 2302, a GPU 2304, a memory 2306 and other devices 2314, such as a display 2316, speakers 2318 and a camera 2320. A data compression and/or decompression block 2321 (which may implement any of the methods described herein) is implemented on the GPU 2304. In other examples, the data compression and/or decompression block 2321 may be implemented on the CPU 2302. The components of the computer system can communicate with each other via a communications bus 2322.

The data compression hardware of FIGS. 2A-C, 12B and 13B are shown as comprising a number of functional blocks. This is schematic only and is not intended to define a strict division between different logic elements of such entities. Each functional block may be provided in any suitable manner. It is to be understood that intermediate values described herein as being formed by data compression hardware need not be physically generated by the data compression hardware at any point and may merely represent logical values which conveniently describe the processing performed by the data compression hardware between its input and output.

The data compression and decompression hardware described herein (including any hardware that is arranged to implement any of the methods described above) may be embodied in hardware on an integrated circuit. The data compression and decompression hardware described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture data compression and/or decompression hardware configured to perform any of the methods described herein, or to manufacture data compression and/or decompression hardware comprising any apparatus described herein. An integrated circuit definition dataset may be, for example, an integrated circuit description.

Therefore, there may be provided a method of manufacturing, at an integrated circuit manufacturing system, data compression and/or decompression hardware as described herein. Furthermore, there may be provided an integrated circuit definition dataset that, when processed in an integrated circuit manufacturing system, causes the method of manufacturing data compression and/or decompression hardware to be performed.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture data compression and/or decompression hardware will now be described with respect to FIG. 24.

Figure 24:
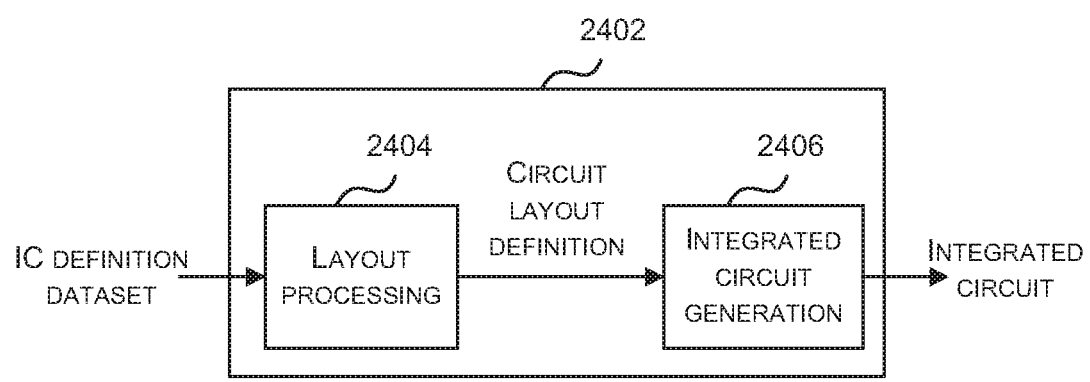
FIG. 24 shows an integrated circuit manufacturing system for generating an integrated circuit embodying a data compression and/or decompression unit as described herein.

FIG. 24 shows an example of an integrated circuit (IC) manufacturing system 2402 which is configured to manufacture data compression and/or decompression hardware as described in any of the examples herein. In particular, the IC manufacturing system 2402 comprises a layout processing system 2404 and an integrated circuit generation system 2406. The IC manufacturing system 2402 is configured to receive an IC definition dataset (e.g. defining data compression and/or decompression hardware as described in any of the examples herein), process the IC definition dataset, and generate an IC according to the IC definition dataset (e.g. which embodies data compression and/or decompression hardware as described in any of the examples herein). The processing of the IC definition dataset configures the IC manufacturing system 2402 to manufacture an integrated circuit embodying data compression and/or decompression hardware as described in any of the examples herein.

The layout processing system 2404 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 2404 has determined the circuit layout it may output a circuit layout definition to the IC generation system 2406. A circuit layout definition may be, for example, a circuit layout description.

The IC generation system 2406 generates an IC according to the circuit layout definition, as is known in the art. For example, the IC generation system 2406 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 2406 may be in the form of computer-readable code which the IC generation system 2406 can use to form a suitable mask for use in generating an IC.

The different processes performed by the IC manufacturing system 2402 may be implemented all in one location, e.g. by one party. Alternatively, the IC manufacturing system 2402 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture data compression and/or decompression hardware without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 24 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 24, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A lossy method of compressing data comprising:
for each sub-block of a block of pixels:
analysing an alpha channel value for each pixel in the sub-block to select a lossy compression mode from a set of candidate lossy compression modes, wherein the set of candidate lossy compression modes comprises at least one compression mode which uses a fixed alpha channel value for all pixels in the sub-block.

2. The method according to claim 1, wherein the method further comprises:
for each sub-block of the block of pixels:
compressing the sub-block using the selected lossy compression mode,
wherein analysing an alpha channel value for each pixel in the sub-block to select a lossy compression mode from a set of candidate lossy compression modes comprises:
determining a minimum alpha channel value and a maximum alpha channel value from the alpha channel values for all the pixels in the sub-block;
in response to determining that a difference between the maximum alpha channel value and the minimum alpha channel value is larger than a difference value, selecting a compression mode which uses a variable alpha channel value for the pixels in the sub-block; and in response to determining that the difference between the maximum alpha channel value and the minimum alpha channel value is not larger than the difference value, selecting a compression mode which uses a fixed alpha channel value for all pixels in the sub-block and determining the fixed alpha channel value.

3. The method according to claim 2, wherein the difference value is a maximum error value.

4. The method according to claim 2, wherein determining the fixed alpha channel value comprises:
in response to determining that the maximum alpha channel value is a maximum possible value, setting the fixed alpha channel value equal to the maximum alpha channel value;
in response to determining that the minimum alpha channel value is zero, setting the fixed alpha channel value equal to zero; and
in response to determining both that the maximum alpha channel value is not a maximum possible value and that the minimum alpha channel value is not zero, setting the fixed alpha channel value equal to an average of the alpha channel values for all pixels in the sub-block.

5. The method according to claim 2, wherein compressing the sub-block using the selected lossy compression mode comprises, for a compression mode which uses a fixed alpha channel value for all pixels in the sub-block:
for each of the pixels in the sub-block, converting each of a red channel value, a green channel value and a blue channel value, from 8-bits to 5-bits; and
packing the 5-bit red, green and blue channel values for the pixels in the sub-block and the fixed alpha channel value together to form compressed data for the sub-block.

6. The method according to claim 2, wherein compressing the sub-block using the selected lossy compression mode comprises, for a compression mode which uses a variable alpha channel value for the pixels in the sub-block:
sub-dividing the sub-block into a plurality of mini-blocks;
for each of the mini-blocks:
calculating a colour difference value for each pixel pair in the mini-block;
comparing a smallest of the colour difference values to a threshold; and
in response to determining that the smallest of the colour difference values exceeds the threshold, converting pixel data for each pixel in the mini-block from a first format to a second format comprising fewer bits than the first format; and
in response to determining that the smallest of the colour difference values does not exceed the threshold, selecting one of a plurality of encoding modes based on the colour difference values, determining two or three pixel values for the selected encoding mode, allocating one of the pixel values to each pixel in the mini-block and converting the pixel values from the first format to a third format comprising fewer bits than the first format.

7. The method according to claim 2, wherein compressing the sub-block using the selected lossy compression mode comprises, for a compression mode which uses a fixed alpha channel value for all pixels in the sub-block:
sub-dividing the sub-block into a plurality of mini-blocks;
for each of the mini-blocks:
calculating a colour difference value for each pixel pair in the mini-block;
comparing a smallest of the colour difference values to a threshold; and in response to determining that the smallest of the colour difference values exceeds the threshold, converting pixel data for each pixel in the mini-block from a first format to a second format comprising fewer bits than the first format; and in response to determining that the smallest of the colour difference values does not exceed the threshold, selecting one of a plurality of encoding modes based on the colour difference values, determining two or three pixel values for the selected encoding mode, allocating one of the pixel values to each pixel in the mini-block and converting the pixel values from the first format to a third format comprising fewer bits than the first format.

8. The method according to claim 6, wherein selecting one of a plurality of encoding modes based on the colour difference values, determining two or three pixel values for the selected encoding mode, allocating one of the pixel values to each pixel in the mini-block and converting the pixel values from the first format to a third format comprising fewer bits than the first format comprises:

identifying a pixel pair in the mini-block having a smallest colour difference (908), representing the pixel pair as a single new pixel value and a pixel pattern code that identifies the pixel pair and converting pixel data for the single new pixel value and for each other pixel in the mini-block aside from the identified pixel pair, from the first format to a third format comprising fewer bits than the first format.

9. A data compression unit configured to perform the method as set forth in claim 1.

10. A method of data compression comprising:

for each sub-block of a plurality of sub-blocks, generating compressed data from a compressed data block:

identifying a compression mode from a block mode field within the compressed data block, wherein the compression mode is one of a set of candidate lossy compression modes, the set of candidate lossy compression modes comprising at least one compression mode which uses a fixed alpha channel value for all pixels in the sub-block.

11. The method of data compression according to claim 10, further comprising:

decompressing the sub-block using a decompression mode corresponding to the selected compression mode.

12. A data compression unit configured to perform the method as set forth in claim 10.

13. A non-transitory computer readable storage medium having stored thereon computer readable code configured to cause the method as set forth in claim 1 to be performed when the code is run on at least one processor.

14. A non-transitory computer readable storage medium having stored thereon computer readable code configured to cause the method as set forth in claim 10 to be performed when the code is run on at least one processor.

15. A non-transitory computer readable storage medium having stored thereon a computer readable dataset description of an integrated circuit that, when processed in an integrated circuit manufacturing system, causes the integrated circuit manufacturing system to manufacture a data compression unit configured to perform the method as set forth in claim 10.

16. An integrated circuit manufacturing system configured to manufacture a data compression unit as claimed in claim 10.

17. An integrated circuit manufacturing system comprising:

a non-transitory computer readable storage medium having stored thereon a computer readable dataset description of an integrated circuit that describes a data compression unit, a layout processing system configured to process the integrated circuit description so as to generate a circuit layout description of an integrated circuit embodying the data compression unit; and an integrated circuit generation system configured to manufacture the data compression unit according to the circuit layout description, wherein the data compression unit comprises:

hardware logic arranged, for each sub-block of a block of pixels, to analyse an alpha channel value for each pixel in the sub-block to select a lossy compression mode from a set of candidate lossy compression modes, wherein the set of candidate lossy compression modes comprises at least one compression mode which uses a fixed alpha channel value for all pixels in the sub-block.

18. The integrated circuit manufacturing system as set forth in claim 17, wherein the data compression unit further comprises:

a data compression element arranged to compress the sub-block using the selected lossy compression mode.

* * * * *

UNITED STATES PATENT AND TRADEMARK OFFICE
CERTIFICATE OF CORRECTION

PATENT NO. : 11,309,907 B2  
APPLICATION NO. : 17/076182  
DATED : April 19, 2022  
INVENTOR(S) : Fenney et al.

Page 1 of 1

It is certified that error appears in the above-identified patent and that said Letters Patent is hereby corrected as shown below:

In the Specification

• Column 4, Line 1: "FIGS. 10B and 100" should read as "FIGS. 10B and 10C"

• Column 21, Line 1: "and FIG. 100 shows" should read as "and FIG. 10C shows"

• Column 21, Line 14: "in FIG. 100" should read as "in FIG. 10C"

• Column 21, Line 18: "in FIG. 100" should read as "in FIG. 10C"

• Column 31, Line 20: "in FIG. 100" should read as "in FIG. 10C"

Signed and Sealed this  
Thirtieth Day of August, 2022

Katherine Kelly Vidal  
*Director of the United States Patent and Trademark Office*